(12) United States Patent
Maxim et al.

(10) Patent No.: US 9,859,863 B2
(45) Date of Patent: Jan. 2, 2018

(54) RF FILTER STRUCTURE FOR ANTENNA DIVERSITY AND BEAM FORMING

(71) Applicant: RF Micro Devices, Inc., Greensboro, NC (US)

(72) Inventors: George Maxim, Saratoga, CA (US); Dirk Robert Walter Leipold, San Jose, CA (US); Baker Scott, San Jose, CA (US)

(73) Assignee: Qorvo US, Inc., Greensboro, NC (US)

( * ) Notice: Subject to any disclaimer, the term of this patent is extended or adjusted under 35 U.S.C. 154(b) by 266 days.

(21) Appl. No.: 14/554,975

(22) Filed: Nov. 26, 2014

(65) Prior Publication Data

US 2015/0084699 A1   Mar. 26, 2015

Related U.S. Application Data

(63) Continuation-in-part of application No. 14/099,007, filed on Dec. 6, 2013, now Pat. No. 9,196,406, and a
(Continued)

(51) Int. Cl.
*H03H 7/01* (2006.01)
*H03H 7/46* (2006.01)
(Continued)

(52) U.S. Cl.
CPC ....... *H03H 7/0161* (2013.01); *H01F 17/0013* (2013.01); *H03F 3/195* (2013.01);
(Continued)

(58) Field of Classification Search
CPC ...... H03H 7/0115; H03H 7/09; H03H 7/0153; H03H 7/463; H03H 7/0161
(Continued)

(56) References Cited

U.S. PATENT DOCUMENTS 3,465,431 A   9/1969   Henning
3,491,318 A   1/1970   Henning et al.
(Continued)

FOREIGN PATENT DOCUMENTS

EP   0957368 A2   11/1999
EP   1184977 A2   3/2002
(Continued)

OTHER PUBLICATIONS

International Preliminary Report on Patentability for PCT/US/2014/030431, dated Sep. 24, 2015, 10 pages.
(Continued)

*Primary Examiner* — Rakesh Patel
(74) *Attorney, Agent, or Firm* — Withrow & Terranova, P.L.L.C.

(57) ABSTRACT

Radio frequency (RF) front-end circuitry that includes control circuitry and an RF filter structure that includes a plurality of resonators are disclosed. In one embodiment, a first tunable RF filter path is defined by a first set of the plurality of resonators such that the first tunable RF filter path has a first amplitude and a first phase. A second tunable RF filter path is defined by a second set of the plurality of resonators such that the second tunable RF filter path has a second amplitude and a second phase. To provide antenna diversity and/or beam forming/beam steering, the control circuitry is configured to set a first amplitude difference between the first amplitude and the second amplitude to approximately a first target amplitude difference and set a first phase difference between the first phase and the second phase to approximately a first target phase difference.

27 Claims, 17 Drawing Sheets

Related U.S. Application Data continuation-in-part of application No. 14/215,815, filed on Mar. 17, 2014, now Pat. No. 9,294,045, and a continuation-in-part of application No. 14/217,199, filed on Mar. 17, 2014, and a continuation-in-part of application No. 14/216,794, filed on Mar. 17, 2014, now Pat. No. 9,294,046, and a continuation-in-part of application No. 14/215,800, filed on Mar. 17, 2014, and a continuation-in-part of application No. 14/218,953, filed on Mar. 18, 2014, now Pat. No. 9,444,411, and a continuation-in-part of application No. 14/216,376, filed on Mar. 17, 2014, now Pat. No. 9,391,565, and a continuation-in-part of application No. 14/216,560, filed on Mar. 17, 2014, and a continuation-in-part of application No. 14/298,829, filed on Jun. 6, 2014, now Pat. No. 9,455,680, and a continuation-in-part of application No. 14/298,830, filed on Jun. 6, 2014, now Pat. No. 9,419,578, and a continuation-in-part of application No. 14/298,834, filed on Jun. 6, 2014, and a continuation-in-part of application No. 14/298,872, filed on Jun. 6, 2014, now Pat. No. 9,484,879, and a continuation-in-part of application No. 14/298,863, filed on Jun. 6, 2014, and a continuation-in-part of application No. 14/298,852, filed on Jun. 6, 2014, now Pat. No. 9,614,490, and a continuation-in-part of application No. 14/449,913, filed on Aug. 1, 2014, now Pat. No. 9,628,045, and a continuation-in-part of application No. 14/298,829, filed on Jun. 6, 2014, now Pat. No. 9,455,680, and a continuation-in-part of application No. 14/298,830, filed on Jun. 6, 2014, now Pat. No. 9,419,578, and a continuation-in-part of application No. 14/298,834, filed on Jun. 6, 2014, and a continuation-in-part of application No. 14/298,972, filed on Jun. 9, 2014, now Pat. No. 9,599,830, and a continuation-in-part of application No. 14/298,863, filed on Jun. 6, 2014, and a continuation-in-part of application No. 14/298,852, filed on Jun. 6, 2014, now Pat. No. 9,614,490, and a continuation-in-part of application No. 14/450,156, filed on Aug. 1, 2014, and a continuation-in-part of application No. 14/298,829, filed on Jun. 6, 2014, now Pat. No. 9,455,680, and a continuation-in-part of application No. 14/298,830, filed on Jun. 6, 2014, now Pat. No. 9,419,578, and a continuation-in-part of application No. 14/298,834, filed on Jun. 6, 2014, and a continuation-in-part of application No. 14/298,872, filed on Jun. 6, 2014, now Pat. No. 9,484,879, and a continuation-in-part of application No. 14/298,863, filed on Jun. 6, 2014, and a continuation-in-part of application No. 14/298,852, filed on Jun. 6, 2014, now Pat. No. 9,614,490, and a continuation-in-part of application No. 14/099,007, filed on Dec. 6, 2013, now Pat. No. 9,196,406, and a continuation-in-part of application No. 14/450,028, filed on Aug. 1, 2014, and a continuation-in-part of application No. 14/298,829, filed on Jun. 6, 2014, now Pat. No. 9,455,680, and a continuation-in-part of application No. 14/298,830, filed on Jun. 6, 2014, now Pat. No. 9,419,578, and a continuation-in-part of application No. 14/298,834, filed on Jun. 6, 2014, and a continuation-in-part of application No. 14/298,872, filed on Jun. 6, 2014, now Pat. No. 9,484,879, and a continuation-in-part of application No. 14/298,863, filed on Jun. 6, 2014, and a continuation-in-part of application No. 14/298,852, filed on Jun. 6, 2014, now Pat. No. 9,614,490, and a continuation-in-part of application No. 14/449,764, filed on Aug. 1, 2014, and a continuation-in-part of application No. 14/298,829, filed on Jun. 6, 2014, now Pat. No. 9,455,680, and a continuation-in-part of application No. 14/298,830, filed on Jun. 6, 2014, now Pat. No. 9,419,578, and a continuation-in-part of application No. 14/298,834, filed on Jun. 6, 2014, and a continuation-in-part of application No. 14/298,872, filed on Jun. 6, 2014, now Pat. No. 9,484,879, and a continuation-in-part of application No. 14/298,863, filed on Jun. 6, 2014, and a continuation-in-part of application No. 14/298,852, filed on Jun. 6, 2014, now Pat. No. 9,614,490, and a continuation-in-part of application No. 14/450,199, filed on Aug. 1, 2014, now Pat. No. 9,705,478, and a continuation-in-part of application No. 14/298,829, filed on Jun. 6, 2014, now Pat. No. 9,455,680, and a continuation-in-part of application No. 14/298,830, filed on Jun. 6, 2014, now Pat. No. 9,419,578, and a continuation-in-part of application No. 14/298,834, filed on Jun. 6, 2014, and a continuation-in-part of application No. 14/298,872, filed on Jun. 6, 2014, now Pat. No. 9,484,879, and a continuation-in-part of application No. 14/298,863, filed on Jun. 6, 2014, and a continuation-in-part of application No. 14/298,852, filed on Jun. 6, 2014, now Pat. No. 9,614,490, and a continuation-in-part of application No. 14/450,204, filed on Aug. 1, 2014, and a continuation-in-part of application No. 14/298,829, filed on Jun. 6, 2014, now Pat. No. 9,455,680, and a continuation-in-part of application No. 14/298,830, filed on Jun. 6, 2014, now Pat. No. 9,419,578, and a continuation-in-part of application No. 14/298,834, filed on Jun. 6, 2014, and a continuation-in-part of application No. 14/298,872, filed on Jun. 6, 2014, now Pat. No. 9,484,879, and a continuation-in-part of application No. 14/298,863, filed on Jun. 6, 2014, and a continuation-in-part of application No. 14/298,852, filed on Jun. 6, 2014, now Pat. No. 9,614,490, and a continuation-in-part of application No. 14/450,200, filed on Aug. 1, 2014, now Pat. No. 9,685,928, and a continuation-in-part of application No. 14/298,829, filed on Jun. 6, 2014, now Pat. No. 9,455,680, and a continuation-in-part of application No. 14/298,830, filed on Jun. 6, 2014, now Pat. No. 9,419,578, and a continuation-in-part of application No. 14/298,834, filed on Jun. 6, 2014, and a continuation-in-part of application No. 14/298,872, filed on Jun. 6, 2014, now Pat. No. 9,484,879, and a continuation-in-part of application No. 14/298,863, filed on Jun. 6, 2014, and a continuation-in-part of application No. 14/298,852, filed on Jun. 6, 2014, now Pat. No. 9,614,490, and a continuation-in-part of application No. 14/449,594, filed on Aug. 1, 2014, now Pat. No. 9,048,836, and a continuation-in-part of application No. 14/298,829, filed on Jun. 6, 2014, now Pat. No. 9,455,680, and a continuation-in-part of application No. 14/298,830, filed on Jun. 6, 2014, now Pat. No. 9,419,578, and a continuation-in-part of application No. 14/298,834, filed on Jun. 6, 2014, and a continuation-in-part of application No. 14/298,872, filed on Jun. 6, 2014, now Pat. No. 9,484,879, and a continuation-in-part of application No. 14/298,863, filed on Jun. 6, 2014, and a continuation-in-part of application No. 14/298,852, filed on Jun. 6, 2014, now Pat. No. 9,614,490.

(60) Provisional application No. 61/909,028, filed on Nov. 26, 2013, provisional application No. 61/938,884, filed on Feb. 12, 2014, provisional application No. 61/946,270, filed on Feb. 28, 2014, provisional application No. 61/946,927, filed on Mar. 3, 2014, provisional application No. 61/949,581, filed on Mar. 7, 2014, provisional application No. 61/951,844, filed on Mar. 12, 2014, provisional application No. 61/982,946, filed on Apr. 23, 2014, provisional application No. 61/982,952, filed on Apr. 23, 2014, provisional application No. 61/982,971, filed on Apr. 23, 2014, provisional application No. 62/008,192, filed on Jun. 5, 2014, provisional application No. 62/011,629, filed on Jun. 13, 2014, provisional application No. 62/031,645, filed on Jul. 31, 2014, provisional application No. 61/789,693, filed on Mar. 15, 2013, provisional application No. 61/831,666, filed on Jun. 6, 2013, provisional application No. 61/860,932, filed on Aug. 1, 2013, provisional application No. 61/909,028, filed on Nov. 26, 2013, provisional application No. 61/946,927, filed on Mar. 3, 2014, provisional application No. 61/793,583, filed on Mar. 15, 2013, provisional application No. 61/789,508, filed on Mar. 15, 2013, provisional application No. 61/800,772, filed on Mar. 15, 2013, provisional application No. 61/800,991, filed on Mar. 15, 2013, provisional application No. 61/801,038, filed on Mar. 15, 2013, provisional application No. 61/946,270, filed on Feb. 28, 2014, provisional application No. 61/946,927, filed on Mar. 3, 2014, provisional application No. 61/793,583, filed on Mar. 15, 2013, provisional application No. 61/789,508, filed on Mar. 15, 2013, provisional application No. 61/800,772, filed on Mar. 15, 2013, provisional application No. 61/800,991, filed on Mar. 15, 2013, provisional application No. 61/801,038, filed on Mar. 15, 2013, provisional application No. 61/946,270, filed on Feb. 28, 2014, provisional application No. 61/946,927, filed on Mar. 3, 2014, provisional application No. 61/793,583, filed on Mar. 15, 2013, provisional application No. 61/789,508, filed on Mar. 15, 2013, provisional application No. 61/800,772, filed on Mar. 15, 2013, provisional application No. 61/800,991, filed on Mar. 15, 2013, provisional application No. 61/801,038, filed on Mar. 15, 2013, provisional application No. 61/946,270, filed on Feb. 28, 2014, provisional application No. 61/946,927, filed on Mar. 3, 2014, provisional application No. 61/793,583, filed on Mar. 15, 2013, provisional application No. 61/789,508, filed on Mar. 15, 2013, provisional application No. 61/789,508, filed on Mar. 15, 2013, provisional application No. 61/800,772, filed on Mar. 15, 2013, provisional application No. 61/800,991, filed on Mar. 15, 2013, provisional application No. 61/801,038, filed on Mar. 15, 2013, provisional application No. 61/946,270, filed on Feb. 28, 2014, provisional application No. 61/946,927, filed on Mar. 3, 2014, provisional application No. 61/793,583, filed on Mar. 15, 2013, provisional application No. 61/789,508, filed on Mar. 15, 2013, provisional application No. 61/800,772, filed on Mar. 15, 2013, provisional application No. 61/800,991, filed on Mar. 15, 2013, provisional application No. 61/801,038, filed on Mar. 15, 2013, provisional application No. 61/946,270, filed on Feb. 28, 2014, provisional application No. 61/946,927, filed on Mar. 3, 2014, provisional application No. 61/793,583, filed on Mar. 15, 2013, provisional application No. 61/789,508, filed on Mar. 15, 2013, provisional application No. 61/800,772, filed on Mar. 15, 2013, provisional application No. 61/800,991, filed on Mar. 15, 2013, provisional application No. 61/801,038, filed on Mar. 15, 2013, provisional application No. 61/946,270, filed on Feb. 28, 2014, provisional application No. 61/831,666, filed on Jun. 6, 2013, provisional application No. 61/860,932, filed on Aug. 1, 2013, provisional application No. 61/909,028, filed on Nov. 26, 2013, provisional application No. 61/938,884, filed on Feb. 12, 2014, provisional application No. 61/951,844, filed on Mar. 12, 2014, provisional application No. 61/949,581, filed on Mar. 7, 2014, provisional application No. 61/982,946, filed on Apr. 23, 2014, provisional application No. 61/982,952, filed on Apr. 23, 2014, provisional application No. 61/982,971, filed on Apr. 23, 2014, provisional application No. 62/008,192, filed on Jun. 5, 2014, provisional application No. 61/831,666, filed on Jun. 6, 2013, provisional application No. 61/860,932, filed on Aug. 1, 2013, provisional application No. 61/909,028, filed on Nov. 26, 2013, provisional application No. 61/938,884, filed on Feb. 12, 2014, provisional application No. 61/951,844, filed on Mar. 12, 2014, provisional application No. 61/949,581, filed on Mar. 7, 2014, provisional application No. 61/982,946, filed on Apr. 23, 2014, provisional application No. 61/982,952, filed on Apr. 23, 2014, provisional application No. 61/982,971, filed on Apr. 23, 2014, provisional application No. 62/008,192, filed on Jun. 5, 2014, provisional application No. 61/831,666, filed on Jun. 6, 2013, provisional application No. 61/860,932, filed on Aug. 1, 2013, provisional application No. 61/909,028, filed on Nov. 26, 2013, provisional application No. 61/938,884, filed on Feb. 12, 2014, provisional application No. 61/951,844, filed on Mar. 12, 2014, provisional application No. 61/949,581, filed on Mar. 7, 2014, provisional application No. 61/982,946, filed on Apr. 23, 2014, provisional application No. 61/982,952, filed on Apr. 23, 2014, provisional application No. 61/982,971, filed on Apr. 23, 2014, provisional application No. 62/008,192, filed on Jun. 5, 2014, provisional application No. 61/831,666, filed on Jun. 6, 2013, provisional application No. 61/860,932, filed on Aug. 1, 2013, provisional application No. 61/909,028, filed on Nov. 26, 2013, provisional application No. 61/938,884, filed on Feb. 12, 2014, provisional application No. 61/951,844, filed on Mar. 12, 2014, provisional application No. 61/949,581, filed on Mar. 7, 2014, provisional application No. 61/982,946, filed on Apr. 23, 2014, provisional application No. 61/982,952, filed on Apr. 23, 2014, provisional application No. 61/982,971, filed on Apr. 23, 2014, provisional application No. 62/008,192, filed on Jun. 5, 2014, provisional application No. 61/831,666, filed on Jun. 6, 2013, provisional application No. 61/860,932, filed on Aug. 1, 2013, provisional application No. 61/909,028, filed on Nov. 26, 2013, provisional application No. 61/938,884, filed on Feb. 12, 2014, provisional application No. 61/951,844, filed on Mar. 12, 2014, provisional application No. 61/949,581, filed on Mar. 7, 2014, provisional application No. 61/982,946, filed on Apr. 23, 2014, provisional application No. 61/982,952, filed on Apr. 23, 2014, provisional application No. 61/982,971, filed on Apr. 23, 2014, provisional application No. 62/008,192, filed on Jun. 5, 2014, provisional application No. 61/860,932, filed on Aug. 1, 2013, provisional application No. 61/909,028, filed on Nov. 26, 2013, provisional application No. 61/938,884, filed on Feb. 12, 2014, provisional application No. 61/949,581, filed on Mar. 7, 2014, provisional application No. 61/951,844, filed on Mar. 12, 2014, provisional application No. 61/982,946, filed on Apr. 23, 2014, provisional application No. 61/982,952, filed on Apr. 23, 2014, provisional application No. 61/982,971, filed on Apr. 23, 2014, provisional application No. 62/008,192, filed on Jun. 5, 2014, provisional application No. 62/011,629, filed on Jun. 13, 2014, provisional application No. 62/031,645, filed on Jul. 31, 2014, provisional application No. 61/860,932, filed on Aug. 1, 2013, provisional application No. 61/909,028, filed on Nov. 26, 2013, provisional application No. 61/938,884, filed on Feb. 12, 2014, provisional application No. 61/949,581, filed on Mar. 7, 2014, provisional application No. 61/951,844, filed on Mar. 12, 2014, provisional application No. 61/982,946, filed on Apr. 23, 2014, provisional application No. 61/982,952, filed on Apr. 23, 2014, provisional application No. 61/982,971, filed on Apr. 23, 2014, provisional application No. 62/008,192, filed on Jun. 5, 2014, provisional application No. 62/011,629, filed on Jun. 13, 2014, provisional application No. 62/031,645, filed on Jul. 31, 2014, provisional application No. 61/860,932, filed on Aug. 1, 2013, provisional application No. 61/909,028, filed on Nov. 26, 2013, provisional application No. 61/938,884, filed on Feb. 12, 2014, provisional application No. 61/949,581, filed on Mar. 7, 2014, provisional application No. 61/951,844, filed on Mar. 12, 2014, provisional application No. 61/982,946, filed on Apr. 23, 2014, provisional application No. 61/982,952, filed on Apr. 23, 2014, provisional application No. 61/982,971, filed on Apr. 23, 2014, provisional application No. 62/008,192, filed on Jun. 5, 2014, provisional application No. 62/011,629, filed on Jun. 13, 2014, provisional application No. 62/031,645, filed on Jul. 31, 2014, provisional application No. 61/860,932, filed on Aug. 1, 2013, provisional application No. 61/909,028, filed on Nov. 26, 2013, provisional application No. 61/949,581, filed on Mar. 7, 2014, provisional application No. 61/951,844, filed on Mar. 12, 2014, provisional application No. 61/982,946, filed on Apr. 23, 2014, provisional application No. 61/982,952, filed on Apr. 23, 2014, provisional application No. 61/982,971, filed on Apr. 23, 2014, provisional application No. 62/008,192, filed on Jun. 5, 2014, provisional application No. 62/011,629, filed on Jun. 13, 2014, provisional application No. 62/031,645, filed on Jul. 31, 2014, provisional application No. 61/860,932, filed on Aug. 1, 2013, provisional application No. 61/909,028, filed on Nov. 26, 2013, provisional application No. 61/938,884, filed on Feb. 12, 2014, provisional application No. 61/949,581, filed on Mar. 7, 2014, provisional application No. 61/951,844, filed on Mar. 12, 2014, provisional application No. 61/982,946, filed on Apr. 23, 2014, provisional application No. 61/982,952, filed on Apr. 23, 2014, provisional application No. 61/982,971, filed on Apr. 23, 2014, provisional application No. 62/008,192, filed on Jun. 5, 2014, provisional application No. 62/011,629, filed on Jun. 13, 2014, provisional application No. 62/031,645, filed on Jul. 31, 2014, provisional application No. 61/860,932, filed on Aug. 1, 2013, provisional application No. 61/909,028, filed on Nov. 26, 2013, provisional application No. 61/938,884, filed on Feb. 12, 2014, provisional application No. 61/949,581, filed on Mar. 7, 2014, provisional application No. 61/951,844, filed on Mar. 12, 2014, provisional application No. 61/982,946, filed on Apr. 23, 2014, provisional application No. 61/982,952, filed on Apr. 23, 2014, provisional application No. 61/982,971, filed on Apr. 23, 2014, provisional application No. 62/008,192, filed on Jun. 5, 2014, provisional application No. 62/011,629, filed on Jun. 13, 2014, provisional application No. 62/031,645, filed on Jul. 31, 2014.

(51) Int. Cl.
*H03H 7/09* (2006.01)
*H01F 17/00* (2006.01)
*H03F 3/195* (2006.01)
*H03F 3/24* (2006.01)
*H03F 3/68* (2006.01)

(52) U.S. Cl.
CPC .............. *H03F 3/245* (2013.01); *H03F 3/68* (2013.01); *H03H 7/0115* (2013.01); *H03H 7/0153* (2013.01); *H03H 7/09* (2013.01); *H03H 7/463* (2013.01); *H03F 2200/168* (2013.01); *H03F 2200/546* (2013.01)

(58) Field of Classification Search
USPC .................. 333/4, 5, 17.1, 174, 175, 132
See application file for complete search history.

(56) References Cited

U.S. PATENT DOCUMENTS

| | | |
|---|---|---|
| 3,597,709 A | 8/1971 | Rhodes |
| 3,718,874 A | 2/1973 | Cooper, Jr. |
| 3,794,941 A | 2/1974 | Templin |
| 4,361,894 A | 11/1982 | Kurihara et al. |
| 5,339,017 A | 8/1994 | Yang |
| 5,517,083 A | 5/1996 | Whitlock |
| 5,608,363 A | 3/1997 | Cameron et al. |
| 5,661,414 A | 8/1997 | Shigehara et al. |
| 5,689,144 A | 11/1997 | Williams |
| 5,757,247 A | 5/1998 | Koukkari et al. |
| 5,841,330 A | 11/1998 | Wenzel et al. |
| 5,880,620 A | 3/1999 | Gitlin et al. |
| 5,896,073 A | 4/1999 | Miyazaki et al. |
| 5,963,557 A | 10/1999 | Eng |
| 6,215,374 B1 | 4/2001 | Petrovic |
| 6,233,438 B1 | 5/2001 | Wynn |
| 6,239,673 B1 | 5/2001 | Wenzel et al. |
| 6,529,750 B1 | 3/2003 | Zhang et al. |
| 6,664,873 B2 | 12/2003 | Tiihonen |
| 6,801,102 B2 | 10/2004 | Shamsaifar et al. |
| 7,015,870 B2 | 3/2006 | Guitton et al. |
| 7,116,186 B2 | 10/2006 | Chen |
| 7,573,350 B2 | 8/2009 | Frank |
| 7,795,995 B2 | 9/2010 | White et al. |
| 7,809,349 B1 | 10/2010 | Granger-Jones et al. |
| 7,825,751 B2 | 11/2010 | Kawaguchi et al. |
| 8,204,446 B2 | 6/2012 | Scheer et al. |
| 8,314,653 B1 | 11/2012 | Granger-Jones et al. |
| 8,346,179 B2 | 1/2013 | Brunn et al. |
| 8,369,250 B1 | 2/2013 | Khlat |
| 8,626,083 B2 | 1/2014 | Greene et al. |
| 8,736,511 B2 | 5/2014 | Morris, III |
| 8,742,871 B2 | 6/2014 | Jin et al. |
| 8,751,993 B1 | 6/2014 | Fenzi et al. |
| 8,791,769 B2 | 7/2014 | Leong et al. |
| 8,803,632 B2 | 8/2014 | Takeuchi |
| 8,803,634 B2 | 8/2014 | Hanaoka |
| 8,841,983 B2 | 9/2014 | Newton et al. |
| 8,884,714 B2 | 11/2014 | Carey et al. |
| 8,977,216 B2 | 3/2015 | Weissman et al. |
| 9,002,309 B2 | 4/2015 | Sahota et al. |
| 9,054,648 B1 | 6/2015 | Xu |
| 9,094,104 B2 | 7/2015 | Din et al. |
| 9,124,355 B2 | 9/2015 | Black et al. |
| 9,203,455 B2 | 12/2015 | Yang et al. |
| 9,369,162 B2 | 6/2016 | Lo et al. |
| 9,391,650 B2 | 7/2016 | Aparin |
| 2001/0020877 A1 | 9/2001 | Hasegawa et al. |
| 2002/0057139 A1 | 5/2002 | Matsumura et al. |
| 2003/0008577 A1 | 1/2003 | Quigley et al. |
| 2003/0128084 A1 | 7/2003 | Chang et al. |
| 2003/0151409 A1 | 8/2003 | Marek |
| 2003/0155988 A1 | 8/2003 | Douziech et al. |
| 2003/0222732 A1 | 12/2003 | Matthaei |
| 2004/0127178 A1 | 7/2004 | Kuffner |
| 2004/0130414 A1 | 7/2004 | Marquardt et al. |
| 2004/0162042 A1 | 8/2004 | Chen et al. |
| 2004/0196085 A1 | 10/2004 | Shen |
| 2004/0222868 A1 | 11/2004 | Rathgeber et al. |
| 2004/0227578 A1 | 11/2004 | Hamalainen |
| 2004/0266378 A1 | 12/2004 | Fukamachi et al. |
| 2005/0195063 A1 | 9/2005 | Mattsson |
| 2005/0237144 A1 | 10/2005 | Einzinger et al. |
| 2006/0033602 A1 | 2/2006 | Mattsson |
| 2006/0035600 A1 | 2/2006 | Lee et al. |
| 2006/0038635 A1 | 2/2006 | Richiuso et al. |
| 2006/0058629 A1 | 3/2006 | Warntjes et al. |
| 2006/0125465 A1 | 6/2006 | Xiang et al. |
| 2006/0220727 A1 | 10/2006 | Yen |
| 2006/0226943 A1 | 10/2006 | Marques |
| 2006/0261890 A1 | 11/2006 | Floyd et al. |
| 2006/0281431 A1 | 12/2006 | Isaac et al. |
| 2007/0091006 A1 | 4/2007 | Thober et al. |
| 2007/0161361 A1 | 7/2007 | Vaisanen et al. |
| 2007/0182520 A1 | 8/2007 | Kawakubo et al. |
| 2007/0194859 A1 | 8/2007 | Brobston et al. |
| 2007/0241839 A1 | 10/2007 | Taniguchi |
| 2007/0290767 A1 | 12/2007 | Ali-Ahmad et al. |
| 2008/0096516 A1 | 4/2008 | Mun et al. |
| 2008/0122560 A1 | 5/2008 | Liu |
| 2008/0220735 A1 | 9/2008 | Kim et al. |
| 2008/0297299 A1 | 12/2008 | Yun et al. |
| 2009/0058589 A1 | 3/2009 | Chen et al. |
| 2009/0088110 A1 | 4/2009 | Schuur et al. |
| 2009/0134947 A1 | 5/2009 | Tarng |
| 2009/0134953 A1 | 5/2009 | Hunt et al. |
| 2009/0261936 A1 | 10/2009 | Widjaja et al. |
| 2009/0289721 A1 | 11/2009 | Rajendran et al. |
| 2010/0144305 A1 | 6/2010 | Cook et al. |
| 2010/0188171 A1 | 7/2010 | Mohajer-Iravani et al. |
| 2010/0283557 A1 | 11/2010 | Taniguchi |
| 2011/0010749 A1 | 1/2011 | Alkan |
| 2011/0103494 A1 | 5/2011 | Ahmadi |
| 2011/0156835 A1 | 6/2011 | Nagai |
| 2011/0159834 A1* | 6/2011 | Salvi ..................... H03H 11/16 455/307 |
| 2011/0163824 A1 | 7/2011 | Kawano |
| 2011/0169589 A1 | 7/2011 | Franzon et al. |
| 2011/0210787 A1 | 9/2011 | Lee et al. |
| 2011/0241163 A1 | 10/2011 | Liu et al. |
| 2012/0051409 A1 | 3/2012 | Brobston et al. |
| 2012/0081192 A1 | 4/2012 | Hanaoka |
| 2012/0230227 A1 | 9/2012 | Weiss |
| 2012/0249266 A1 | 10/2012 | Lim et al. |
| 2012/0262252 A1 | 10/2012 | Tseng et al. |
| 2012/0286900 A1 | 11/2012 | Kadota et al. |
| 2013/0049902 A1 | 2/2013 | Hendry et al. |
| 2013/0143381 A1 | 6/2013 | Kikukawa |
| 2013/0244591 A1 | 9/2013 | Weissman et al. |
| 2013/0281031 A1 | 10/2013 | Gingrich et al. |
| 2013/0295863 A1 | 11/2013 | Shanan |
| 2014/0015603 A1 | 1/2014 | Scott et al. |
| 2014/0035358 A1 | 2/2014 | Ichikawa |
| 2014/0106698 A1 | 4/2014 | Mi et al. |
| 2014/0113573 A1 | 4/2014 | Khatri et al. |
| 2014/0133189 A1 | 5/2014 | Worek |
| 2014/0141738 A1 | 5/2014 | Janesch |
| 2014/0146737 A1 | 5/2014 | Ohshima et al. |
| 2014/0162712 A1 | 6/2014 | Feld et al. |
| 2014/0167877 A1 | 6/2014 | Shimizu et al. |
| 2014/0192845 A1 | 7/2014 | Szini et al. |
| 2014/0225680 A1 | 8/2014 | Fujiwara et al. |
| 2014/0232467 A1 | 8/2014 | Mukai et al. |
| 2014/0285286 A1 | 9/2014 | Bojer |
| 2014/0323046 A1 | 10/2014 | Asai et al. |
| 2014/0323071 A1 | 10/2014 | Liao |
| 2014/0328220 A1 | 11/2014 | Khlat et al. |
| 2015/0002240 A1 | 1/2015 | Reiha |
| 2015/0042399 A1 | 2/2015 | Imbornone et al. |
| 2015/0056939 A1 | 2/2015 | Ong et al. |

(56) References Cited

U.S. PATENT DOCUMENTS

| | | |
|---|---|---|
| 2015/0061680 A1 | 3/2015 | Leskowitz |
| 2015/0102887 A1 | 4/2015 | Park |
| 2015/0116950 A1 | 4/2015 | Yoo et al. |
| 2017/0084991 A1 | 3/2017 | Mayo |

FOREIGN PATENT DOCUMENTS

| | | |
|---|---|---|
| JP | 06082539 A | 3/1994 |
| JP | 07015253 A | 1/1995 |
| JP | 2010141827 A | 6/2010 |
| KR | 100812098 B1 | 3/2008 |
| WO | 0146971 A1 | 6/2001 |
| WO | 2005117255 A1 | 12/2005 |

OTHER PUBLICATIONS

Non-Final Office Action for U.S. Appl. No. 14/215,800, dated Nov. 20, 2015, 5 pages.
Notice of Allowance for U.S. Appl. No. 14/298,829, dated May 20, 2016, 9 pages.
Notice of Allowance for U.S. Appl. No. 14/298,830, dated Apr. 7, 2016, 9 pages.
Non-Final Office Action for U.S. Appl. No. 14/449,913, dated Mar. 28, 2016, 15 pages.
Notice of Allowance for U.S. Appl. No. 14/298,852, dated May 13, 2016, 9 pages.
Final Office Action for U.S. Appl. No. 14/450,028, dated Mar. 31, 2016, 12 pages.
Non-Final Office Action for U.S. Appl. No. 14/449,764, dated May 4, 2016, 12 pages.
Non-Final Office Action for U.S. Appl. No. 14/450,199, dated Apr. 20, 2016, 7 pages.
Non-Final Office Action for U.S. Appl. No. 14/450,204, dated Apr. 22, 2016, 8 pages.
Notice of Allowance for U.S. Appl. No. 14/555,053, dated Apr. 19, 2016, 7 pages.
Final Office Action for U.S. Appl. No. 14/298,863, dated Jun. 3, 2016, 17 pages.
Notice of Allowance for U.S. Appl. No. 14/298,852, dated Jul. 13, 2016, 9 pages.
Notice of Allowance for U.S. Appl. No. 14/450,199, dated Aug. 1, 2016, 7 pages.
Final Office Action for U.S. Appl. No. 14/450,200, dated Jun. 14, 2016, 13 pages.
Non-Final Office Action for U.S. Appl. No. 14/554,943, dated Jun. 30, 2016, 14 pages.
Non-Final Office Action for U.S. Appl. No. 14/555,557, dated Jun. 13, 2016, 28 pages.
Advisory Action for U.S. Appl. No. 14/450,028, dated Aug. 2, 2016, 3 pages.
Non-Final Office Action for U.S. Appl. No. 14/215,800, dated Aug. 11, 2016, 6 pages.
Non-Final Office Action for U.S. Appl. No. 14/298,829, dated Jun. 22, 2015, 8 pages.
Hoppenjans, Eric E. et al., "A Vertically Integrated Tunable UHF Filter," International Microwave Symposium Digest (MTT), May 23-28, 2010, Anaheim, California, IEEE, pp. 1380-1383.
Joshi, H. et al., "Tunable high Q narrow-band triplexer," IEEE MTT-S International Microwave Symposium Digest, Jun. 7-12, 2009, Boston, MA, IEEE, pp. 1477-1480.
Kamali-Sarvestani, Reza et al., "Fabrication of High Quality Factor RF-Resonator Using Embedded Inductor and Via Capacitor," IECON 2010—36th Annual Conference on IEEE Industrial Electronics Society, Nov. 7-10, 2010, Glendale, Arizona, IEEE, pp. 2283-2287.
International Search Report and Written Opinion for PCT/US2014/030431, dated Jun. 20, 2014, 14 pages.
Invitation to Pay Additional Fees and, Where Applicable, Protest Fee for PCT/US2014/048608, dated Oct. 21, 2014, 7 pages.
International Search Report and Written Opinion for PCT/US2014/048608, dated Dec. 16, 2014, 18 pages.
Non-Final Office Action for U.S. Appl. No. 14/298,830, dated Dec. 3, 2015, 10 pages.
Non-Final Office Action for U.S. Appl. No. 14/298,863, dated Jan. 7, 2016, 16 pages.
Non-Final Office Action for U.S. Appl. No. 14/298,852, dated Dec. 22, 2015, 7 pages.
Non-Final Office Action for U.S. Appl. No. 14/450,028, dated Dec. 10, 2015, 11 pages.
Non-Final Office Action for U.S. Appl. No. 14/555,053, dated Dec. 31, 2015, 5 pages.
Final Office Action for U.S. Appl. No. 14/215,800, dated Mar. 11, 2016, 6 pages.
Final Office Action for U.S. Appl. No. 14/298,829, dated Feb. 3, 2016, 10 pages.
Non-Final Office Action for U.S. Appl. No. 14/450,156, dated Mar. 14, 2016, 11 pages.
Non-Final Office Action for U.S. Appl. No. 14/450,200, dated Feb. 29, 2016, 13 pages.
International Preliminary Report on Patentability for PCT/US2014/048608, dated Feb. 11, 2016, 14 pages.
Non-Final Office Action for U.S. Appl. No. 14/298,863, dated Sep. 26, 2016, 9 pages.
Final Office Action for U.S. Appl. No. 14/449,913, dated Sep. 7, 2016, 14 pages.
Non-Final Office Action for U.S. Appl. No. 14/450,156, dated Sep. 15, 2016, 11 pages.
Non-Final Office Action for U.S. Appl. No. 14/450,028, dated Sep. 26, 2016, 14 pages.
Non-Final Office Action for U.S. Appl. No. 14/449,764, dated Oct. 17, 2016, 10 pages.
Non-Final Office Action for U.S. Appl. No. 14/450,200, dated Sep. 8, 2016, 14 pages.
Final Office Action for U.S. Appl. No. 14/555,557, dated Sep. 20, 2016, 23 pages.
Non-Final Office Action for U.S. Appl. No. 14/553,371, dated Oct. 25, 2016, 19 pages.
Final Office Action for U.S. Appl. No. 14/215,800, dated Feb. 8, 2017, 7 pages.
Final Office Action for U.S. Appl. No. 14/298,863, dated Feb. 14, 2017, 10 pages.
Final Office Action for U.S. Appl. No. 14/450,028, dated Jan. 19, 2017, 12 pages.
Final Office Action for U.S. Appl. No. 14/449,764, dated Mar. 2, 2017, 10 pages.
Non-Final Office Action for U.S. Appl. No. 14/450,204, dated Feb. 1, 2017, 9 pages.
Notice of Allowance and Examiner-Initiated Interview Summary for U.S. Appl. No. 14/450,200, dated Feb. 10, 2017, 8 pages.
Corrected Notice of Allowability for U.S. Appl. No. 14/450,200, dated Mar. 1, 2017, 3 pages.
Non-Final Office Action for U.S. Appl. No. 14/555,557, dated Feb. 13, 2017, 21 pages.
Notice of Allowance for U.S. Appl. No. 15/223,416, dated Feb. 28, 2017, 8 pages.
Non-Final Office Action for U.S. Appl. No. 15/240,420, dated Jan. 26, 2017, 7 pages.
Non-Final Office Action for U.S. Appl. No. 15/241,823, dated Jan. 17, 2017, 6 pages.
Advisory Action for U.S. Appl. No. 14/215,800, dated Apr. 20, 2017, 2 pages.
Notice of Allowance for U.S. Appl. No. 14/298,863, dated May 31, 2017, 6 pages.
Final Office Action for U.S. Appl. No. 14/450,156, dated Apr. 27, 2017, 12 pages.
Notice of Allowance for U.S. Appl. No. 14/450,028, dated May 3, 2017, 5 pages.
Notice of Allowance and Examiner-Initiated Interview Summary for U.S. Appl. No. 14/449,764, dated May 19, 2017, 8 pages.
Notice of Allowance for U.S. Appl. No. 14/555,371, dated Mar. 31, 2017, 8 pages.

(56) References Cited

OTHER PUBLICATIONS

Notice of Allowance for U.S. Appl. No. 15/240,420, dated May 10, 2017, 8 pages.
Notice of Allowance for U.S. Appl. No. 15/241,823, dated May 9, 2017, 7 pages.
Notice of Allowance for U.S. Appl. No. 14/449,913, dated Dec. 7, 2016, 7 pages.
Notice of Allowance and Examiner-Initiated Interview Summary for U.S. Appl. No. 14/554,943, dated Nov. 16, 2016, 8 pages.
Notice of Allowance for U.S. Appl. No. 15/223,416, dated Dec. 2, 2016, 8 pages.
Non-Final Office Action for U.S. Appl. No. 14/215,800, dated Aug. 15, 2017, 6 pages.
Notice of Allowance for U.S. Appl. No. 14/450,204, dated Jun. 28, 2017, 8 pages.
Supplemental Notice of Allowability for U.S. Appl. No. 14/450,204, dated Aug. 28, 2017, 5 pages.
Notice of Allowance for U.S. Appl. No. 14/554,943, dated Aug. 31, 2017, 7 pages.
Final Office Action for U.S. Appl. No. 14/555,557, dated Aug. 7, 2017, 21 pages.
Non-Final Office Action for U.S. Appl. No. 15/587,581, dated Jun. 30, 2017, 6 pages.
Non-Final Office Action for U.S. Appl. No. 15/415,538, dated Jul. 17, 2017, 18 pages.

\* cited by examiner

RF FILTER STRUCTURE FOR ANTENNA DIVERSITY AND BEAM FORMING

RELATED APPLICATIONS

The present application claims priority to U.S. Provisional Patent Application No. 61/909,028, filed Nov. 26, 2013; No. 61/938,884, filed Feb. 12, 2014; No. 61/946,270, filed Feb. 28, 2014; No. 61/946,927, filed Mar. 3, 2014; No. 61/949,581, filed Mar. 7, 2014; No. 61/951,844, filed Mar. 12, 2014; No. 61/982,946, filed Apr. 23, 2014; No. 61/982,952, filed Apr. 23, 2014; No. 61/982,971, filed Apr. 23, 2014; No. 62/008,192, filed Jun. 5, 2014; No. 62/011,629, filed Jun. 13, 2014; and No. 62/031,645, filed Jul. 31, 2014.

The present application claims the benefit of and is a Continuation-in-Part of U.S. patent application Ser. No. 14/099,007, filed Dec. 6, 2013, now U.S. Pat. No. 9,196,406, entitled "HIGH Q FACTOR INDUCTOR STRUCTURE," which claims priority to U.S. Provisional Patent Application No. 61/789,693, filed Mar. 15, 2013; No. 61/831,666, filed Jun. 6, 2013; No. 61/860,932, filed Aug. 1, 2013; and No. 61/909,028, filed Nov. 26, 2013.

The present application claims the benefit of and is a Continuation-in-Part of U.S. patent application Ser. No. 14/215,815, filed Mar. 17, 2014, now U.S. Pat. No. 9,294,045, entitled "GAIN AND PHASE CALIBRATION FOR CLOSED LOOP FEEDBACK LINEARIZED AMPLIFIERS," which claims priority to U.S. Provisional Patent Application No. 61/793,583, filed Mar. 15, 2013; No. 61/789,508, filed Mar. 15, 2013; No. 61/800,772, filed Mar. 15, 2013; No. 61/800,991, filed Mar. 15, 2013; No. 61/801,038, filed Mar. 15, 2013; No. 61/946,270, filed Feb. 28, 2014; and No. 61/946,927, filed Mar. 3, 2014.

The present application claims the benefit of and is a Continuation-in-Part of U.S. patent application Ser. No. 14/217,199, filed Mar. 17, 2014, now U.S. Pat. No. 9,742,359, entitled "POWER AMPLIFIER WITH WIDE DYNAMIC RANGE AM FEEDBACK LINEARIZATION SCHEME," which claims priority to U.S. Provisional Patent Application No. 61/946,927, filed Mar. 3, 2014; No. 61/793,583, filed Mar. 15, 2013; No. 61/789,508, filed Mar. 15, 2013; No. 61/800,772, filed Mar. 15, 2013; No. 61/800,991, filed Mar. 15, 2013; No. 61/801,038, filed Mar. 15, 2013; and No. 61/946,270, filed Feb. 28, 2014.

The present application claims the benefit of and is a Continuation-in-Part of U.S. patent application Ser. No. 14/216,794, filed Mar. 17, 2014, now U.S. Pat. No. 9,294,046, entitled "RF POWER AMPLIFIER WITH PM FEEDBACK LINEARIZATION," which claims priority to U.S. Provisional Patent Application No. 61/946,927, filed Mar. 3, 2014; No. 61/793,583, filed Mar. 15, 2013; No. 61/789,508, filed Mar. 15, 2013; No. 61/800,772, filed Mar. 15, 2013; No. 61/800,991, filed Mar. 15, 2013; No. 61/801,038, filed Mar. 15, 2013; and No. 61/946,270, filed Feb. 28, 2014.

The present application claims the benefit of and is a Continuation-in-Part of U.S. patent application Ser. No. 14/215,800, filed Mar. 17, 2014, entitled "WEAKLY COUPLED BASED HARMONIC REJECTION FILTER FOR FEEDBACK LINEARIZATION POWER AMPLIFIER," which claims priority to U.S. Provisional Patent Application No. 61/946,927, filed Mar. 3, 2014; No. 61/793,583, filed Mar. 15, 2013; No. 61/789,508, filed Mar. 15, 2013; No. 61/800,772, filed Mar. 15, 2013; No. 61/800,991, filed Mar. 15, 2013; No. 61/801,038, filed Mar. 15, 2013; and No. 61/946,270, filed Feb. 28, 2014.

The present application claims the benefit of and is a Continuation-in-Part of U.S. patent application Ser. No. 14/218,953, filed Mar. 18, 2014, now U.S. Pat. No. 9,444,411, entitled "RF POWER AMPLIFIER WITH TOTAL RADIATED POWER STABILIZATION," which claims priority to U.S. Provisional Patent Application No. 61/946,927, filed Mar. 3, 2014; No. 61/793,583, filed Mar. 15, 2013; No. 61/789,508, filed Mar. 15, 2013; No. 61/800,772, filed Mar. 15, 2013; No. 61/800,991, filed Mar. 15, 2013; No. 61/801,038, filed Mar. 15, 2013; and No. 61/946,270, filed Feb. 28, 2014.

The present application claims the benefit of and is a Continuation-in-Part of U.S. patent application Ser. No. 14/216,376, filed Mar. 17, 2014, now U.S. Pat. No. 9,391,565, entitled "AMPLIFIER PHASE DISTORTION CORRECTION BASED ON AMPLITUDE DISTORTION MEASUREMENT," which claims priority to U.S. Provisional Patent Application No. 61/946,927, filed Mar. 3, 2014; No. 61/793,583, filed Mar. 15, 2013; No. 61/789,508, filed Mar. 15, 2013; No. 61/800,772, filed Mar. 15, 2013; No. 61/800,991, filed Mar. 15, 2013; No. 61/801,038, filed Mar. 15, 2013; and No. 61/946,270, filed Feb. 28, 2014.

The present application claims the benefit of and is a Continuation-in-Part of U.S. patent application Ser. No. 14/216,560, filed Mar. 17, 2014, now U.S. Pat. No. 9,748,905, entitled "RF REPLICATOR FOR ACCURATE MODULATED AMPLITUDE AND PHASE MEASUREMENT," which claims priority to U.S. Provisional Patent Application No. 61/946,927, filed Mar. 3, 2014; No. 61/793,583, filed Mar. 15, 2013; No. 61/789,508, filed Mar. 15, 2013; No. 61/800,772, filed Mar. 15, 2013; No. 61/800,991, filed Mar. 15, 2013; No. 61/801,038, filed Mar. 15, 2013; and No. 61/946,270, filed Feb. 28, 2014.

The present application claims the benefit of and is a Continuation-in-Part of U.S. patent application Ser. No. 14/298,829, filed Jun. 6, 2014, now U.S. Pat. No. 9,455,680, entitled "TUNABLE RF FILTER STRUCTURE FORMED BY A MATRIX OF WEAKLY COUPLED RESONATORS," which claims priority to U.S. Provisional Patent Application No. 61/831,666, filed Jun. 6, 2013; No. 61/860,932, filed Aug. 1, 2013; No. 61/909,028, filed Nov. 26, 2013; No. 61/938,884, filed Feb. 12, 2014; No. 61/951,844, filed Mar. 12, 2014; No. 61/949,581, filed Mar. 7, 2014; No. 61/982,946, filed Apr. 23, 2014; No. 61/982,952, filed Apr. 23, 2014; No. 61/982,971, filed Apr. 23, 2014; and No. 62/008,192, filed Jun. 5, 2014.

The present application claims the benefit of and is a Continuation-in-Part of U.S. patent application Ser. No. 14/298,830, filed Jun. 6, 2014, now U.S. Pat. No. 9,419,578, entitled "TUNABLE RF FILTER PATHS FOR TUNABLE RF FILTER STRUCTURES," which claims priority to U.S. Provisional Patent Application No. 61/831,666, filed Jun. 6, 2013; No. 61/860,932, filed Aug. 1, 2013; No. 61/909,028, filed Nov. 26, 2013; No. 61/938,884, filed Feb. 12, 2014; No. 61/951,844, filed Mar. 12, 2014; No. 61/949,581, filed Mar. 7, 2014; No. 61/982,946, filed Apr. 23, 2014; No. 61/982,952, filed Apr. 23, 2014; No. 61/982,971, filed Apr. 23, 2014; and No. 62/008,192, filed Jun. 5, 2014.

The present application claims the benefit of and is a Continuation-in-Part of U.S. patent application Ser. No. 14/298,834, filed Jun. 6, 2014, entitled "HIGH QUALITY FACTOR INTERCONNECT FOR RF CIRCUITS," which claims priority to U.S. Provisional Patent Application No. 61/831,666, filed Jun. 6, 2013; No. 61/860,932, filed Aug. 1, 2013; No. 61/909,028, filed Nov. 26, 2013; No. 61/938,884, filed Feb. 12, 2014; No. 61/951,844, filed Mar. 12, 2014; No. 61/949,581, filed Mar. 7, 2014; No. 61/982,946, filed Apr.

23, 2014; No. 61/982,952, filed Apr. 23, 2014; No. 61/982,971, filed Apr. 23, 2014; and No. 62/008,192, filed Jun. 5, 2014.

The present application claims the benefit of and is a Continuation-in-Part of U.S. patent application Ser. No. 14/298,872, filed Jun. 6, 2014, now U.S. Pat. No. 9,484,879, entitled "NONLINEAR CAPACITANCE LINEARIZATION," which claims priority to U.S. Provisional Patent Application No. 61/831,666, filed Jun. 6, 2013; No. 61/860,932, filed Aug. 1, 2013; No. 61/909,028, filed Nov. 26, 2013; No. 61/938,884, filed Feb. 12, 2014; No. 61/951,844, filed Mar. 12, 2014; No. 61/949,581, filed Mar. 7, 2014; No. 61/982,946, filed Apr. 23, 2014; No. 61/982,952, filed Apr. 23, 2014; No. 61/982,971, filed Apr. 23, 2014; and No. 62/008,192, filed Jun. 5, 2014.

The present application claims the benefit of and is a Continuation-in-Part of U.S. patent application Ser. No. 14/298,863, filed Jun. 6, 2014, entitled "TUNABLE RF FILTER BASED RF COMMUNICATIONS SYSTEM," which claims priority to U.S. Provisional Patent Application No. 61/831,666, filed Jun. 6, 2013; No. 61/860,932, filed Aug. 1, 2013; No. 61/909,028, filed Nov. 26, 2013; No. 61/938,884, filed Feb. 12, 2014; No. 61/951,844, filed Mar. 12, 2014; No. 61/949,581, filed Mar. 7, 2014; No. 61/982,946, filed Apr. 23, 2014; No. 61/982,952, filed Apr. 23, 2014; No. 61/982,971, filed Apr. 23, 2014; and No. 62/008,192, filed Jun. 5, 2014.

The present application claims the benefit of and is a Continuation-in-Part of U.S. patent application Ser. No. 14/298,852, filed Jun. 6, 2014, now U.S. Pat. No. 9,614,490, entitled "MULTI-BAND INTERFERENCE OPTIMIZATION," which claims priority to U.S. Provisional Patent Application No. 61/831,666, filed Jun. 6, 2013; No. 61/860,932, filed Aug. 1, 2013; No. 61/909,028, filed Nov. 26, 2013; No. 61/938,884, filed Feb. 12, 2014; No. 61/951,844, filed Mar. 12, 2014; No. 61/949,581, filed Mar. 7, 2014; No. 61/982,946, filed Apr. 23, 2014; No. 61/982,952, filed Apr. 23, 2014; No. 61/982,971, filed Apr. 23, 2014; and No. 62/008,192, filed Jun. 5, 2014.

The present application claims the benefit of and is a Continuation-in-Part of U.S. patent application Ser. No. 14/449,913, filed Aug. 1, 2014, now U.S. Pat. No. 9,628,045, entitled "COOPERATIVE TUNABLE RF FILTERS," which claims priority to U.S. Provisional Patent Application No. 61/860,932, filed Aug. 1, 2013; No. 61/909,028, filed Nov. 26, 2013; No. 61/938,884, filed Feb. 12, 2014; No. 61/949,581, filed Mar. 7, 2014; No. 61/951,844, filed Mar. 12, 2014; No. 61/982,946, filed Apr. 23, 2014; No. 61/982,952, filed Apr. 23, 2014; No. 61/982,971, filed Apr. 23, 2014; No. 62/008,192, filed Jun. 5, 2014; No. 62/011,629, filed Jun. 13, 2014; and No. 62/031,645, filed Jul. 31, 2014. U.S. patent application Ser. No. 14/449,913, filed Aug. 1, 2014, is a Continuation-in-Part of U.S. patent application Ser. No. 14/298,829, filed Jun. 6, 2014, which claims priority to U.S. Provisional Patent Application No. 61/831,666, filed Jun. 6, 2013; No. 61/860,932, filed Aug. 1, 2013; No. 61/909,028, filed Nov. 26, 2013; No. 61/938,884, filed Feb. 12, 2014; No. 61/951,844, filed Mar. 12, 2014; No. 61/949,581, filed Mar. 7, 2014; No. 61/982,946, filed Apr. 23, 2014; No. 61/982,952, filed Apr. 23, 2014; No. 61/982,971, filed Apr. 23, 2014; and No. 62/008,192, filed Jun. 5, 2014. U.S. patent application Ser. No. 14/449,913, filed Aug. 1, 2014, is a Continuation-in-Part of U.S. patent application Ser. No. 14/298,830, filed Jun. 6, 2014, which claims priority to U.S. Provisional Patent Application No. 61/831,666, filed Jun. 6, 2013; No. 61/860,932, filed Aug. 1, 2013; No. 61/909,028, filed Nov. 26, 2013; No. 61/938,884, filed Feb. 12, 2014; No. 61/951,844, filed Mar. 12, 2014; No. 61/949,581, filed Mar. 7, 2014; No. 61/982,946, filed Apr. 23, 2014; No. 61/982,952, filed Apr. 23, 2014; No. 61/982,971, filed Apr. 23, 2014; and No. 62/008,192, filed Jun. 5, 2014. U.S. patent application Ser. No. 14/449,913, filed Aug. 1, 2014, is a Continuation-in-Part of U.S. patent application Ser. No. 14/298,834, filed Jun. 6, 2014, which claims priority to U.S. Provisional Patent Application No. 61/831,666, filed Jun. 6, 2013; No. 61/860,932, filed Aug. 1, 2013; No. 61/909,028, filed Nov. 26, 2013; No. 61/938,884, filed Feb. 12, 2014; No. 61/951,844, filed Mar. 12, 2014; No. 61/949,581, filed Mar. 7, 2014; No. 61/982,946, filed Apr. 23, 2014; No. 61/982,952, filed Apr. 23, 2014; No. 61/982,971, filed Apr. 23, 2014; and No. 62/008,192, filed Jun. 5, 2014. U.S. patent application Ser. No. 14/449,913, filed Aug. 1, 2014, is a Continuation-in-Part of U.S. patent application Ser. No. 14/298,872, filed Jun. 6, 2014, which claims priority to U.S. Provisional Patent Application No. 61/831,666, filed Jun. 6, 2013; No. 61/860,932, filed Aug. 1, 2013; No. 61/909,028, filed Nov. 26, 2013; No. 61/938,884, filed Feb. 12, 2014; No. 61/951,844, filed Mar. 12, 2014; No. 61/949,581, filed Mar. 7, 2014; No. 61/982,946, filed Apr. 23, 2014; No. 61/982,952, filed Apr. 23, 2014; No. 61/982,971, filed Apr. 23, 2014; and No. 62/008,192, filed Jun. 5, 2014. U.S. patent application Ser. No. 14/449,913, filed Aug. 1, 2014, is a Continuation-in-Part of U.S. patent application Ser. No. 14/298,863, filed Jun. 6, 2014, which claims priority to U.S. Provisional Patent Application No. 61/831,666, filed Jun. 6, 2013; No. 61/860,932, filed Aug. 1, 2013; No. 61/909,028, filed Nov. 26, 2013; No. 61/938,884, filed Feb. 12, 2014; No. 61/951,844, filed Mar. 12, 2014; No. 61/949,581, filed Mar. 7, 2014; No. 61/982,946, filed Apr. 23, 2014; No. 61/982,952, filed Apr. 23, 2014; No. 61/982,971, filed Apr. 23, 2014; and No. 62/008,192, filed Jun. 5, 2014. U.S. patent application Ser. No. 14/449,913, filed Aug. 1, 2014, is a Continuation-in-Part of U.S. patent application Ser. No. 14/298,852, filed Jun. 6, 2014, which claims priority to U.S. Provisional Patent Application No. 61/831,666, filed Jun. 6, 2013; No. 61/860,932, filed Aug. 1, 2013; No. 61/909,028, filed Nov. 26, 2013; No. 61/938,884, filed Feb. 12, 2014; No. 61/951,844, filed Mar. 12, 2014; No. 61/949,581, filed Mar. 7, 2014; No. 61/982,946, filed Apr. 23, 2014; No. 61/982,952, filed Apr. 23, 2014; No. 61/982,971, filed Apr. 23, 2014; and No. 62/008,192, filed Jun. 5, 2014.

The present application claims the benefit of and is a Continuation-in-Part of U.S. patent application Ser. No. 14/450,156, filed Aug. 1, 2014, entitled "ADVANCED 3D INDUCTOR STRUCTURES WITH CONFINED MAGNETIC FIELD," which claims priority to No. 61/860,932, filed Aug. 1, 2013; No. 61/909,028, filed Nov. 26, 2013; No. 61/938,884, filed Feb. 12, 2014; No. 61/949,581, filed Mar. 7, 2014; No. 61/951,844, filed Mar. 12, 2014; No. 61/982,946, filed Apr. 23, 2014; No. 61/982,952, filed Apr. 23, 2014; No. 61/982,971, filed Apr. 23, 2014; No. 62/008,192, filed Jun. 5, 2014; No. 62/011,629, filed Jun. 13, 2014; and No. 62/031,645, filed Jul. 31, 2014. U.S. patent application Ser. No. 14/450,156, filed Aug. 1, 2014, is a Continuation-in-Part of U.S. patent application Ser. No. 14/298,829, filed Jun. 6, 2014, which claims priority to U.S. Provisional Patent Application No. 61/831,666, filed Jun. 6, 2013; No. 61/860,932, filed Aug. 1, 2013; No. 61/909,028, filed Nov. 26, 2013; No. 61/938,884, filed Feb. 12, 2014; No. 61/951,844, filed Mar. 12, 2014; No. 61/949,581, filed Mar. 7, 2014; No. 61/982,946, filed Apr. 23, 2014; No. 61/982,952, filed Apr. 23, 2014; No. 61/982,971, filed Apr. 23, 2014; and No. 62/008,192, filed Jun. 5, 2014. U.S. patent application Ser. No. 14/450,156, filed Aug. 1, 2014, is a Continuation-in-Part of U.S. patent application Ser. No. 14/298,830, filed Jun. 6, 2014, which claims priority to U.S. Provisional Patent Application No. 61/831,666, filed Jun. 6, 2013; No. 61/860,932, filed Aug. 1, 2013; No. 61/909,028, filed Nov. 26, 2013; No. 61/938,884, filed Feb. 12, 2014; No. 61/951,844, filed Mar. 12, 2014; No. 61/949,581, filed Mar. 7, 2014; No. 61/982,946, filed Apr. 23, 2014; No. 61/982,952, filed Apr. 23, 2014; No. 61/982,971, filed Apr. 23, 2014; and No. 62/008,192, filed Jun. 5, 2014. U.S. patent application Ser. No. 14/450,156, filed Aug. 1, 2014, is a Continuation-in-Part of U.S. patent application Ser. No. 14/298,834, filed Jun. 6, 2014, which claims priority to U.S. Provisional Patent Application No. 61/831,666, filed Jun. 6, 2013; No. 61/860,932, filed Aug. 1, 2013; No. 61/909,028, filed Nov. 26, 2013; No. 61/938,884, filed Feb. 12, 2014; No. 61/951,844, filed Mar. 12, 2014; No. 61/949,581, filed Mar. 7, 2014; No. 61/982,946, filed Apr. 23, 2014; No. 61/982,952, filed Apr. 23, 2014; No. 61/982,971, filed Apr. 23, 2014; and No. 62/008,192, filed Jun. 5, 2014. U.S. patent application Ser. No. 14/450,156, filed Aug. 1, 2014, is a Continuation-in-Part of U.S. patent application Ser. No. 14/298,872, filed Jun. 6, 2014, which claims priority to U.S. Provisional Patent Application No. 61/831,666, filed Jun. 6, 2013; No. 61/860,932, filed Aug. 1, 2013; No. 61/909,028, filed Nov. 26, 2013; No. 61/938,884, filed Feb. 12, 2014; No. 61/951,844, filed Mar. 12, 2014; No. 61/949,581, filed Mar. 7, 2014; No. 61/982,946, filed Apr. 23, 2014; No. 61/982,952, filed Apr. 23, 2014; No. 61/982,971, filed Apr. 23, 2014; and No. 62/008,192, filed Jun. 5, 2014. U.S. patent application Ser. No. 14/450,156, filed Aug. 1, 2014, is a Continuation-in-Part of U.S. patent application Ser. No. 14/298,863, filed Jun. 6, 2014, which claims priority to U.S. Provisional Patent Application No. 61/831,666, filed Jun. 6, 2013; No. 61/860,932, filed Aug. 1, 2013; No. 61/909,028, filed Nov. 26, 2013; No. 61/938,884, filed Feb. 12, 2014; No. 61/951,844, filed Mar. 12, 2014; No. 61/949,581, filed Mar. 7, 2014; No. 61/982,946, filed Apr. 23, 2014; No. 61/982,952, filed Apr. 23, 2014; No. 61/982,971, filed Apr. 23, 2014; and No. 62/008,192, filed Jun. 5, 2014. U.S. patent application Ser. No. 14/450,156, filed Aug. 1, 2014, is a Continuation-in-Part of U.S. patent application Ser. No. 14/298,852, filed Jun. 6, 2014, which claims priority to U.S. Provisional Patent Application No. 61/831,666, filed Jun. 6, 2013; No. 61/860,932, filed Aug. 1, 2013; No. 61/909,028, filed Nov. 26, 2013; No. 61/938,884, filed Feb. 12, 2014; No. 61/951,844, filed Mar. 12, 2014; No. 61/949,581, filed Mar. 7, 2014; No. 61/982,946, filed Apr. 23, 2014; No. 61/982,952, filed Apr. 23, 2014; No. 61/982,971, filed Apr. 23, 2014; and No. 62/008,192, filed Jun. 5, 2014. U.S. patent application Ser. No. 14/450,156, filed Aug. 1, 2014, is a Continuation-in-Part of U.S. patent application Ser. No. 14/099,007, filed Dec. 6, 2013, entitled "HIGH Q FACTOR INDUCTOR STRUCTURE," which claims priority to U.S. Provisional Patent Application No. 61/789,693, filed Mar. 15, 2013; No. 61/831,666, filed Jun. 6, 2013; No. 61/860,932, filed Aug. 1, 2013; and No. 61/909,028, filed Nov. 26, 2013.

The present application claims the benefit of and is a Continuation-in-Part of U.S. patent application Ser. No. 14/450,028, filed Aug. 1, 2014, now U.S. Pat. No. 9,755,671, entitled "VSWR DETECTOR FOR A TUNABLE RF FILTER STRUCTURE," which claims priority to U.S. Provisional Patent Application No. 61/860,932, filed Aug. 1, 2013; No. 61/909,028, filed Nov. 26, 2013; No. 61/938,884, filed Feb. 12, 2014; No. 61/949,581, filed Mar. 7, 2014; No. 61/951,844, filed Mar. 12, 2014; No. 61/982,946, filed Apr. 23, 2014; No. 61/982,952, filed Apr. 23, 2014; No. 61/982,971, filed Apr. 23, 2014; No. 62/008,192, filed Jun. 5, 2014; No. 62/011,629, filed Jun. 13, 2014; and No. 62/031,645, filed Jul. 31, 2014. U.S. patent application Ser. No. 14/450,028, filed Aug. 1, 2014, is a Continuation-in-Part of U.S. patent application Ser. No. 14/298,829, filed Jun. 6, 2014, which claims priority to U.S. Provisional Patent Application No. 61/831,666, filed Jun. 6, 2013; No. 61/860,932, filed Aug. 1, 2013; No. 61/909,028, filed Nov. 26, 2013; No. 61/938,884, filed Feb. 12, 2014; No. 61/951,844, filed Mar. 12, 2014; No. 61/949,581, filed Mar. 7, 2014; No. 61/982,946, filed Apr. 23, 2014; No. 61/982,952, filed Apr. 23, 2014; No. 61/982,971, filed Apr. 23, 2014; and No. 62/008,192, filed Jun. 5, 2014. U.S. patent application Ser. No. 14/450,028, filed Aug. 1, 2014, is a Continuation-in-Part of U.S. patent application Ser. No. 14/298,830, filed Jun. 6, 2014, which claims priority to U.S. Provisional Patent Application No. 61/831,666, filed Jun. 6, 2013; No. 61/860,932, filed Aug. 1, 2013; No. 61/909,028, filed Nov. 26, 2013; No. 61/938,884, filed Feb. 12, 2014; No. 61/951,844, filed Mar. 12, 2014; No. 61/949,581, filed Mar. 7, 2014; No. 61/982,946, filed Apr. 23, 2014; No. 61/982,952, filed Apr. 23, 2014; No. 61/982,971, filed Apr. 23, 2014; and No. 62/008,192, filed Jun. 5, 2014. U.S. patent application Ser. No. 14/450,028, filed Aug. 1, 2014, is a Continuation-in-Part of U.S. patent application Ser. No. 14/298,834, filed Jun. 6, 2014, which claims priority to U.S. Provisional Patent Application No. 61/831,666, filed Jun. 6, 2013; No. 61/860,932, filed Aug. 1, 2013; No. 61/909,028, filed Nov. 26, 2013; No. 61/938,884, filed Feb. 12, 2014; No. 61/951,844, filed Mar. 12, 2014; No. 61/949,581, filed Mar. 7, 2014; No. 61/982,946, filed Apr. 23, 2014; No. 61/982,952, filed Apr. 23, 2014; No. 61/982,971, filed Apr. 23, 2014; and No. 62/008,192, filed Jun. 5, 2014. U.S. patent application Ser. No. 14/450,028, filed Aug. 1, 2014, is a Continuation-in-Part of U.S. patent application Ser. No. 14/298,872, filed Jun. 6, 2014, which claims priority to U.S. Provisional Patent Application No. 61/831,666, filed Jun. 6, 2013; No. 61/860,932, filed Aug. 1, 2013; No. 61/909,028, filed Nov. 26, 2013; No. 61/938,884, filed Feb. 12, 2014; No. 61/951,844, filed Mar. 12, 2014; No. 61/949,581, filed Mar. 7, 2014; No. 61/982,946, filed Apr. 23, 2014; No. 61/982,952, filed Apr. 23, 2014; No. 61/982,971, filed Apr. 23, 2014; and No. 62/008,192, filed Jun. 5, 2014. U.S. patent application Ser. No. 14/450,028, filed Aug. 1, 2014, is a Continuation-in-Part of U.S. patent application Ser. No. 14/298,863, filed Jun. 6, 2014, which claims priority to U.S. Provisional Patent Application No. 61/831,666, filed Jun. 6, 2013; No. 61/860,932, filed Aug. 1, 2013; No. 61/909,028, filed Nov. 26, 2013; No. 61/938,884, filed Feb. 12, 2014; No. 61/951,844, filed Mar. 12, 2014; No. 61/949,581, filed Mar. 7, 2014; No. 61/982,946, filed Apr. 23, 2014; No. 61/982,952, filed Apr. 23, 2014; No. 61/982,971, filed Apr. 23, 2014; and No. 62/008,192, filed Jun. 5, 2014. U.S. patent application Ser. No. 14/450,028, filed Aug. 1, 2014, is a Continuation-in-Part of U.S. patent application Ser. No. 14/298,852, filed Jun. 6, 2014, which claims priority to U.S. Provisional Patent Application No. 61/831,666, filed Jun. 6, 2013; No. 61/860,932, filed Aug. 1, 2013; No. 61/909,028, filed Nov. 26, 2013; No. 61/938,884, filed Feb. 12, 2014; No. 61/951,844, filed Mar. 12, 2014; No. 61/949,581, filed Mar. 7, 2014; No. 61/982,946, filed Apr. 23, 2014; No. 61/982,952, filed Apr. 23, 2014; No. 61/982,971, filed Apr. 23, 2014; and No. 62/008,192, filed Jun. 5, 2014.

The present application claims the benefit of and is a Continuation-in-Part of U.S. patent application Ser. No. 14/449,764, filed Aug. 1, 2014, now U.S. Pat. No. 9,780,756, entitled "CALIBRATION FOR A TUNABLE RF FILTER STRUCTURE," which claims priority to U.S. Provisional Patent Application No. 61/860,932, filed Aug. 1, 2013; No. 61/909,028, filed Nov. 26, 2013; No. 61/938,884, filed Feb. 12, 2014; No. 61/949,581, filed Mar. 7, 2014; No. 61/951,844, filed Mar. 12, 2014; No. 61/982,946, filed Apr. 23, 2014; No. 61/982,952, filed Apr. 23, 2014; No. 61/982,971, filed Apr. 23, 2014; No. 62/008,192, filed Jun. 5, 2014; No. 62/011,629, filed Jun. 13, 2014; and No. 62/031,645, filed Jul. 31, 2014. U.S. patent application Ser. No. 14/449,764, filed Aug. 1, 2014, is a Continuation-in-Part of U.S. patent application Ser. No. 14/298,829, filed Jun. 6, 2014, which claims priority to U.S. Provisional Patent Application No. 61/831,666, filed Jun. 6, 2013; No. 61/860,932, filed Aug. 1, 2013; No. 61/909,028, filed Nov. 26, 2013; No. 61/938,884, filed Feb. 12, 2014; No. 61/951,844, filed Mar. 12, 2014; No. 61/949,581, filed Mar. 7, 2014; No. 61/982,946, filed Apr. 23, 2014; No. 61/982,952, filed Apr. 23, 2014; No. 61/982,971, filed Apr. 23, 2014; and No. 62/008,192, filed Jun. 5, 2014. U.S. patent application Ser. No. 14/449,764, filed Aug. 1, 2014, is a Continuation-in-Part of U.S. patent application Ser. No. 14/298,830, filed Jun. 6, 2014, which claims priority to U.S. Provisional Patent Application No. 61/831,666, filed Jun. 6, 2013; No. 61/860,932, filed Aug. 1, 2013; No. 61/909,028, filed Nov. 26, 2013; No. 61/938,884, filed Feb. 12, 2014; No. 61/951,844, filed Mar. 12, 2014; No. 61/949,581, filed Mar. 7, 2014; No. 61/982,946, filed Apr. 23, 2014; No. 61/982,952, filed Apr. 23, 2014; No. 61/982,971, filed Apr. 23, 2014; and No. 62/008,192, filed Jun. 5, 2014. U.S. patent application Ser. No. 14/449,764, filed Aug. 1, 2014, is a Continuation-in-Part of U.S. patent application Ser. No. 14/298,834, filed Jun. 6, 2014, which claims priority to U.S. Provisional Patent Application No. 61/831,666, filed Jun. 6, 2013; No. 61/860,932, filed Aug. 1, 2013; No. 61/909,028, filed Nov. 26, 2013; No. 61/938,884, filed Feb. 12, 2014; No. 61/951,844, filed Mar. 12, 2014; No. 61/949,581, filed Mar. 7, 2014; No. 61/982,946, filed Apr. 23, 2014; No. 61/982,952, filed Apr. 23, 2014; No. 61/982,971, filed Apr. 23, 2014; and No. 62/008,192, filed Jun. 5, 2014. U.S. patent application Ser. No. 14/449,764, filed Aug. 1, 2014, is a Continuation-in-Part of U.S. patent application Ser. No. 14/298,872, filed Jun. 6, 2014, which claims priority to U.S. Provisional Patent Application No. 61/831,666, filed Jun. 6, 2013; No. 61/860,932, filed Aug. 1, 2013; No. 61/909,028, filed Nov. 26, 2013; No. 61/938,884, filed Feb. 12, 2014; No. 61/951,844, filed Mar. 12, 2014; No. 61/949,581, filed Mar. 7, 2014; No. 61/982,946, filed Apr. 23, 2014; No. 61/982,952, filed Apr. 23, 2014; No. 61/982,971, filed Apr. 23, 2014; and No. 62/008,192, filed Jun. 5, 2014. U.S. patent application Ser. No. 14/449,764, filed Aug. 1, 2014, is a Continuation-in-Part of U.S. patent application Ser. No. 14/298,863, filed Jun. 6, 2014, which claims priority to U.S. Provisional Patent Application No. 61/831,666, filed Jun. 6, 2013; No. 61/860,932, filed Aug. 1, 2013; No. 61/909,028, filed Nov. 26, 2013; No. 61/938,884, filed Feb. 12, 2014; No. 61/951,844, filed Mar. 12, 2014; No. 61/949,581, filed Mar. 7, 2014; No. 61/982,946, filed Apr. 23, 2014; No. 61/982,952, filed Apr. 23, 2014; No. 61/982,971, filed Apr. 23, 2014; and No. 62/008,192, filed Jun. 5, 2014. U.S. patent application Ser. No. 14/449,764, filed Aug. 1, 2014, is a Continuation-in-Part of U.S. patent application Ser. No. 14/298,852, filed Jun. 6, 2014, which claims priority to U.S. Provisional Patent Application No. 61/831,666, filed Jun. 6, 2013; No. 61/860,932, filed Aug. 1, 2013; No. 61/909,028, filed Nov. 26, 2013; No. 61/938,884, filed Feb. 12, 2014; No. 61/951,844, filed Mar. 12, 2014; No. 61/949,581, filed Mar. 7, 2014; No. 61/982,946, filed Apr. 23, 2014; No. 61/982,952, filed Apr. 23, 2014; No. 61/982,971, filed Apr. 23, 2014; and No. 62/008,192, filed Jun. 5, 2014.

The present application claims the benefit of and is a Continuation-in-Part of U.S. patent application Ser. No. 14/450,199, filed Aug. 1, 2014, now U.S. Pat. No. 9,705,478, entitled "WEAKLY COUPLED TUNABLE RF RECEIVER ARCHITECTURE," which claims priority to U.S. Provisional Patent Application No. 61/860,932, filed Aug. 1, 2013; No. 61/909,028, filed Nov. 26, 2013; No. 61/938,884, filed Feb. 12, 2014; No. 61/949,581, filed Mar. 7, 2014; No. 61/951,844, filed Mar. 12, 2014; No. 61/982,946, filed Apr. 23, 2014; No. 61/982,952, filed Apr. 23, 2014; No. 61/982,971, filed Apr. 23, 2014; No. 62/008,192, filed Jun. 5, 2014; No. 62/011,629, filed Jun. 13, 2014; and No. 62/031,645, filed Jul. 31, 2014. U.S. patent application Ser. No. 14/450,199, filed Aug. 1, 2014, is a Continuation-in-Part of U.S. patent application Ser. No. 14/298,829, filed Jun. 6, 2014, which claims priority to U.S. Provisional Patent Application No. 61/831,666, filed Jun. 6, 2013; No. 61/860,932, filed Aug. 1, 2013; No. 61/909,028, filed Nov. 26, 2013; No. 61/938,884, filed Feb. 12, 2014; No. 61/951,844, filed Mar. 12, 2014; No. 61/949,581, filed Mar. 7, 2014; No. 61/982,946, filed Apr. 23, 2014; No. 61/982,952, filed Apr. 23, 2014; No. 61/982,971, filed Apr. 23, 2014; and No. 62/008,192, filed Jun. 5, 2014. U.S. patent application Ser. No. 14/450,199, filed Aug. 1, 2014, is a Continuation-in-Part of U.S. patent application Ser. No. 14/298,830, filed Jun. 6, 2014, which claims priority to U.S. Provisional Patent Application No. 61/831,666, filed Jun. 6, 2013; No. 61/860,932, filed Aug. 1, 2013; No. 61/909,028, filed Nov. 26, 2013; No. 61/938,884, filed Feb. 12, 2014; No. 61/951,844, filed Mar. 12, 2014; No. 61/949,581, filed Mar. 7, 2014; No. 61/982,946, filed Apr. 23, 2014; No. 61/982,952, filed Apr. 23, 2014; No. 61/982,971, filed Apr. 23, 2014; and No. 62/008,192, filed Jun. 5, 2014. U.S. patent application Ser. No. 14/450,199, filed Aug. 1, 2014, is a Continuation-in-Part of U.S. patent application Ser. No. 14/298,834, filed Jun. 6, 2014, which claims priority to U.S. Provisional Patent Application No. 61/831,666, filed Jun. 6, 2013; No. 61/860,932, filed Aug. 1, 2013; No. 61/909,028, filed Nov. 26, 2013; No. 61/938,884, filed Feb. 12, 2014; No. 61/951,844, filed Mar. 12, 2014; No. 61/949,581, filed Mar. 7, 2014; No. 61/982,946, filed Apr. 23, 2014; No. 61/982,952, filed Apr. 23, 2014; No. 61/982,971, filed Apr. 23, 2014; and No. 62/008,192, filed Jun. 5, 2014. U.S. patent application Ser. No. 14/450,199, filed Aug. 1, 2014, is a Continuation-in-Part of U.S. patent application Ser. No. 14/298,872, filed Jun. 6, 2014, which claims priority to U.S. Provisional Patent Application No. 61/831,666, filed Jun. 6, 2013; No. 61/860,932, filed Aug. 1, 2013; No. 61/909,028, filed Nov. 26, 2013; No. 61/938,884, filed Feb. 12, 2014; No. 61/951,844, filed Mar. 12, 2014; No. 61/949,581, filed Mar. 7, 2014; No. 61/982,946, filed Apr. 23, 2014; No. 61/982,952, filed Apr. 23, 2014; No. 61/982,971, filed Apr. 23, 2014; and No. 62/008,192, filed Jun. 5, 2014. U.S. patent application Ser. No. 14/450,199, filed Aug. 1, 2014, is a Continuation-in-Part of U.S. patent application Ser. No. 14/298,863, filed Jun. 6, 2014, which claims priority to U.S. Provisional Patent Application No. 61/831,666, filed Jun. 6, 2013; No. 61/860,932, filed Aug. 1, 2013; No. 61/909,028, filed Nov. 26, 2013; No. 61/938,884, filed Feb. 12, 2014; No. 61/951,844, filed Mar. 12, 2014; No. 61/949,581, filed Mar. 7, 2014; No. 61/982,946, filed Apr. 23, 2014; No. 61/982,952, filed Apr. 23, 2014; No. 61/982,971, filed Apr. 23, 2014; and No. 62/008,192, filed Jun. 5, 2014. U.S. patent application Ser. No. 14/450,199, filed Aug. 1, 2014, is a Continuation-in-Part of U.S. patent application Ser. No. 14/298,852, filed Jun. 6, 2014, which claims priority to U.S. Provisional Patent Application No. 61/831,666, filed Jun. 6, 2013; No. 61/860,932, filed Aug. 1, 2013; No. 61/909,028, filed Nov. 26, 2013; No. 61/938,884, filed Feb. 12, 2014; No. 61/951,844, filed Mar. 12, 2014; No. 61/949,581, filed Mar. 7, 2014; No. 61/982,946, filed Apr. 23, 2014; No. 61/982,952, filed Apr. 23, 2014; No. 61/982,971, filed Apr. 23, 2014; and No. 62/008,192, filed Jun. 5, 2014.

The present application claims the benefit of and is a Continuation-in-Part of U.S. patent application Ser. No. 14/450,204, filed Aug. 1, 2014, entitled "WEAKLY COUPLED TUNABLE RF TRANSMITTER ARCHITECTURE," which claims priority to U.S. Provisional Patent Application No. 61/860,932, filed Aug. 1, 2013; No. 61/909,028, filed Nov. 26, 2013; No. 61/938,884, filed Feb. 12, 2014; No. 61/949,581, filed Mar. 7, 2014; No. 61/951,844, filed Mar. 12, 2014; No. 61/982,946, filed Apr. 23, 2014; No. 61/982,952, filed Apr. 23, 2014; No. 61/982,971, filed Apr. 23, 2014; No. 62/008,192, filed Jun. 5, 2014; No. 62/011,629, filed Jun. 13, 2014; and No. 62/031,645, filed Jul. 31, 2014. U.S. patent application Ser. No. 14/450,204, filed Aug. 1, 2014, is a Continuation-in-Part of U.S. patent application Ser. No. 14/298,829, filed Jun. 6, 2014, which claims priority to U.S. Provisional Patent Application No. 61/831,666, filed Jun. 6, 2013; No. 61/860,932, filed Aug. 1, 2013; No. 61/909,028, filed Nov. 26, 2013; No. 61/938,884, filed Feb. 12, 2014; No. 61/951,844, filed Mar. 12, 2014; No. 61/949,581, filed Mar. 7, 2014; No. 61/982,946, filed Apr. 23, 2014; No. 61/982,952, filed Apr. 23, 2014; No. 61/982,971, filed Apr. 23, 2014; and No. 62/008,192, filed Jun. 5, 2014. U.S. patent application Ser. No. 14/450,204, filed Aug. 1, 2014, is a Continuation-in-Part of U.S. patent application Ser. No. 14/298,830, filed Jun. 6, 2014, which claims priority to U.S. Provisional Patent Application No. 61/831,666, filed Jun. 6, 2013; No. 61/860,932, filed Aug. 1, 2013; No. 61/909,028, filed Nov. 26, 2013; No. 61/938,884, filed Feb. 12, 2014; No. 61/951,844, filed Mar. 12, 2014; No. 61/949,581, filed Mar. 7, 2014; No. 61/982,946, filed Apr. 23, 2014; No. 61/982,952, filed Apr. 23, 2014; No. 61/982,971, filed Apr. 23, 2014; and No. 62/008,192, filed Jun. 5, 2014. U.S. patent application Ser. No. 14/450,204, filed Aug. 1, 2014, is a Continuation-in-Part of U.S. patent application Ser. No. 14/298,834, filed Jun. 6, 2014, which claims priority to U.S. Provisional Patent Application No. 61/831,666, filed Jun. 6, 2013; No. 61/860,932, filed Aug. 1, 2013; No. 61/909,028, filed Nov. 26, 2013; No. 61/938,884, filed Feb. 12, 2014; No. 61/951,844, filed Mar. 12, 2014; No. 61/949,581, filed Mar. 7, 2014; No. 61/982,946, filed Apr. 23, 2014; No. 61/982,952, filed Apr. 23, 2014; No. 61/982,971, filed Apr. 23, 2014; and No. 62/008,192, filed Jun. 5, 2014. U.S. patent application Ser. No. 14/450,204, filed Aug. 1, 2014, is a Continuation-in-Part of U.S. patent application Ser. No. 14/298,872, filed Jun. 6, 2014, which claims priority to U.S. Provisional Patent Application No. 61/831,666, filed Jun. 6, 2013; No. 61/860,932, filed Aug. 1, 2013; No. 61/909,028, filed Nov. 26, 2013; No. 61/938,884, filed Feb. 12, 2014; No. 61/951,844, filed Mar. 12, 2014; No. 61/949,581, filed Mar. 7, 2014; No. 61/982,946, filed Apr. 23, 2014; No. 61/982,952, filed Apr. 23, 2014; No. 61/982,971, filed Apr. 23, 2014; and No. 62/008,192, filed Jun. 5, 2014. U.S. patent application Ser. No. 14/450,204, filed Aug. 1, 2014, is a Continuation-in-Part of U.S. patent application Ser. No. 14/298,863, filed Jun. 6, 2014, which claims priority to U.S. Provisional Patent Application No. 61/831,666, filed Jun. 6, 2013; No. 61/860,932, filed Aug. 1, 2013; No. 61/909,028, filed Nov. 26, 2013; No. 61/938,884, filed Feb. 12, 2014; No. 61/951,844, filed Mar. 12, 2014; No. 61/949,581, filed Mar. 7, 2014; No. 61/982,946, filed Apr. 23, 2014; No. 61/982,952, filed Apr. 23, 2014; No. 61/982,971, filed Apr. 23, 2014; and No. 62/008,192, filed Jun. 5, 2014. U.S. patent application Ser. No. 14/450,204, filed Aug. 1, 2014, is a Continuation-in-Part of U.S. patent application Ser. No. 14/298,852, filed Jun. 6, 2014, which claims priority to U.S. Provisional Patent Application No. 61/831,666, filed Jun. 6, 2013; No. 61/860,932, filed Aug. 1, 2013; No. 61/909,028, filed Nov. 26, 2013; No. 61/938,884, filed Feb. 12, 2014; No. 61/951,844, filed Mar. 12, 2014; No. 61/949,581, filed Mar. 7, 2014; No. 61/982,946, filed Apr. 23, 2014; No. 61/982,952, filed Apr. 23, 2014; No. 61/982,971, filed Apr. 23, 2014; and No. 62/008,192, filed Jun. 5, 2014.

The present application claims the benefit of and is a Continuation-in-Part of U.S. patent application Ser. No. 14/450,200, filed Aug. 1, 2014, now U.S. Pat. No. 9,685,928, entitled "INTERFERENCE REJECTION RF FILTERS," which claims priority to U.S. Provisional Patent Application No. 61/860,932, filed Aug. 1, 2013; No. 61/909,028, filed Nov. 26, 2013; No. 61/938,884, filed Feb. 12, 2014; No. 61/949,581, filed Mar. 7, 2014; No. 61/951,844, filed Mar. 12, 2014; No. 61/982,946, filed Apr. 23, 2014; No. 61/982,952, filed Apr. 23, 2014; No. 61/982,971, filed Apr. 23, 2014; No. 62/008,192, filed Jun. 5, 2014; No. 62/011,629, filed Jun. 13, 2014; and No. 62/031,645, filed Jul. 31, 2014. U.S. patent application Ser. No. 14/450,200, filed Aug. 1, 2014, is a Continuation-in-Part of U.S. patent application Ser. No. 14/298,829, filed Jun. 6, 2014, which claims priority to U.S. Provisional Patent Application No. 61/831,666, filed Jun. 6, 2013; No. 61/860,932, filed Aug. 1, 2013; No. 61/909,028, filed Nov. 26, 2013; No. 61/938,884, filed Feb. 12, 2014; No. 61/951,844, filed Mar. 12, 2014; No. 61/949,581, filed Mar. 7, 2014; No. 61/982,946, filed Apr. 23, 2014; No. 61/982,952, filed Apr. 23, 2014; No. 61/982,971, filed Apr. 23, 2014; and No. 62/008,192, filed Jun. 5, 2014. U.S. patent application Ser. No. 14/450,200, filed Aug. 1, 2014, is a Continuation-in-Part of U.S. patent application Ser. No. 14/298,830, filed Jun. 6, 2014, which claims priority to U.S. Provisional Patent Application No. 61/831,666, filed Jun. 6, 2013; No. 61/860,932, filed Aug. 1, 2013; No. 61/909,028, filed Nov. 26, 2013; No. 61/938,884, filed Feb. 12, 2014; No. 61/951,844, filed Mar. 12, 2014; No. 61/949,581, filed Mar. 7, 2014; No. 61/982,946, filed Apr. 23, 2014; No. 61/982,952, filed Apr. 23, 2014; No. 61/982,971, filed Apr. 23, 2014; and No. 62/008,192, filed Jun. 5, 2014. U.S. patent application Ser. No. 14/450,200, filed Aug. 1, 2014, is a Continuation-in-Part of U.S. patent application Ser. No. 14/298,834, filed Jun. 6, 2014, which claims priority to U.S. Provisional Patent Application No. 61/831,666, filed Jun. 6, 2013; No. 61/860,932, filed Aug. 1, 2013; No. 61/909,028, filed Nov. 26, 2013; No. 61/938,884, filed Feb. 12, 2014; No. 61/951,844, filed Mar. 12, 2014; No. 61/949,581, filed Mar. 7, 2014; No. 61/982,946, filed Apr. 23, 2014; No. 61/982,952, filed Apr. 23, 2014; No. 61/982,971, filed Apr. 23, 2014; and No. 62/008,192, filed Jun. 5, 2014. U.S. patent application Ser. No. 14/450,200, filed Aug. 1, 2014, is a Continuation-in-Part of U.S. patent application Ser. No. 14/298,872, filed Jun. 6, 2014, which claims priority to U.S. Provisional Patent Application No. 61/831,666, filed Jun. 6, 2013; No. 61/860,932, filed Aug. 1, 2013; No. 61/909,028, filed Nov. 26, 2013; No. 61/938,884, filed Feb. 12, 2014; No. 61/951,844, filed Mar. 12, 2014; No. 61/949,581, filed Mar. 7, 2014; No. 61/982,946, filed Apr. 23, 2014; No. 61/982,952, filed Apr. 23, 2014; No. 61/982,971, filed Apr. 23, 2014; and No. 62/008,192, filed Jun. 5, 2014. U.S. patent application Ser. No. 14/450,200, filed Aug. 1, 2014, is a Continuation-in-Part of U.S. patent application Ser. No. 14/298,863, filed Jun. 6, 2014, which claims priority to U.S. Provisional Patent Application No. 61/831,666, filed Jun. 6, 2013; No. 61/860,932, filed Aug. 1, 2013; No. 61/909,028, filed Nov. 26, 2013; No. 61/938,884, filed Feb. 12, 2014; No. 61/951,844, filed Mar. 12, 2014; No. 61/949,581, filed Mar. 7, 2014; No. 61/982,946, filed Apr. 23, 2014; No. 61/982,952, filed Apr. 23, 2014; No. 61/982,971, filed Apr. 23, 2014; and No. 62/008,192, filed Jun. 5, 2014. U.S. patent application Ser. No. 14/450,200, filed Aug. 1, 2014, is a Continuation-in-Part of U.S. patent application Ser. No. 14/298,852, filed Jun. 6, 2014, which claims priority to U.S. Provisional Patent Application No. 61/831,666, filed Jun. 6, 2013; No. 61/860,932, filed Aug. 1, 2013; No. 61/909,028, filed Nov. 26, 2013; No. 61/938,884, filed Feb. 12, 2014; No. 61/951,844, filed Mar. 12, 2014; No. 61/949,581, filed Mar. 7, 2014; No. 61/982,946, filed Apr. 23, 2014; No. 61/982,952, filed Apr. 23, 2014; No. 61/982,971, filed Apr. 23, 2014; and No. 62/008,192, filed Jun. 5, 2014.

The present application claims the benefit of and is a Continuation-in-Part of U.S. patent application Ser. No. 14/449,594, filed Aug. 1, 2014, now U.S. Pat. No. 9,048,836, entitled "BODY BIAS SWITCHING FOR AN RF SWITCH," which claims priority to U.S. Provisional Patent Application No. 61/860,932, filed Aug. 1, 2013; No. 61/909,028, filed Nov. 26, 2013; No. 61/938,884, filed Feb. 12, 2014; No. 61/949,581, filed Mar. 7, 2014; No. 61/951,844, filed Mar. 12, 2014; No. 61/982,946, filed Apr. 23, 2014; No. 61/982,952, filed Apr. 23, 2014; No. 61/982,971, filed Apr. 23, 2014; No. 62/008,192, filed Jun. 5, 2014; No. 62/011,629, filed Jun. 13, 2014; and No. 62/031,645, filed Jul. 31, 2014. U.S. patent application Ser. No. 14/449,594, filed Aug. 1, 2014, is a Continuation-in-Part of U.S. patent application Ser. No. 14/298,829, filed Jun. 6, 2014, which claims priority to U.S. Provisional Patent Application No. 61/831,666, filed Jun. 6, 2013; No. 61/860,932, filed Aug. 1, 2013; No. 61/909,028, filed Nov. 26, 2013; No. 61/938,884, filed Feb. 12, 2014; No. 61/951,844, filed Mar. 12, 2014; No. 61/949,581, filed Mar. 7, 2014; No. 61/982,946, filed Apr. 23, 2014; No. 61/982,952, filed Apr. 23, 2014; No. 61/982,971, filed Apr. 23, 2014; and No. 62/008,192, filed Jun. 5, 2014. U.S. patent application Ser. No. 14/449,594, filed Aug. 1, 2014, is a Continuation-in-Part of U.S. patent application Ser. No. 14/298,830, filed Jun. 6, 2014, which claims priority to U.S. Provisional Patent Application No. 61/831,666, filed Jun. 6, 2013; No. 61/860,932, filed Aug. 1, 2013; No. 61/909,028, filed Nov. 26, 2013; No. 61/938,884, filed Feb. 12, 2014; No. 61/951,844, filed Mar. 12, 2014; No. 61/949,581, filed Mar. 7, 2014; No. 61/982,946, filed Apr. 23, 2014; No. 61/982,952, filed Apr. 23, 2014; No. 61/982,971, filed Apr. 23, 2014; and No. 62/008,192, filed Jun. 5, 2014. U.S. patent application Ser. No. 14/449,594, filed Aug. 1, 2014, is a Continuation-in-Part of U.S. patent application Ser. No. 14/298,834, filed Jun. 6, 2014, which claims priority to U.S. Provisional Patent Application No. 61/831,666, filed Jun. 6, 2013; No. 61/860,932, filed Aug. 1, 2013; No. 61/909,028, filed Nov. 26, 2013; No. 61/938,884, filed Feb. 12, 2014; No. 61/951,844, filed Mar. 12, 2014; No. 61/949,581, filed Mar. 7, 2014; No. 61/982,946, filed Apr. 23, 2014; No. 61/982,952, filed Apr. 23, 2014; No. 61/982,971, filed Apr. 23, 2014; and No. 62/008,192, filed Jun. 5, 2014. U.S. patent application Ser. No. 14/449,594, filed Aug. 1, 2014, is a Continuation-in-Part of U.S. patent application Ser. No. 14/298,872, filed Jun. 6, 2014, which claims priority to U.S. Provisional Patent Application No. 61/831,666, filed Jun. 6, 2013; No. 61/860,932, filed Aug. 1, 2013; No. 61/909,028, filed Nov. 26, 2013; No. 61/938,884, filed Feb. 12, 2014; No. 61/951,844, filed Mar. 12, 2014; No. 61/949,581, filed Mar. 7, 2014; No. 61/982,946, filed Apr. 23, 2014; No. 61/982,952, filed Apr. 23, 2014; No. 61/982,971, filed Apr. 23, 2014; and No. 62/008,192, filed Jun. 5, 2014. U.S. patent application Ser. No. 14/449,594, filed Aug. 1, 2014, is a Continuation-in-Part of U.S. patent application Ser. No. 14/298,863, filed Jun. 6, 2014, which claims priority to U.S. Provisional Patent Application No. 61/831,666, filed Jun. 6, 2013; No. 61/860,932, filed Aug. 1, 2013; No. 61/909,028, filed Nov. 26, 2013; No. 61/938,884, filed Feb. 12, 2014; No. 61/951,844, filed Mar. 12, 2014; No. 61/949,581, filed Mar. 7, 2014; No. 61/982,946, filed Apr. 23, 2014; No. 61/982,952, filed Apr. 23, 2014; No. 61/982,971, filed Apr. 23, 2014; and No. 62/008,192, filed Jun. 5, 2014. U.S. patent application Ser. No. 14/449,594, filed Aug. 1, 2014, is a Continuation-in-Part of U.S. patent application Ser. No. 14/298,852, filed Jun. 6, 2014, which claims priority to U.S. Provisional Patent Application No. 61/831,666, filed Jun. 6, 2013; No. 61/860,932, filed Aug. 1, 2013; No. 61/909,028, filed Nov. 26, 2013; No. 61/938,884, filed Feb. 12, 2014; No. 61/951,844, filed Mar. 12, 2014; No. 61/949,581, filed Mar. 7, 2014; No. 61/982,946, filed Apr. 23, 2014; No. 61/982,952, filed Apr. 23, 2014; No. 61/982,971, filed Apr. 23, 2014; and No. 62/008,192, filed Jun. 5, 2014.

The present application is related to concurrently filed U.S. patent application Ser. No. 14/554,943, entitled "MULTI-BAND IMPEDANCE TUNERS USING WEAKLY-COUPLED LC RESONATORS;" concurrently filed U.S. patent application Ser. No. 14/555,053, now U.S. Pat. No. 9,444,417, entitled "WEAKLY COUPLED RF NETWORK BASED POWER AMPLIFIER ARCHITECTURE;" concurrently filed U.S. patent application Ser. No. 14/555,557, entitled "HYBRID ACTIVE AND PASSIVE TUNABLE RF FILTERS;" and concurrently filed U.S. patent application Ser. No. 14/555,371, entitled "FILTERING CHARACTERISTIC ADJUSTMENTS OF WEAKLY COUPLED TUNABLE RF FILTERS."

All of the applications listed above are hereby incorporated herein by reference in their entireties.

FIELD OF THE DISCLOSURE

Embodiments of the present disclosure relate to radio frequency (RF) front-end circuitry utilized to provide antenna diversity and/or beam forming along with methods of operating the same.

BACKGROUND

As wireless communications technologies evolve, wireless communications systems become increasingly sophisticated. As such, wireless communications protocols continue to expand and change to take advantage of the technological evolution. As a result, to maximize flexibility, many wireless communications devices must be capable of supporting any number of wireless communications protocols, each of which may have certain performance requirements, such as specific out-of-band emissions requirements, linearity requirements, or the like. Further, portable wireless communications devices are typically battery powered and need to be relatively small, and have low cost. As such, to minimize size, cost, and power consumption, RF circuitry in such a device needs to be as simple, small, flexible, and efficient as is practical. Thus, there is a need for RF circuitry in a communications device that is low cost, small, simple, flexible, and efficient.

SUMMARY

Radio frequency (RF) front-end circuitry and related methods of operating the same are disclosed. In one embodiment, the RF front-end circuitry includes control circuitry and an RF filter structure that includes a plurality of resonators. Multiple tunable RF filter paths may be defined by the plurality of resonators. For example, in one embodiment, a first tunable RF filter path is defined by a first set of the plurality of resonators such that the first tunable RF filter path has a first amplitude and a first phase. A second tunable RF filter path is defined by a second set of the plurality of resonators such that the second tunable RF filter path has a second amplitude and a second phase. The control circuitry is configured to set a first amplitude difference between the first amplitude and the second amplitude to approximately a first target amplitude difference and set a first phase difference between the first phase and the second phase to approximately a first target phase difference. By setting the amplitude differences and phase differences between the different tunable RF filter paths, the RF filter structure can be utilized to provide antenna diversity and/or beam forming.

Those skilled in the art will appreciate the scope of the present disclosure and realize additional aspects thereof after reading the following detailed description of the preferred embodiments in association with the accompanying drawing figures.

BRIEF DESCRIPTION OF THE DRAWING FIGURES

The accompanying drawing figures incorporated in and forming a part of this specification illustrate several aspects of the disclosure, and together with the description serve to explain the principles of the disclosure.

Figure 1:
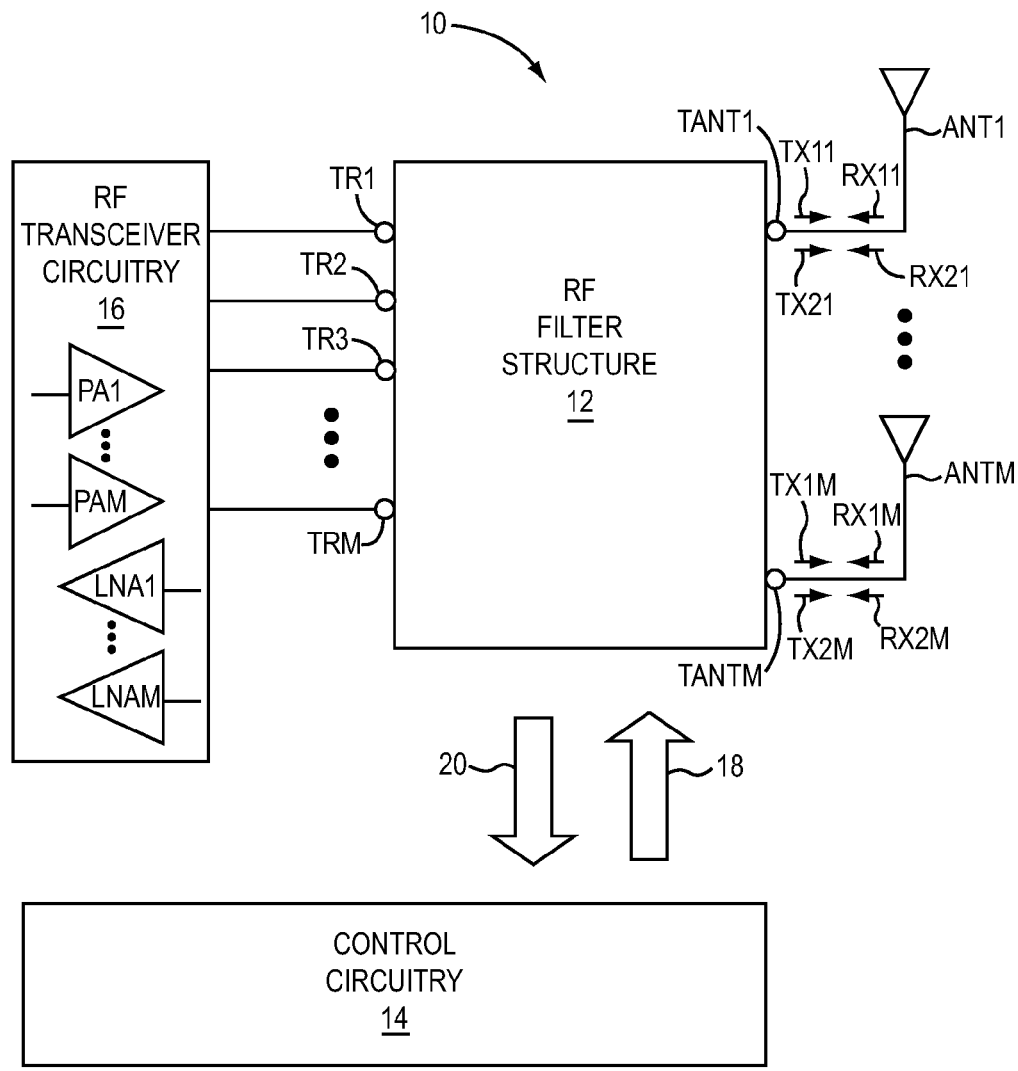
FIG. 1 illustrates one embodiment of radio frequency (RF) front-end circuitry that includes an RF filter structure, and control circuitry is configured to set amplitude differences and phase differences between tunable RF filter paths in the RF filter structure in order to provide antenna diversity and/or beam forming between RF transceiver circuitry and multiple antennas.
Figure 2:
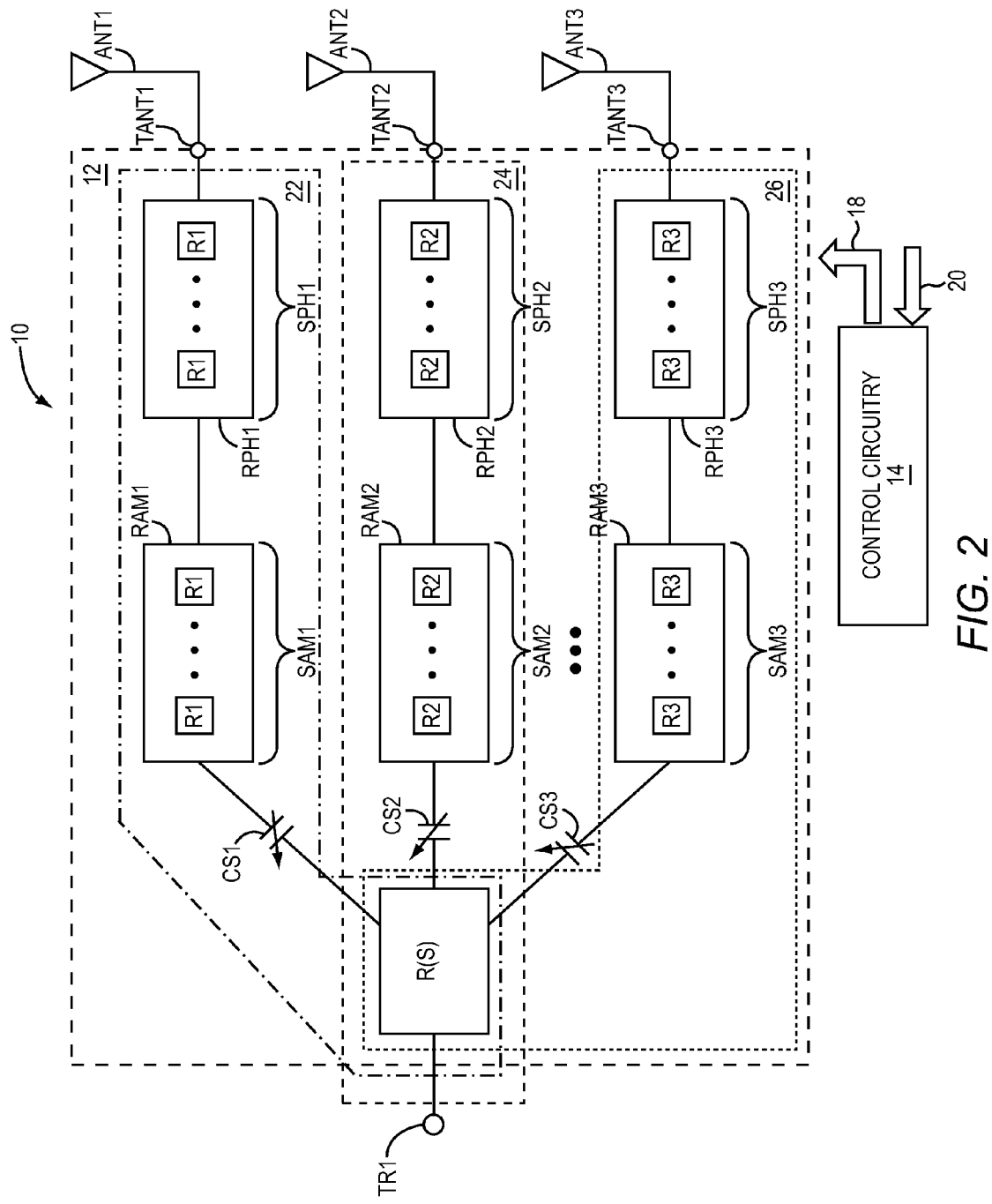

FIG. 2 illustrates one embodiment of the RF front-end circuitry shown in FIG. 1 where the RF filter structure includes multiple tunable RF filter paths, and wherein, for each of the tunable RF filter paths, the control circuitry provides an amplitude adjustment to a subset of the resonators within a segment of the tunable RF filter path and a phase adjustment to another subset of the resonators within another segment of the tunable RF filter path.

Figure 3:
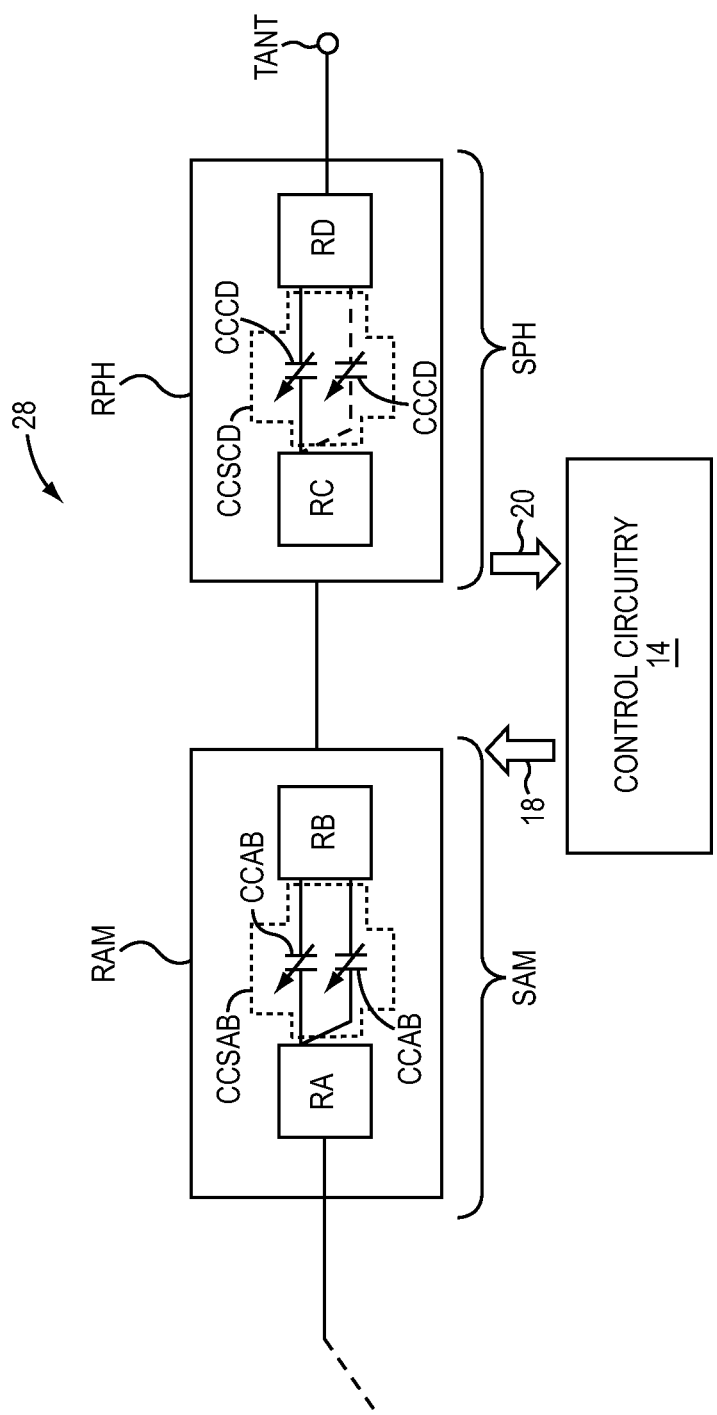

FIG. 3 illustrates an exemplary arrangement of the subsets of resonators within different segments for the tunable RF filter path shown in FIG. 2.

Figure 3A:
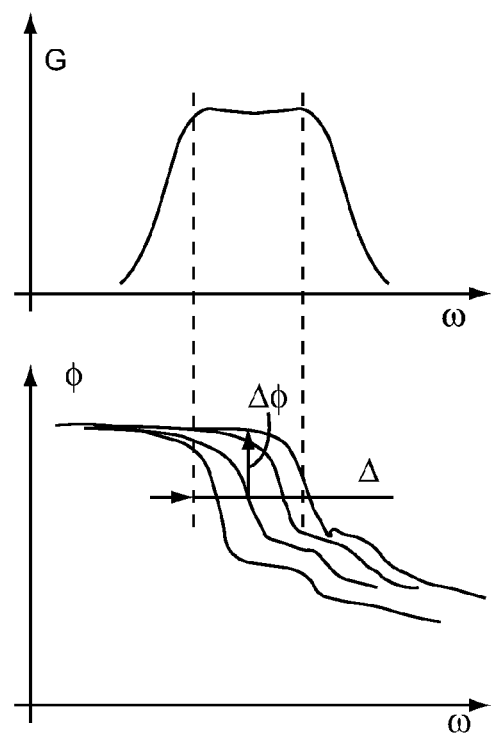

FIG. 3A illustrates an exemplary amplitude response and phase response of the subset of resonators in FIG. 3 that provide phase shifting.

Figure 3B:
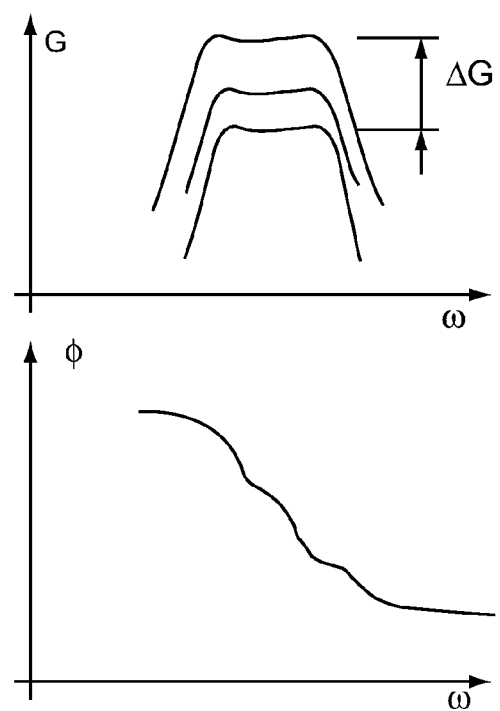

FIG. 3B illustrates an exemplary amplitude response and phase response of the subset of resonators in FIG. 3 that provide amplitude shifting.

Figure 4:
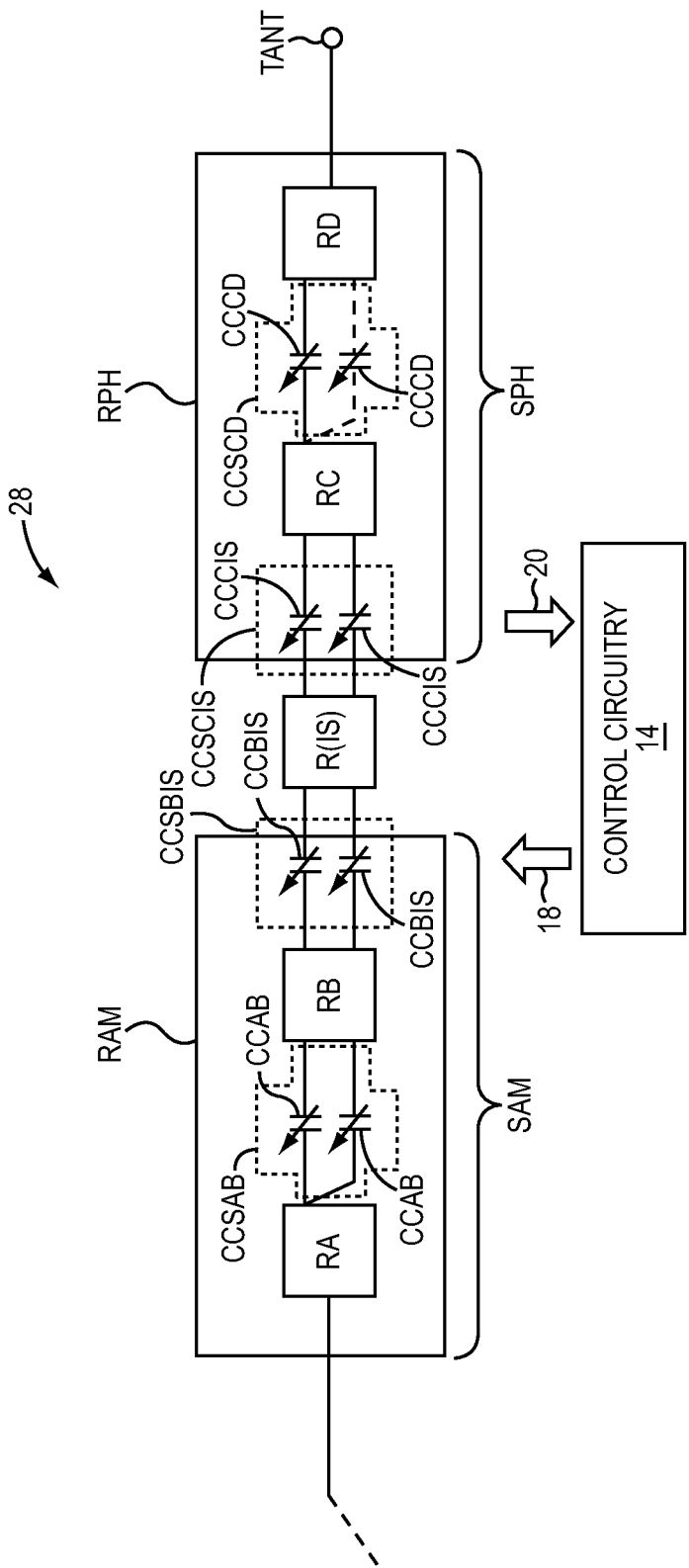

FIG. 4 illustrates another exemplary arrangement of the subsets of resonators within different segments for the tunable RF filter path shown in FIG. 2, where in this embodiment, an isolation resonator is provided between the segments.

Figure 5:
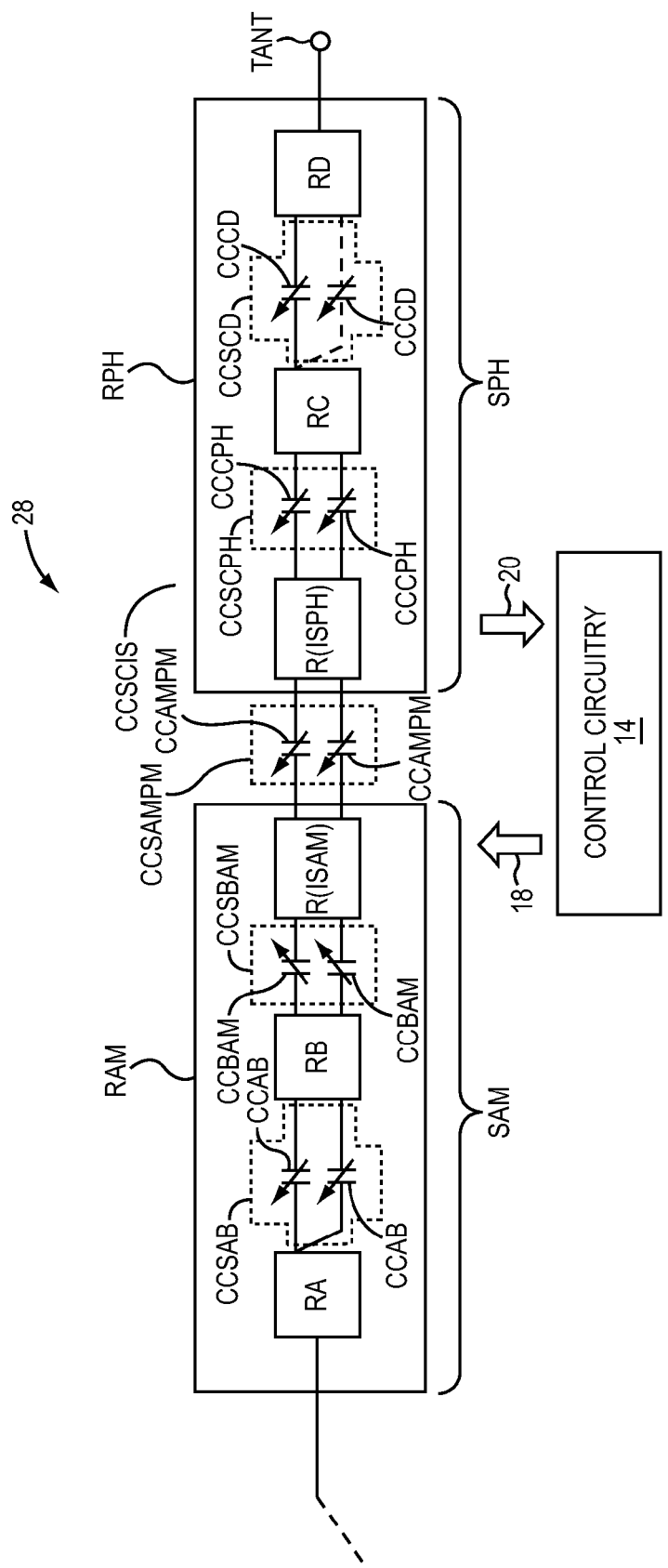

FIG. 5 illustrates another exemplary arrangement of the subsets of resonators within different segments for the tunable RF filter path shown in FIG. 2, where in this embodiment, isolation resonators are provided within the subsets to isolate the segments.

Figure 6:
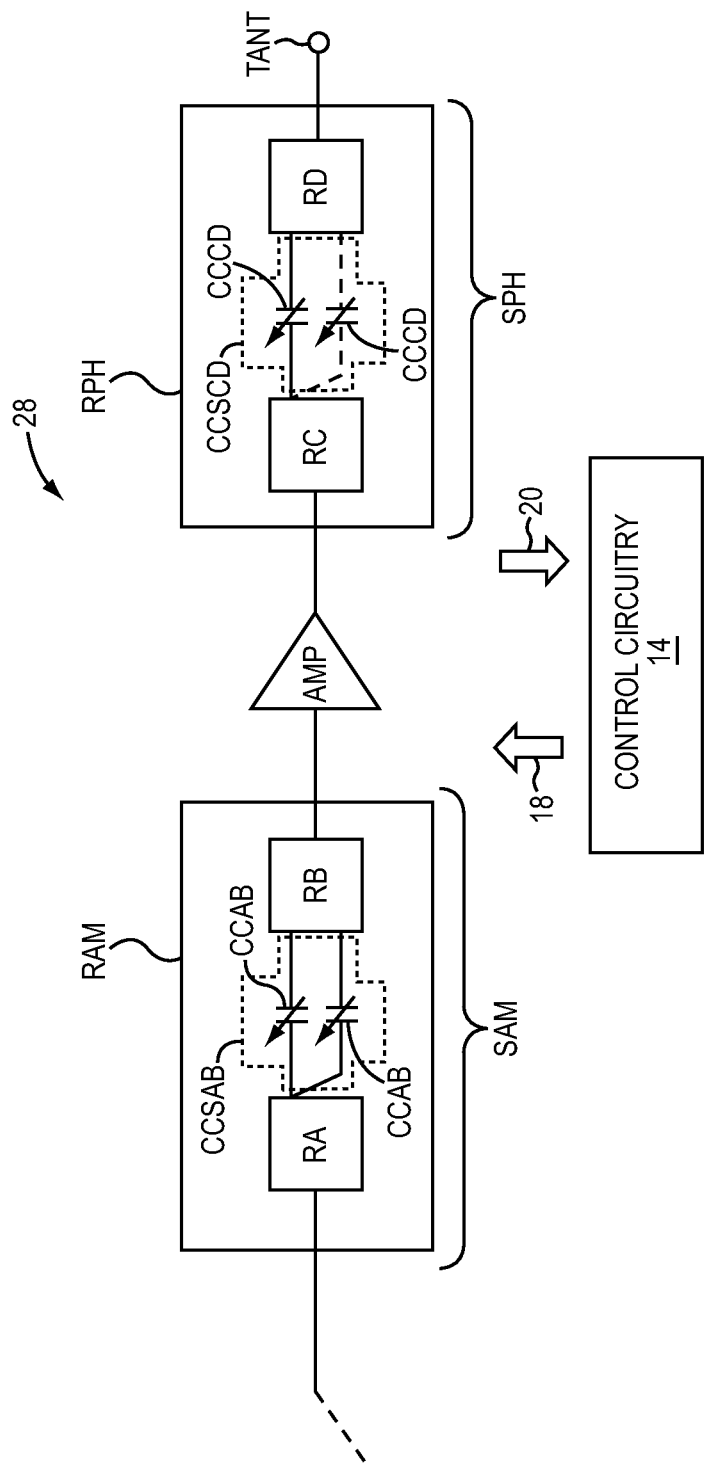

FIG. 6 illustrates another exemplary arrangement of the subsets of resonators within different segments for the tunable RF filter path shown in FIG. 2, where in this embodiment, an amplifier is provided between the segments.

Figure 7:
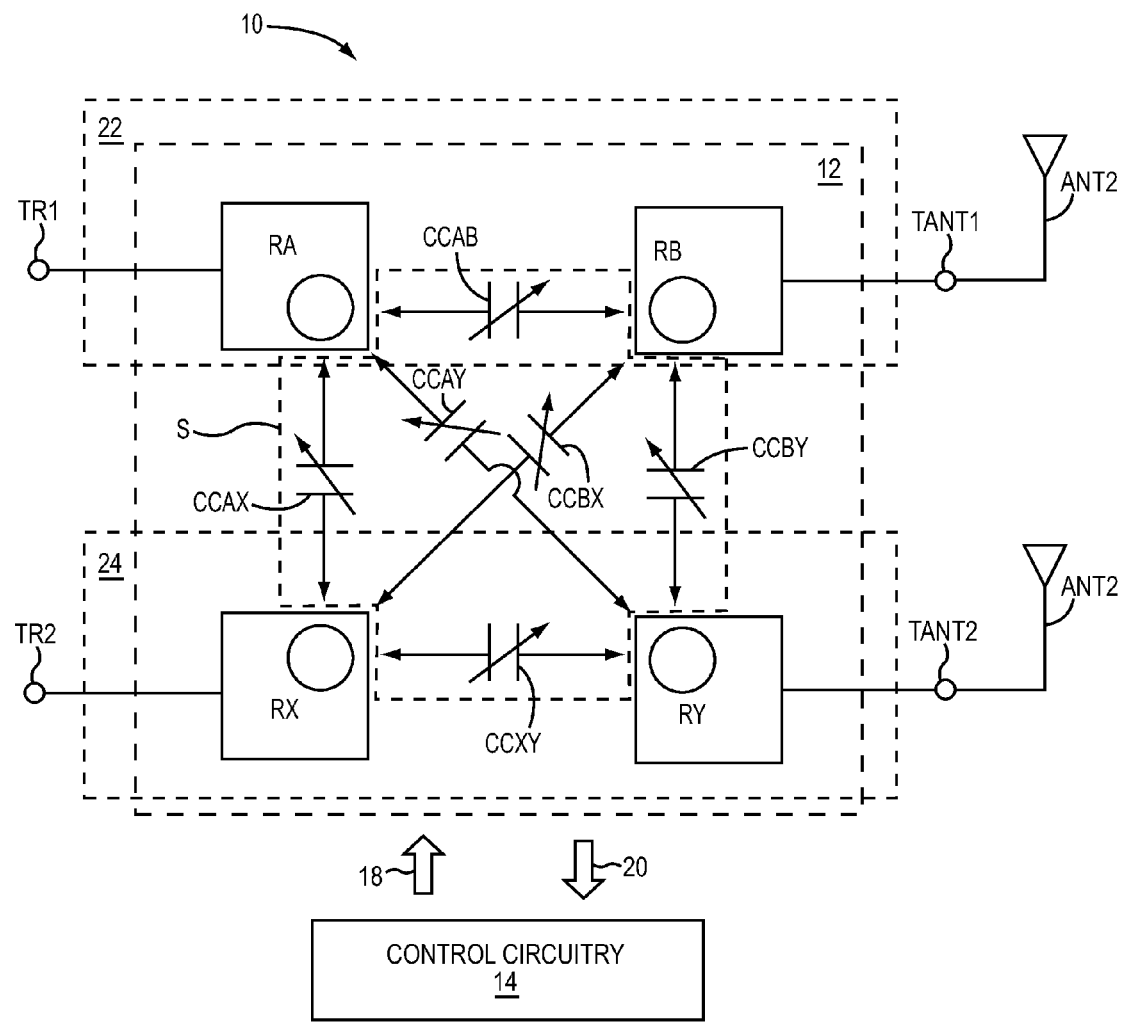

FIG. 7 illustrates another embodiment of the RF front-end circuitry shown in FIG. 1 where the RF filter structure includes multiple tunable RF filter paths, and wherein the control circuitry sets an amplitude of each of the tunable RF filter paths by varying electric coupling coefficients provided by interpath cross-coupling capacitive structures and sets a phase of each of the tunable RF filter paths by varying electric coupling coefficients provided by intrapath cross-coupling capacitive structures.

Figure 8:
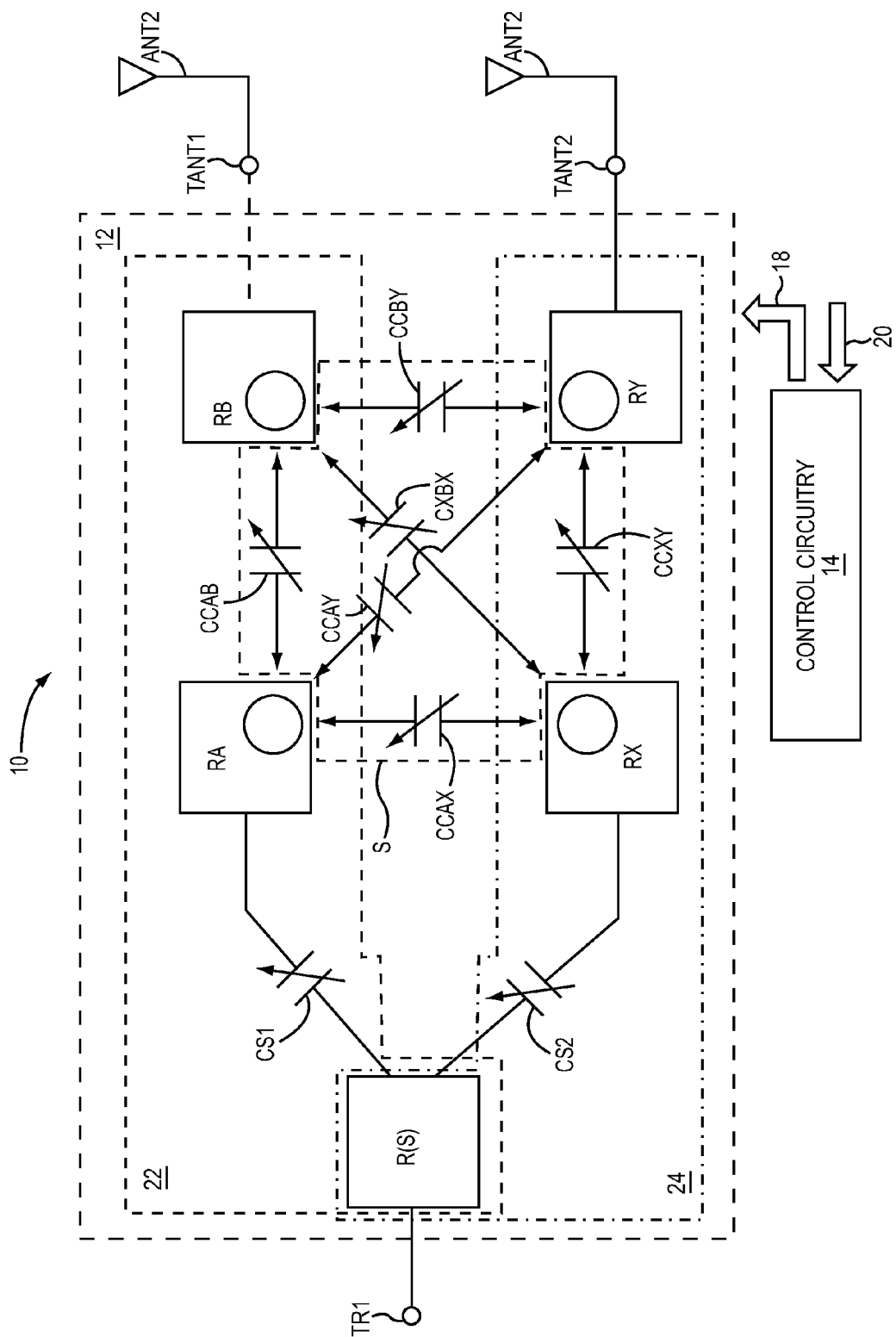

FIG. 8 illustrates yet another embodiment of the RF front-end circuitry shown in FIG. 1 with another embodiment of the RF filter structure that is the same as the RF filter structure shown in FIG. 7 except that the RF filter structure includes a resonator in each of the tunable RF filter paths to provide signal splitting.

Figure 9:
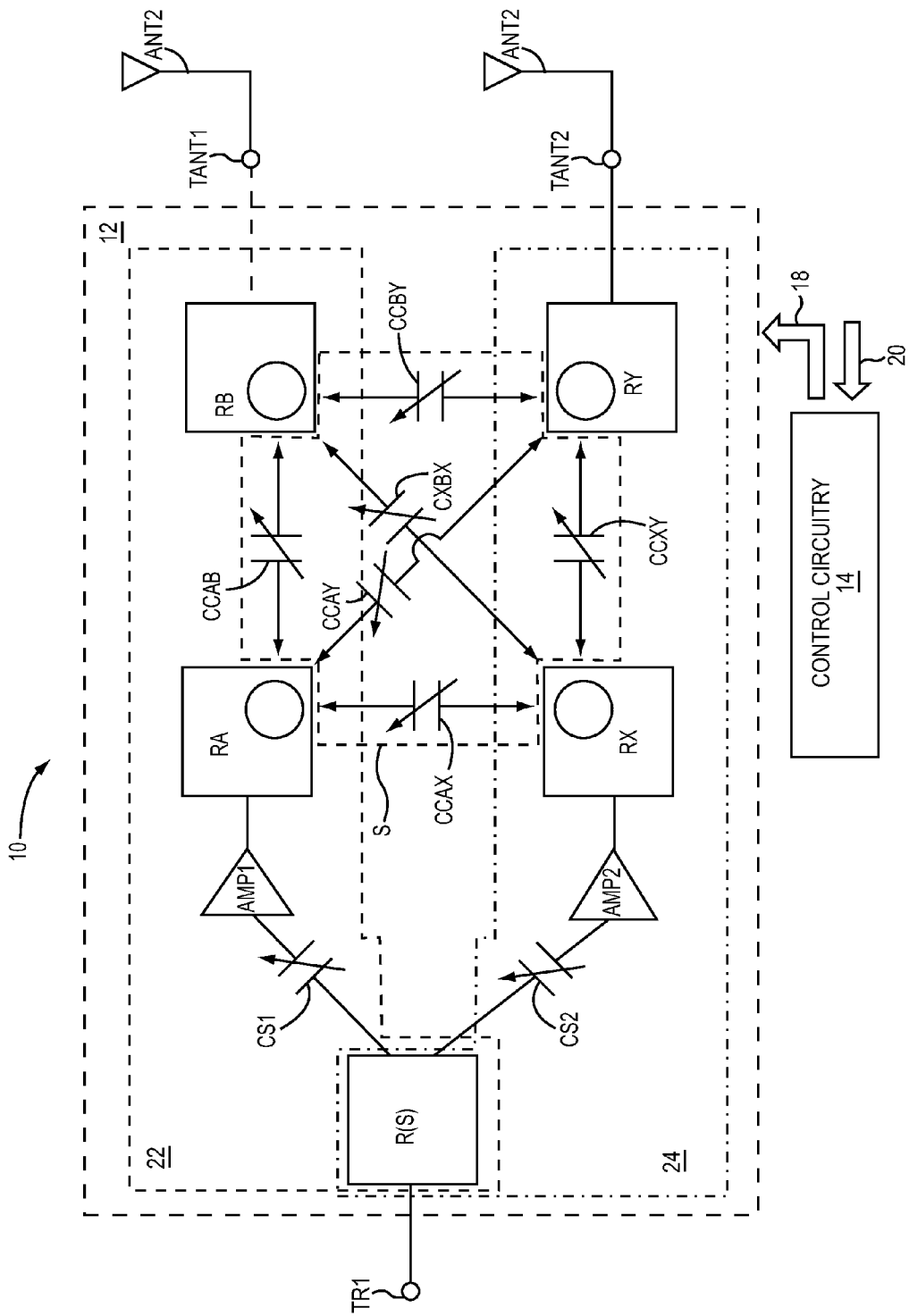

FIG. 9 illustrates yet another embodiment of the RF front-end circuitry shown in FIG. 1 with another embodiment of the RF filter structure that is the same as the RF filter structure shown in FIG. 8 except that each of the tunable RF filter paths includes an amplifier.

Figure 10:
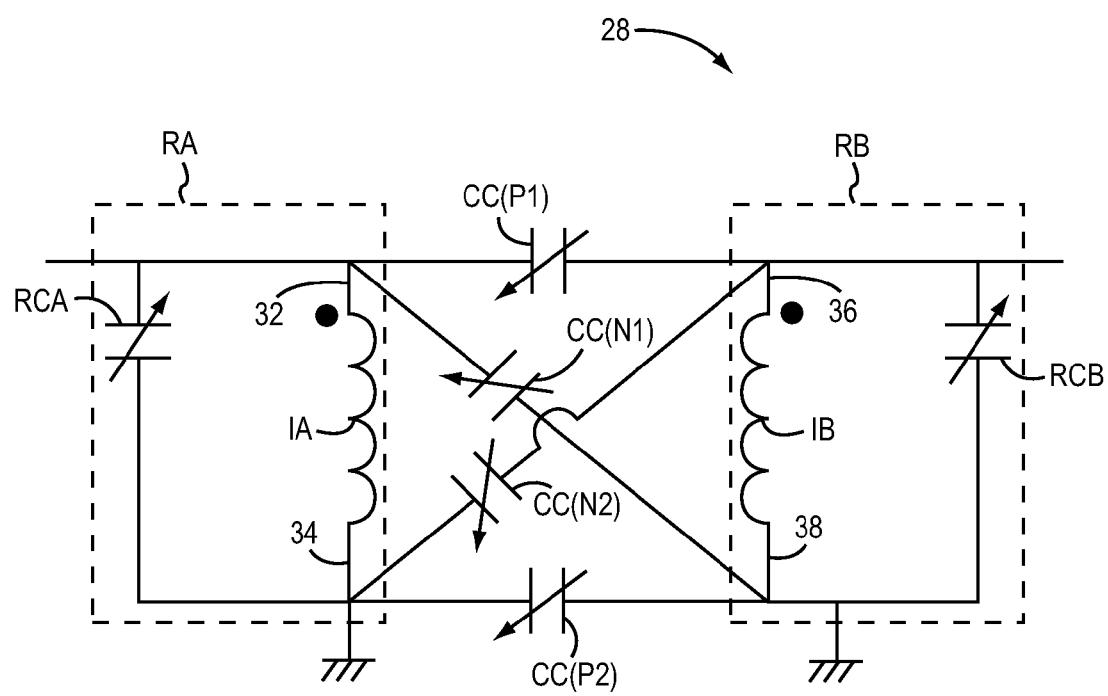

FIG. 10 illustrates an arrangement between two resonators with cross-coupling capacitive structures provided in an X-bridge configuration and such that inductors within the resonators provide positive magnetic coupling coefficients.

Figure 11:
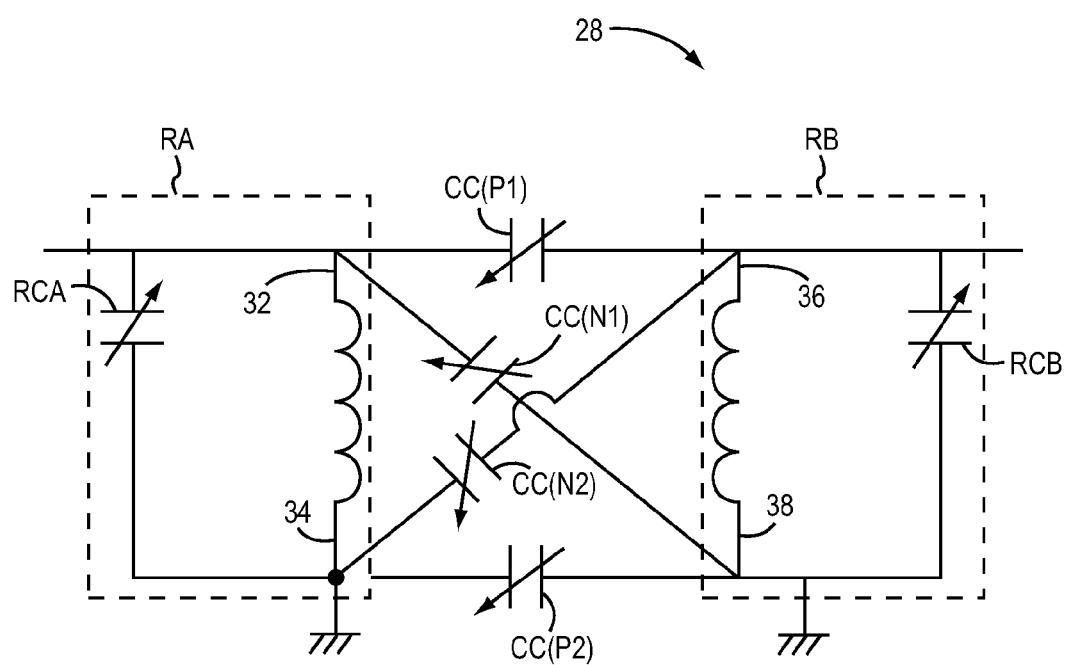

FIG. 11 illustrates an arrangement between two resonators that is the same as the embodiment in FIG. 10 except that the inductors within the resonators are not magnetically coupled.

Figure 12:
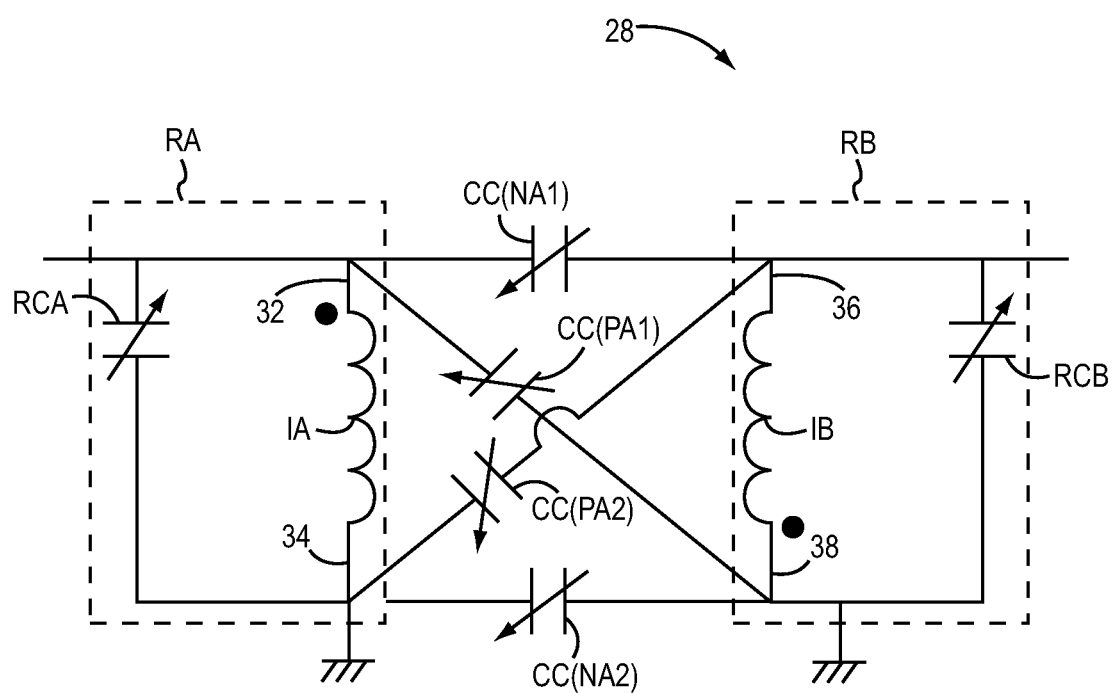

FIG. 12 illustrates an arrangement between two resonators that is similar to the embodiment in FIG. 10 except that the inductors within the resonators provide a negative magnetic coupling coefficient.

Figure 13:
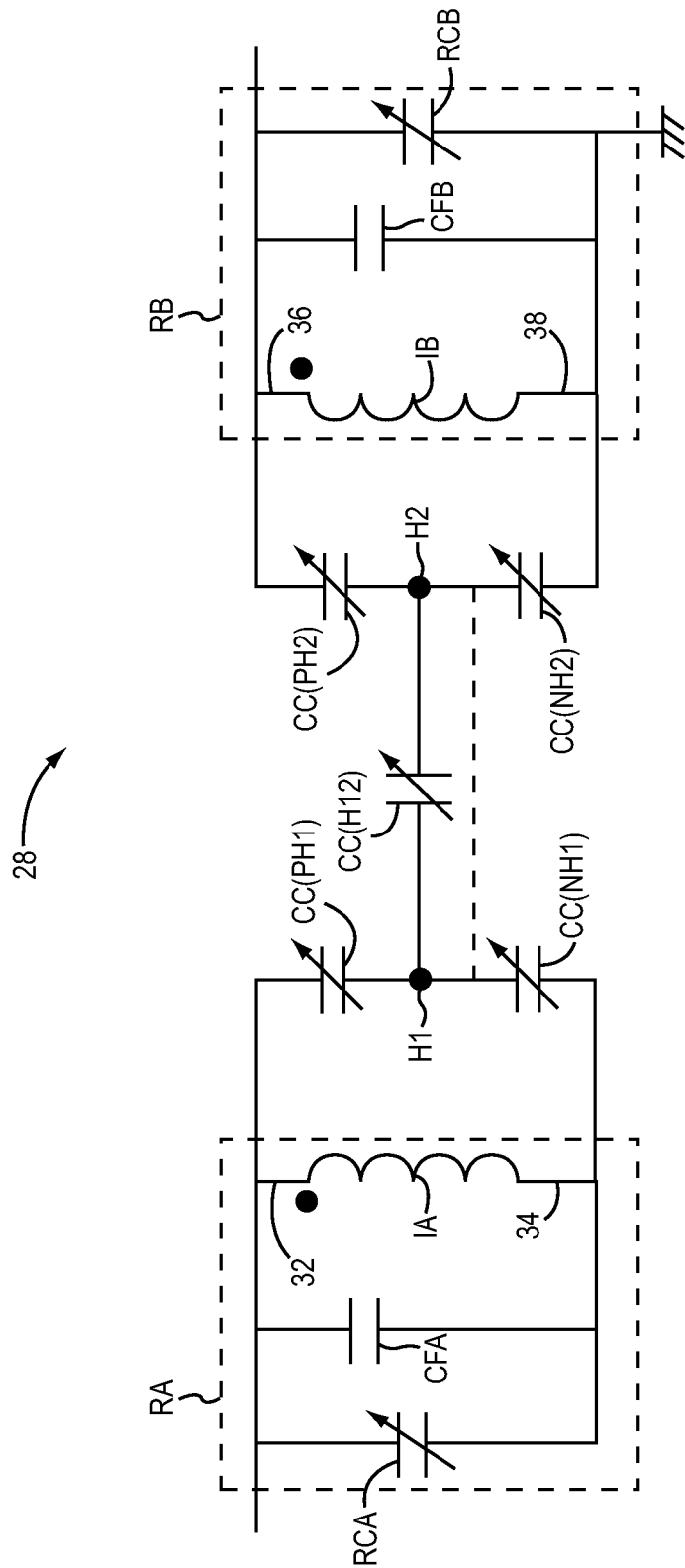

FIG. 13 illustrates an arrangement between the two resonators that includes cross-coupling capacitive structures in an H-bridge configuration.

Figure 14:
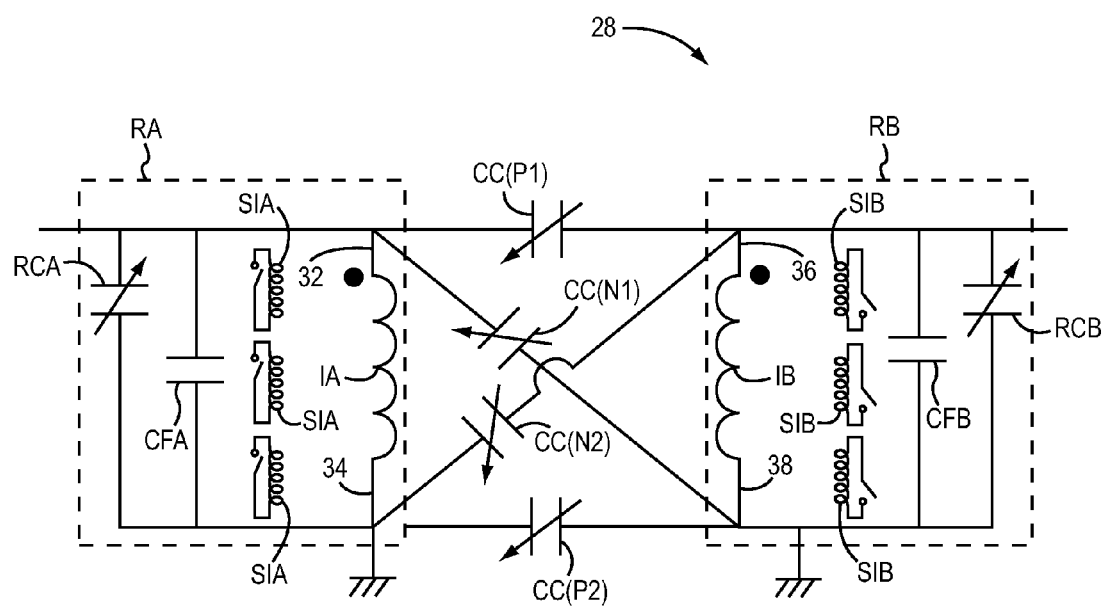

FIG. 14 illustrates an arrangement between the two resonators where the resonators include switchable inductance elements.

DETAILED DESCRIPTION

The embodiments set forth below represent the necessary information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

Note that relational terminology such as "substantially," "approximately," and/or the like, should be interpreted objectively in accordance with the communication device and technological environment in which the radio frequency (RF) front-end circuitry is employed and, in addition, the performance parameters relevant to the operation of the RF front-end circuitry for at least one the particular application of the RF front-end circuitry within the communication device [or at least one prospective communication device] and the technological environment [or at least one prospective technological environment]. Also note that capacitive structures may be described throughout this disclosure as being operable to provide a variable capacitance. These capacitive structures may have any suitable topology. For example, these capacitive structures may be provided as programmable arrays of capacitors, varactors, and/or the like.

With regard to the term "terminal," terminal refers to any conductive feature in an electronic component for receiving signals, transmitting signals, and/or establishing a connection to another electronic component. For instance, a terminal may be one or more nodes, ports, conductive pads, pins, solder bumps, leads, pins, and/or the like. To provide an example with regard to receiving and/or transmitting a single-ended signal, a terminal may be provided as a single port utilized to receive and/or transmit the single-ended signal. However, to be clear, this disclosure is not in any way limited to single-ended signals. Thus, to provide an example with regard to differential signals, a terminus may be provided as a pair of ports for receiving and/or transmitting a positive and negative side of the differential signal.

FIG. 1 illustrates exemplary RF front-end circuitry 10 that may be employed in an RF front-end communication circuit of a portable communication device, such as a cell phone, a tablet, a laptop, and/or the like. The RF front-end circuitry 10 includes an exemplary RF filter structure 12 and control circuitry 14. The RF filter structure 12 includes terminals (referred to generically or generally as terminals TR and specifically as terminals TR1-TRM) which are connected to RF transceiver circuitry 16. In addition, the RF filter structure 12 includes terminals (referred to generically or generally as terminals TANT and specifically as terminals TANT1-TANTM) which are connected to antennas (referred to generically or generally as antennas ANT and specifically as antennas ANT1-ANTM). The RF filter structure 12 is tunable and includes a plurality of resonators (not explicitly shown in FIG. 1) where different sets of the resonators define various tunable RF filter paths (not explicitly shown in FIG. 1) between the terminals TR and the terminals TANT. As such, the RF filter structure 12 can be used to provide multi-path multiplexing and demultiplexing between the RF transceiver circuitry 16 and the antennas ANT. In this manner, the RF filter structure 12 may be operated to implement antenna diversity and/or provide beam forming with the antennas ANT.

For instance, the RF transceiver circuitry 16 may include RF transmit chains (not expressly shown) that can generate any number of RF transmit signals, such as the RF transmit signals (referred to generically or generally as RF transmit signals TX1, TX2, and specifically as RF transmit signals TX11-TX1M and TX21-TX2M) to be radiated by the antennas ANT within different RF frequency bands. The RF transceiver chains may include power amplifiers (e.g., PA1-PAM) that are used to amplify the RF transmit signals (e.g., the RF transmit signal TX1, the RF transmit signal TX2) for emission by the antenna 16. In this embodiment, the RF transmit signals TX1 and the RF transmit signals TX2 are provided in different RF communication bands. Also, each of the RF transmits signals TX11-TX1M may be provided in different RF communication bands for transmission by the corresponding antenna ANT1-ANTM. Additionally, each of the RF transmits signals TX21-TX2M may be provided in different RF communication bands for transmission by the corresponding antenna ANT1-ANTM.

Additionally, the RF transceiver circuitry 16 may include RF receive chains (not expressly shown) that are configured to process any number of RF receive signals, (referred to generically or generally as RF receive signals RX1, RX2, and specifically as RF receive signals RX11-RX1M and RX21-RX2M), after reception by the antennas ANT. The RF receive chains may include low noise amplifiers (e.g., LNA1-LNAM) that are used to amplify the RF receive signals RX1, RX2 for processing by the RF receive chains. In this embodiment, the RF receive signals RX1 and the RF receive signals RX2 are provided in different RF communication bands. Also, each of the RF receive signals RX11-RX1M may be provided in different RF communication bands when received by the corresponding antenna ANT1-ANTM. Additionally, each of the RF receive signals RX21-RX2M may be provided in different RF communication bands for reception by the corresponding antenna ANT1-ANTM. The RF front-end circuitry 10 is implementing a multiple input multiple output (MIMO). The RF front-end circuitry 10 can also implement single input multiple output (SIMO), multiple input single output (MISO), and single input single output (SISO) for receive and transmit paths.

The tunable RF filter paths (not explicitly shown in FIG. 1) are tunable so that the RF transmit signals TX1, TX2 and the RF receive signals RX1, RX2 can be routed and filtered between the terminals TR and the terminals TANT. The control circuitry 14 is configured to tune the tunable RF filter paths in the RF filter structure 12 so that passbands defined by the tunable RF filter paths are provided in the appropriate RF communication bands to route the RF transmit signals TX1, TX2 and the RF receive signals RX1, RX2. Furthermore, the control circuitry 14 is configured to set amplitude differences between the amplitude of the different tunable RF filter paths to approximately target amplitude difference. For example, the control circuitry 14 is configured to set an amplitude difference between an amplitude of a tunable RF filter path connected to the antenna ANT1 and an amplitude of another tunable RF filter path connected to the antenna ANTM. Furthermore, the control circuitry 14 is configured to set a phase difference a phase of the tunable RF filter path connected to the antenna ANT1 and a phase of another tunable RF filter path connected to the antenna ANTM. Accordingly, the antennas ANT1 and ANTM can be coordinated to control directionality to provide beam forming. Additionally, the antennas ANT1 and ANTM can provide multi-channel coordination for antenna diversity and set a first phase difference between the first phase and the second phase to approximately a first target phase difference.

In order to tune the tunable RF filter paths, the control circuitry 14 is configured to generate a control output 18. The control output 18 may include one or more control signals, including analog signals and groups of digital signals in order to tune the tunable RF filter paths in the RF filter structure. The control circuitry 14 may also receive a control input 20 that includes one or more control signals, including analog signals and groups of digital signals. The control input 20 may include information for tuning the RF filter structure 12 such as information indicating RF communication bands, target parameters, power control information, and/or the like. The control circuit 14 may tune the tunable RF filter paths in the RF filter structure 12 in accordance with the information provided by the control input 20.

FIGS. 1A-1D illustrate visual representations of different receiver and transmitter configurations that may each utilize the RF front-end circuitry shown in FIG. 1.

Figure 1A:
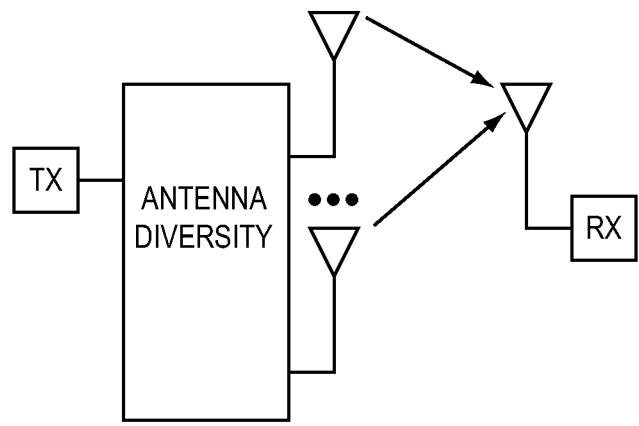
FIGS. 1A-1D illustrate visual representations of different receiver and transmitter configurations that may each utilize the RF front-end circuitry shown in FIG. 1.

FIG. 1A visually represents a transmitter and receiver communication system implementing transmit diversity.

Figure 1B:
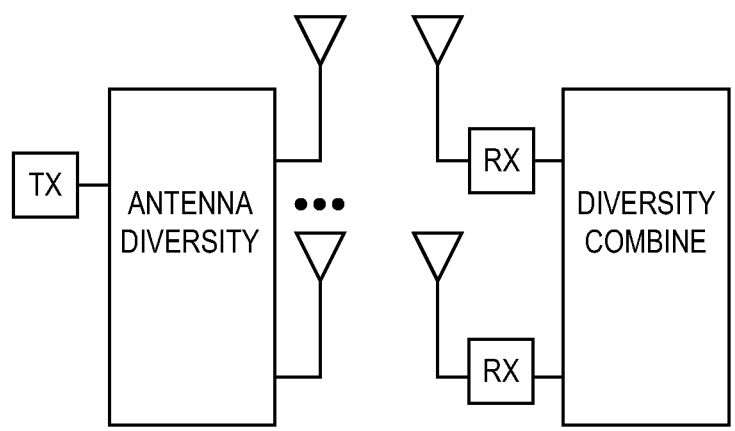

FIG. 1B visually represents a transmitter and receiver communication system that provides transmit and receive antenna diversity.

Figure 1C:
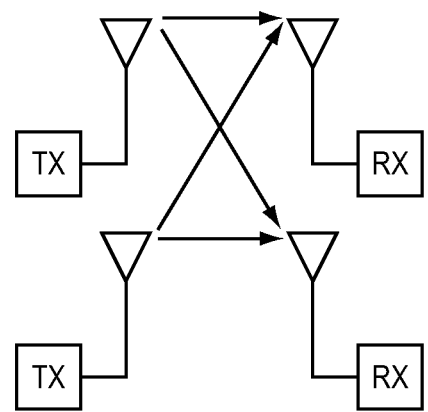

FIG. 1C visually represents transceiver configurations that provide 2×2 MIMO.

Figure 1D:
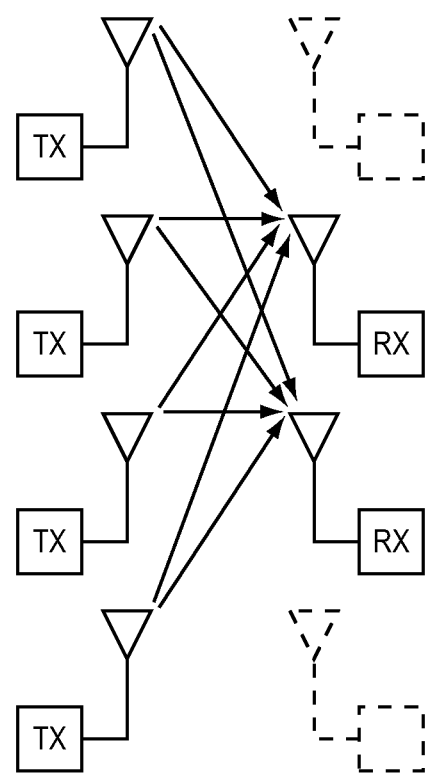

FIG. 1D visually represents transceiver configurations that provide 4×2 or 4×4 MIMO. Other applications with larger numbers of antennas are also within the scope of this disclosure.

FIG. 2 illustrates one embodiment of the RF front-end circuitry 10 that includes one embodiment of the RF filter structure 12 shown in FIG. 1. The RF filter structure 12 shown in FIG. 2 includes a plurality of resonators (referred to generically or generally as resonators "R"). The RF filter structure 12 shown in FIG. 2 includes a first tunable RF filter path 22 connected between the terminal TR1 and the terminal TANT1, a second tunable RF filter path 24 defined between the terminal TR1 and a terminal TANT2, and a third tunable RF filter path 26 connected between the terminal TR1 and a terminal TANT3. The first tunable RF filter path 22 thus provides a path between the terminal TR1 and the antenna ANT1. The second tunable RF filter path 24 provides a path between the terminal TR1 and an antenna ANT2. The third tunable RF filter path 26 provides a path between the terminal TR1 and an antenna ANT3. In an alternative embodiment, the resonators R are used for amplitude tuning and the resonators R are used for phase tuning can be interdigitated. In yet another embodiment, the same resonators may be used for both amplitude and phase tuning.

With respect to the RF filter structure 12 described in FIG. 2 and the other Figures in this disclosure, the resonators R may be weakly coupled, strongly coupled, have no mutual coupling at all, or any combination of weak, strong, or no mutual coupling between the different combinations of the resonators R. Also, energy transfer between two weakly coupled resonators R may be provided by multiple energy transfer components. For example, energy may be transferred between the resonators R only through mutual magnetic coupling, only through mutual electric coupling, or through both mutual electric coupling and mutual magnetic coupling. Ideally, all of the mutual coupling coefficients are provided as designed, but in practice, the mutual coupling coefficients are also at least partially the result of parasitics. A total mutual coupling between the resonators R is given by the sum of magnetic and electric coupling. In this disclosure, the resonators R are weakly coupled to one another when an energy transfer factor is between the resonators R is greater than approximately 0% but less than 10%. If the energy transfer factor is above 10%, the resonators R are strongly coupled. If the energy transfer factor is approximately 0%, there is no mutual coupling between the resonators R. Nevertheless, in the particular descriptions for FIG. 2 and the Figures described below, the resonators R may be described specifically as being weakly coupled. While these specific descriptions for the arrangements in the Figures may be propitious in certain RF applications, the descriptions are not to be considered limiting as strong coupling and/or no mutual coupling may be found to be advantageous in other applications.

Also, the embodiments in FIG. 2 and the other Figures in this disclosure include a certain number of the resonators R. This is simply done in order to help clearly describe particular arrangements of the RF filter structure 12 but also should not be considered limiting since the RF filter structure 12 and the tunable RF filter paths (e.g., the first tunable RF filter path 22, the second tunable RF filter path 24, and the third tunable RF filter path 26) may include any number of resonators R and any number of resonators R may be provided in subpaths. For example, each of the tunable RF filter path 22, 24, 26 in FIG. 2 may be provided using RF filter structures formed from a matrix of resonators R as described in U.S. Utility patent application Ser. No. 14/298,829 (entitled TUNABLE RF FILTER STRUCTURE FORMED BY A MATRIX OF WEAKLY COUPLED RESONATORS). Finally note that the resonators R shown in Figures may each provided in any suitable resonator configurations including as single-ended resonators or differential resonators. Illustrative examples can be found throughout U.S. Utility patent application Ser. No. 14/298,829 (entitled TUNABLE RF FILTER STRUCTURE FORMED BY A MATRIX OF WEAKLY COUPLED RESONATORS).

The first tunable RF filter path 22 is defined by a set of the resonators, R(S), R1. As such, the first tunable RF filter path 22 thus has a first amplitude and a first phase, which are defined at a frequency within a passband of the transfer response provided by the first tunable RF filter path 22 between the terminal TR1 and the terminal TANT1. The second tunable RF filter path 24 is defined by a set of the resonators, R(S), R2. The second tunable RF filter path 24 has a second amplitude and a second phase, which are defined at a frequency within a passband of the transfer response provided by the second tunable RF filter path 24 between the terminal TR1 and a terminal TANT2. The second tunable RF filter path 24 is defined by a set of the resonators, R(S), R2. Finally, the third tunable RF filter path 26 has a third amplitude and a third phase, which are defined at a frequency within a passband of the transfer response provided by the third tunable RF filter path 26 between the terminal TR1 and the terminal TANT3.

The control circuitry 14 is configured to set the amplitude differences and phase differences between the tunable RF filter paths 22, 24, 26. For example, the control circuitry 14 is configured to set a first amplitude difference between the first amplitude of the first tunable RF filter path 22 and the second amplitude of the second tunable RF filter path 24 to approximately a first target amplitude difference. For example, if the target amplitude difference is 1 dB, the control circuitry 14 may be configured to set the first amplitude of the first tunable RF filter path to 0.5 dB and the second amplitude of the second tunable RF filter path 24 to 1.5 dB. In one implementation, the control circuitry 14 is configured to set the first amplitude difference by holding the first amplitude so that the first amplitude provides an amplitude reference. For instance, the first amplitude may have been previously set at 0.3 dB. In this case, the first amplitude of 0.3 B provides the amplitude reference. To set the first amplitude difference between the first amplitude of the first tunable RF filter path 22 and the second amplitude of the second tunable RF filter path 24 to the target amplitude difference (e.g. 1 dB), the control circuitry 14 is configured to adjust the second amplitude (e.g., adjust the second amplitude to 1.3 dB) of the second tunable RF filter path 24 such that the first amplitude difference between the first amplitude and the second amplitude is set to approximately the first target amplitude difference. Alternatively, the control circuitry 14 may adjust both the first amplitude and the second amplitude so that the first amplitude difference is set approximately to the first target amplitude difference.

The control circuitry 14 is configured to set a first phase difference between the first phase of the first tunable RF filter path 22 and the second phase of the second tunable RF filter path 24 to approximately a first target phase difference. In one implementation, the control circuitry 14 is configured to set the first phase difference by holding the first phase of the first tunable RF filter path 24 so that the first phase provides a phase reference. For instance, the first phase may have been previously set at 15 degrees. In this case, the first phase of 15 degrees provides the phase reference. To set the first phase difference between the first phase of the first tunable RF filter path 22 and the second phase of the second tunable RF filter path 24 to the first target phase difference (e.g. 22 degrees), the control circuitry 14 is configured to adjust the second phase (e.g., adjust the second phase to 35 degrees) of the second tunable RF filter path 24 such that the first phase difference between the first phase and the second phase is set to approximately the first target phase difference. Alternatively, the control circuitry 14 may adjust both the first phase and the second phase so that the first phase difference is set approximately to the first target phase difference. In this manner, the first tunable RF filter path 22 and the second tunable RF filter path 24 can be operated to provide antenna diversity and/or beam forming by controlling the first amplitude difference and the first phase difference.

The control circuitry 14 is also configured to set the first amplitude of the first tunable RF filter path 22 and the third amplitude of the third tunable RF filter path 26 to approximately a second target amplitude difference. In one implementation, the control circuitry 14 is configured to set the third amplitude difference by holding the first amplitude so that the first amplitude provides an amplitude reference. For instance, the first amplitude may have been previously set at 0.1 dB. In this case, the first amplitude of 0.1 B provides the amplitude reference. To set the third amplitude difference between the first amplitude of the first tunable RF filter path 22 and the third amplitude of the third tunable RF filter path 26 to the second target amplitude difference (e.g. 0.7 dB), the control circuitry 14 is configured to adjust the third amplitude (e.g., adjust the third amplitude to 0.8 dB) of the third tunable RF filter path 26 such that the third amplitude difference between the first amplitude and the third amplitude is set to approximately the second target amplitude difference. Alternatively, the control circuitry 14 may adjust both the first amplitude and the third amplitude so that the third amplitude difference is set approximately to the second target amplitude difference.

The control circuitry 14 is configured to set a second phase difference between the first phase of the first tunable RF filter path 22 and the third phase of the third tunable RF filter path 26 to approximately a second target phase difference. In one implementation, the control circuitry 14 is configured to set the second phase difference by holding the first phase of the first tunable RF filter path 22 so that the first phase provides a phase reference. For instance, the first phase may have been previously set at 15 degrees. In this case, the first phase of 15 degrees provides the phase reference. To set the second phase difference between the first phase of the first tunable RF filter path 22 and the third phase of the third tunable RF filter path 26 to the second target phase difference (e.g. 50 degrees), the control circuitry 14 is configured to adjust the third phase (e.g., adjust the third phase to 70 degrees) of the third tunable RF filter path 26 such that the second phase difference between the first phase and the third phase is set to approximately the second target phase difference. Alternatively, the control circuitry 14 may adjust both the first phase and the third phase so that the second phase difference is set approximately to the second target phase difference. In this manner, the first tunable RF filter path 22 and the third tunable RF filter path 26 can be operated to provide antenna diversity and/or beam forming by controlling the first amplitude difference and the second phase difference.

The control circuitry 14 is also configured to set the second amplitude of the second tunable RF filter path 24 and the third amplitude of the third tunable RF filter path 26 to approximately a third target amplitude difference. In one implementation, the control circuitry 14 is configured to set the third amplitude difference by holding the second amplitude so that the second amplitude provides an amplitude reference. For instance, the second amplitude may have been previously set at 0.8 dB. In this case, the second amplitude of 0.8 B provides the amplitude reference. To set the third amplitude difference between the second amplitude of the second tunable RF filter path 24 and the third amplitude of the third tunable RF filter path 26 to the third target amplitude difference (e.g. 1.2 dB), the control circuitry 14 is configured to adjust the third amplitude (e.g., adjust the third amplitude to 2.0 dB) of the third tunable RF filter path 26 such that the third amplitude difference between the second amplitude and the third amplitude is set to approximately the third target amplitude difference. Alternatively, the control circuitry 14 may adjust both the second amplitude and the third amplitude so that the third amplitude difference is set approximately to the third target amplitude difference.

The control circuitry 14 is also configured to set the second phase of the second tunable RF filter path 24 and the third phase of the third tunable RF filter path 26 to approximately a third target phase difference. In one implementation, the control circuitry 14 is configured to set the third phase difference by holding the second phase so that the second phase provides a phase reference. For instance, the second phase may have been previously set at 50 degrees. In this case, the second phase of 50 degrees provides the phase reference. To set the third phase difference between the second phase of the second tunable RF filter path 24 and the third phase of the third tunable RF filter path 26 to the third target phase difference (e.g. 30 degrees), the control circuitry 14 is configured to adjust the third phase (e.g., adjust the third phase to 80 degrees) of the third tunable RF filter path 26 such that the third phase difference between the second phase and the third phase is set to approximately the third target phase difference. Alternatively, the control circuitry 14 may adjust both the second phase and the third phase so that the third phase difference is set approximately to the target third phase difference. In this manner, the second tunable RF filter path 24 and the third tunable RF filter path 26 can be operated to provide antenna diversity and/or beam forming by controlling the first amplitude difference and the second phase difference.

Note that the first set of resonators R(S), R1 included in the first tunable RF filter path 22, the second set of resonators R(S), R2 included in the second tunable RF filter path 26, and the third set of resonators R(S), R3 are not mutually exclusive but rather share the resonator R(S). The resonator R(S) is connected to the terminal TR1. The resonator R(S) is coupled in the first tunable RF filter path 22, the second tunable RF filter path 24, and the third tunable RF filter path 26 so as to operate as a splitter between the first tunable RF filter path 22, the second tunable RF filter path 24, and the third tunable RF filter path 26. More specifically, the RF filter structure includes a cross-coupling capacitive structure CS1, a cross-coupling capacitive structure CS2, and a cross-coupling capacitive structure CS3, that connect the resonator R(S) to the resonators R1, R2, and R3 respectively. The control circuit 14 is configured to adjust electric coupling coefficients provided by the cross-coupling capacitive structure CS1, the cross-coupling capacitive structure CS2, and the cross-coupling capacitive structure CS3 to provide splitting between the first tunable RF filter path 22, the second tunable RF filter path 24, and the third tunable RF filter path 26. In an alternative embodiment, the tunable RF filter paths 22, 24, 26 share a node and have different coupling networks instead of sharing the resonator R(S).

The tunable RF filter paths 22, 24, 26 also include subsets of the resonators R (referred to generically or generally as subsets RAM and specifically as subsets RAM1-RAM3) within segments (referred to generically or generally as segments SAM and specifically as segments SAM1-SAM3) of the tunable RF filter paths 22, 24, 26. Additionally, the tunable RF filter paths 22, 24, 26 also include subsets of the resonators R (referred to generically or generally as subsets RPH and specifically as subsets RPH1-RPH3) within segments (referred to generically or generally as segments SPH and specifically as segments SPH1-SPH3) of the tunable RF filter paths 22, 24, 26. More specifically, the first tunable RF filter path 22 includes a subset RAM1 of the resonators R1 within a segment SAM1 of the first tunable RF filter path 22 and a subset RPH1 of the resonators R1 within a segment SPH1 of the first tunable RF filter path 22. In one particular example, the resonators R1 within the segment SAM1 are weakly coupled, and the resonators R1 within the segment SPH1 are weakly coupled. The second tunable RF filter path 24 includes a subset RAM2 of the resonators R2 within a segment SAM2 of the second tunable RF filter path 24 and a subset RPH2 of the resonators R2 within a segment SPH2 of the second tunable RF filter path 24. In one particular example, the resonators R2 within the segment SAM2 are weakly coupled, and the resonators R2 within the segment SPH2 are weakly coupled. The third tunable RF filter path 26 includes a subset RAM3 of the resonators R3 within a segment SAM3 of the third tunable RF filter path 26 and a subset RPH3 of the resonators R3 within a segment SPH3 of the third tunable RF filter path 26. In one particular example, the resonators R3 within the segment SAM3 are weakly coupled, and the resonators R3 within the segment SPH3 are weakly coupled.

The control circuitry 14 is configured to set the amplitude of each tunable RF filter paths 22, 24, 26 by providing an amplitude adjustment to the subset RAM of the resonators R within the segment SAM of the tunable RF filter path 22, 24, 26. Additionally, the control circuitry 14 is configured to set the phase of each tunable RF filter path 22, 24, 26 by providing a phase adjustment to the subset RPH of the resonators R within the segment SPH of the tunable RF filter path 22, 24, 26. More specifically, the control circuitry 14 is configured to set the first amplitude of the first tunable RF filter path 22 by providing an amplitude adjustment to the subset RAM1 of the resonators R1 within the segment SAM1 of the first tunable RF filter path 22. Also, the control circuitry 14 is configured to set the first phase of first tunable RF filter path 22 by providing a phase adjustment to the subset RPH1 of the resonators R1 within the segment SPH1 of the first tunable RF filter path 22. Furthermore, the control circuitry 14 is configured to set the second amplitude of the second tunable RF filter path 24 by providing an amplitude adjustment to the subset RAM2 of the resonators R2 within the segment SAM2 of the second tunable RF filter path 24. Also, the control circuitry 14 is configured to set the second phase of second tunable RF filter path 24 by providing a phase adjustment to the subset RPH2 of the resonators R2 within the segment SPH2 of the second tunable RF filter path 24. Additionally, the control circuitry 14 is configured to set the third amplitude of the third tunable RF filter path 26 by providing an amplitude adjustment to the subset RAM3 of the resonators R3 within the segment SAM3 of the third tunable RF filter path 26. Finally, the control circuitry 14 is configured to set the third phase of third tunable RF filter path 26 by providing a phase adjustment to the subset RPH3 of the resonators R3 within the segment SPH3 of the third tunable RF filter path 26.

FIGS. 3-6 illustrate different exemplary arrangements of a tunable RF filter path 28, which may be exemplary arrangements of the subset RAM of resonators R within the segments SAM and exemplary arrangements of the subset RPH of the resonators R within the segments SPH of the first tunable RF filter path 22, the second tunable RF filter path 24, and/or the third tunable RF filter path 26 shown in FIG. 2. In other words, the subsets RAM, SAM of the first tunable RF filter path 22, the second tunable RF filter path 24, and/or the third tunable RF filter path 26 shown in FIG. 2 may be provided in the same manner as the different examples of the tunable RF filter path 28 shown in FIGS. 3-6. The subsets RAM, SAM of the first tunable RF filter path 22, the second tunable RF filter path 24, and the third tunable RF filter path 26 may both be configured in accordance with one of the exemplary arrangements of the tunable RF filter path 28 shown in FIGS. 3-6. Alternatively, the subsets RAM1, SAM1 (shown specifically in FIG. 2) of the first tunable RF filter path 22 may be provided in accordance to one of the exemplary arrangements shown in FIGS. 3-6 and the subsets RAM2, SAM2 (shown specifically in FIG. 2) of the second tunable RF filter path 24 may be provided in accordance to a different one of the arrangements shown in FIGS. 3-6, and the subsets RAM3, SAM3 (shown specifically in FIG. 2) of the third tunable RF filter path 26 may be provided in accordance to a different one of the arrangements shown in FIGS. 3-6 or in the same manner as one of the other arrangements of the first tunable RF filter path 22 or the second RF tunable RF filter path 26. In fact, any combination of arrangements shown in FIGS. 3-6 for the first tunable RF filter path 22, the second tunable RF filter path 24, and/or the third tunable RF filter path 26 is possible. In FIGS. 3-6, the control circuitry 14 is configured to tune the tunable RF filter path 28 shown in each of FIGS. 3-6 is configured to set the amplitude the tunable RF filter path 28 by providing an amplitude adjustment to the subset RAM of resonators RA, RB within the segment SAM of the tunable RF filter path 28. Additionally, the control circuitry 14 is configured to set the phase of the tunable RF filter path 28 by providing a phase adjustment to the subset RPH of resonators RC,RD within the segment SPH of the tunable RF filter path 28. Sets (referred to generically as CCS) of cross-coupling capacitive structures (referred to generically as elements CC) are connected between the resonators, as explained in further detail below.

In FIGS. 3-6, each of the resonators R may include at least one inductor and at least one capacitive structure. It should be noted that arrangements illustrated in this application for the resonators R are illustrative but are not exhaustive of possible arrangements for the tunable RF filter path 28. Any suitable arrangement may be used. In particular, arrangements for the tunable RF filter path 28 and the RF filter structure 12 (shown in FIG. 1) may be in accordance to any of the arrangements described in U.S. Utility patent application Ser. No. 14/298,829 (entitled TUNABLE RF FILTER STRUCTURE FORMED BY A MATRIX OF WEAKLY COUPLED RESONATORS) filed Jun. 6, 2014, which is hereby incorporated by reference in its entirety.

With respect to the arrangements described in FIGS. 3-6, the resonators R in the tunable RF filter path 28 shown in FIGS. 3-6 may be weakly coupled, strongly coupled, have no mutual coupling at all, or any combination of weak, strong, or no mutual coupling between the different combinations of the resonators R. Also, energy transfer between two weakly coupled resonators R in the tunable RF filter path 28 may be provided by multiple energy transfer components. For example, energy may be transferred between the resonators R only through mutual magnetic coupling, only through mutual electric coupling, or through both mutual electric coupling and mutual magnetic coupling. Ideally, all of the mutual coupling coefficients are provided as designed, but in practice, the mutual coupling coefficients are also at least partially the result of parasitics. The inductors of the resonators R may also have mutual magnetic coupling between them. A total mutual coupling between the resonators R is given by the sum of magnetic and electric coupling. In this disclosure, the resonators R are weakly coupled to one another when an energy transfer factor is between the resonators R is greater than approximately 0% but less than 10%. If the energy transfer factor is above 10% the resonators R are strongly coupled. If the energy transfer factor is approximately 0% there is no mutual coupling between the resonators R. Nevertheless, in the particular descriptions for FIGS. 3-6 below, some of the resonators R may be described specifically as being weakly coupled. While these descriptions for the arrangements in FIGS. 3-6 may be propitious in certain RF applications, the descriptions are not to be considered limiting as strong coupling and/or no mutual coupling may be found to be advantageous in other applications.

Also, the embodiments in FIGS. 3-6 include a certain number of the resonators R in the segment SAM and a certain number of the resonators R in the segments SPH. This is simply done in order to help clearly describe particular arrangements of the tunable RF filter path 28 but also should not be considered limiting since the tunable RF filter path 28 may include any number of resonators R, and any number of resonators R may be provided in subpaths. For example, the tunable RF filter path 28 may be provided using RF filter structures formed from a matrix of resonators R as described in U.S. Utility patent application Ser. No. 14/298,829 (entitled TUNABLE RF FILTER STRUCTURE FORMED BY A MATRIX OF WEAKLY COUPLED RESONATORS). Finally, note that the resonators R shown in FIGS. 3-6 are each provided as single-ended resonators R, as differential resonators, and/or as different combinations of single-ended and differential resonators. Illustrative examples can be found throughout U.S. Utility patent application Ser. No. 14/298,829 (entitled TUNABLE RF FILTER STRUCTURE FORMED BY A MATRIX OF WEAKLY COUPLED RESONATORS).

Referring now specifically to FIG. 3, FIG. 3 illustrates an exemplary arrangement of the subset RAM in the segment SAM and the subset RPH in the segment SPH of the tunable RF filter path 28. As shown in FIG. 3, in this embodiment, the subset RAM includes the resonators RA, RB. In this embodiment, the resonator RA is weakly coupled to the resonator RB. A set CCSAB of one or more cross-coupling capacitive structures CCAB are electrically connected between the resonator RA and the resonator RB within the segment SAM of the tunable RF filter path 28. Each of the cross-coupling capacitive structures CCAB provides a variable electric coupling coefficient between the resonators RA, RB. The control circuitry 14 is operably associated with each of the cross-coupling capacitive structures CCAB so as to be operable to vary the variable electric coupling coefficient provided by each of the cross-coupling capacitive structures CCAB within the set CCSAB. In this manner, the control circuitry 14 is configured to provide the amplitude adjustment to the subset the resonators RA, RB within the segment SAM of the tunable RF filter path 28 by being configured to adjust the variable electric coupling coefficients of each the cross-coupling capacitive structures CCAB. A phase of the resonators RA, RB within the segment SAM of the tunable RF filter path 28 is fixed. In other embodiments, a phase adjustment is provided with the segment SAM, and an amplitude of the segment SAM is fixed.

To provide a phase adjustment to the tunable RF filter path 28, the subset RPH includes the resonators RC, RD. In this embodiment, the resonator RC is weakly coupled to the resonator RD. A set CCSCD of one or more cross-coupling capacitive structures CCCD are electrically connected between the resonator RC and the resonator RD within the segment SPH of the tunable RF filter path 28. Each of the cross-coupling capacitive structures CCCD provides a variable electric coupling coefficient between the resonators RC, RD. The control circuitry 14 is operably associated with each of the cross-coupling capacitive structures CCCD so as to be operable to vary the variable electric coupling coefficient provided by each of the cross-coupling capacitive structures CCCD within the set CCSCD. In this manner, the control circuitry 14 is configured to provide the phase adjustment to the subset the resonators RC, RD within the segment SPH of the tunable RF filter path 28 by being configured to adjust the variable electric coupling coefficients of each the cross-coupling capacitive structures CCCD. An amplitude of the resonators RC, RD within the segment SPH of the tunable RF filter path 28 is fixed. In other embodiments, an amplitude adjustment is provided with the segment SPH and a phase of the segment SSPH is fixed.

FIG. 3A illustrates an amplitude response and a phase response of the subset of resonators RPH. As shown in FIG. 3A the amplitude response is fixed while the phase response is shifted. More specifically, FIG. 3A shows a quasi-orthogonal phase adjustment.

FIG. 3B illustrates an amplitude response and a phase response of the subset of resonators RAM. As shown in FIG. 3B the phase response is fixed while the amplitude response is shifted. More specifically, FIG. 3B shows a quasi-orthogonal amplitude adjustment. In some practical applications, there may be a residual amplitude change when doing phase tuning and a residual phase change when doing amplitude tuning.

FIG. 4 illustrates another exemplary arrangement of the subset RAM in the segment SAM and the subset RPH in the segment SPH of the tunable RF filter path 28. The arrangement of the tunable RF filter path 28 shown in FIG. 4 is the same as the arrangement shown in FIG. 3 except in this embodiment, an isolation resonator R(IS) is provided within the tunable RF filter path 42 between the segment SAM and the segment SPH. A set CCSBIS of one or more cross coupling capacitive structures CCBIS is electrically connected within the tunable RF filter path 28 between the resonator RB and the resonator R(IS). A set of CCSCIS of one or more cross coupling capacitive structures CCCIS is electrically connected within the tunable RF filter path 28 between the resonator RC and the resonator R(IS).

The resonator R(IS) is configured to provide isolation between the segment SAM and the segment SPH. More specifically, the control circuitry 14 is configured to adjust variable electric coupling coefficients between the resonator RB and the resonator R(IS) provided by the cross-coupling capacitive structures CCBIS and to adjust variable electric coupling coefficients between the resonator RC and the resonator R(IS) provided by the cross-coupling capacitive structures CCCIS to provide isolation between the between the segment SAM and the segment SPH. In this manner, the amplitude adjustments in the segment SAM do not significantly affect the amplitude of the segment SPH, and the phase adjustment in the segment SPH does not significantly affect the phase of the segment SAM.

FIG. 5 illustrates another exemplary arrangement of the subset RAM in the segment SAM and the subset RPH in the segment SPH of the tunable RF filter path 28. The arrangement of the tunable RF filter path 28 shown in FIG. 5 is the same as the arrangement shown in FIG. 3 except in this embodiment, an isolation resonator R(ISAM) is provided within the segment SAM of the tunable RF filter path 28, and an isolation resonator R(ISPH) is provided within the segment SPH of the tunable RF filter path 28 with the segment SPH of the tunable RF filter path 28. Also, a set CCSBAM of one or more cross coupling capacitive structures CCBAM is electrically connected within the tunable RF filter path 28 between the resonator RB and the resonator R(ISAM). A set CCSCPH of one or more cross coupling capacitive structures CCCPH is electrically connected within the tunable RF filter path 28 between the resonator RC and the resonator R(ISPH). A set of CCSAMPM of one or more cross coupling capacitive structures CCAMPM is electrically connected within the tunable RF filter path 28 between the resonator R(ISAM) and the resonator R(ISPH).

The resonator R(ISAM) is configured to isolate the segment SAM from the segment SPH. More specifically, the control circuitry 14 is configured to adjust variable electric coupling coefficients between the resonator RB and the resonator R(ISAM) provided by the cross-coupling capacitive structures CCBAM to provide isolate the segment SAM from the segment SPH. The resonator R(ISPH) is configured to isolate the segment SPH from the segment SAM. More specifically, the control circuitry 14 is configured to adjust variable electric coupling coefficients between the resonator RC and the resonator R(ISPH) provided by the cross-coupling capacitive structures CCCPH to isolate the segment SPH from the segment SAM. The control circuitry 14 is configured to adjust variable electric coupling coefficients between the resonator R(ISAM) and the resonator R(ISPH) provided by the cross-coupling capacitive structures CCAMPM and to adjust variable electric coupling coefficients between the resonator R(ISAM) and the resonator R(ISPH) to provide isolation between the between the segment SAM and the segment SPH. In this manner, the amplitude adjustments in the segment SAM do not significantly affect the amplitude of the segment SPH, and the phase adjustment in the segment SPH does not significantly affect the phase of the segment SAM. Additional isolation resonators may be provided to provide additional isolation between the segments SAM, SPH if desired and additional insertion losses can be tolerated.

FIG. 6 illustrates another exemplary arrangement of the subset RAM in the segment SAM and the subset RPH in the segment SPH of the tunable RF filter path 28. The arrangement of the tunable RF filter path 28 shown in FIG. 6 is the same as the arrangement shown in FIG. 3 except in this embodiment, an amplifier AMP is provided within the tunable RF filter path 28 that is connected between the segment SAM and the segment SPH. The amplifier AMP is configured to provide amplification and may be provided in an entire RF amplification circuit or may simply be an amplifier component. For example, in one embodiment, the amplifier AMP is a final amplifier stage of an RF amplification circuit, where a driver amplifier stage is provided in the RF transceiver circuitry 16 (shown in FIG. 1). Note that the first tunable RF filter path 22, the second tunable RF filter path 24, and the third tunable RF filter path 26 (shown in FIG. 2) may be each be provided in accordance to the arrangement shown in FIG. 6 and thus may each have an amplifier, such as the amplifier AMP shown in FIG. 6. In an alternative embodiment, the amplifier AMP may have a gain approximately equal to one and thus serve as a buffer, or it may have a gain less than one and operate as an attenuator.

FIG. 7 illustrates another embodiment of the RF filter structure 12. The RF filter structure 12 shown in FIG. 7 includes an embodiment of the plurality of resonators R that defines one embodiment of the first tunable RF filter path 22 and one embodiment of the second tunable RF filter path 24. The first tunable RF filter path 22 includes a resonator RA and a resonator RB. In this specific example, the resonator RA and the resonator RB are a first pair of weakly coupled resonators that define the first tunable RF filter path 22. The first tunable RF filter path 22 shown in FIG. 7 is electrically connected between the terminal TR1 and the terminal TANT1. The second tunable RF filter path 24 includes a resonator RX and a resonator RY. The resonator RX and the resonator RY are a second pair of weakly coupled resonators that define the second tunable RF filter path 24. The second tunable RF filter path 24 shown in FIG. 7 is electrically connected between a terminal TR2 and the terminal TANT2.

As explained in further detail below, a set S of cross-coupling capacitive structures (referred to generically or generally as cross-coupling capacitive structures CC) is electrically connected between the resonator RA, the resonator RB, the resonator RX, and the resonator RY. Note that in this embodiment, the set S of cross-coupling capacitive structures CC only has one of the cross-coupling capacitive structures CC provided between each of the resonators R. This is simply done for the sake of clarity. In fact, a set of more than one of the cross-coupling capacitive structures CC may be connected between any two of the resonators R in any suitable arrangement. For example, the sets of more than one of the cross-coupling capacitive structures CC may be connected between any two of the resonators R in accordance to any of the arrangements described below or described in U.S. Utility patent application Ser. No. 14/298, 829 (entitled TUNABLE RF FILTER STRUCTURE FORMED BY A MATRIX OF WEAKLY COUPLED RESONATORS).

In FIG. 7, the RF filter structure 12 includes the cross-coupling capacitive structure CCAB, a cross-coupling capacitive structure CCAX, a cross-coupling capacitive structure CCAY, a cross-coupling capacitive structure CCBX, a cross-coupling capacitive structure CCBY, and a cross-coupling capacitive structure CCXY. The cross-coupling capacitive structure CCAB is operable to provide a variable capacitance and connect between the resonator RA and the resonator RB. The cross-coupling capacitive structure CCAB is thus connected within the first tunable RF filter path 22 between the resonator RA and the resonator RB and is an interpath cross-coupling capacitive structure. Accordingly, the cross-coupling capacitive structure CCAB provides a first variable electric coupling coefficient between the resonator RA and the resonator RB. The control circuitry 14 is configured to set the first amplitude of the first tunable RF filter path 22 by being configured to adjust the first variable electric coupling coefficient provided by the cross-coupling capacitive structure CCAB between the resonator RA and the resonator RB.

The cross-coupling capacitive structure CCXY is operable to provide a variable capacitance and connect between the resonator RX and the resonator RY. The cross-coupling capacitive structure CCXY is thus connected within the second tunable RF filter path 24 between the resonator RX and the resonator RY and is an interpath cross-coupling capacitive structure. Accordingly, the cross-coupling capacitive structure CCXY provides a second variable electric coupling coefficient between the resonator RX and the resonator RY. The control circuitry 14 is configured to set the second amplitude of the second tunable RF filter path 24 by being configured to adjust the second variable electric coupling coefficient provided by the cross-coupling capacitive structure CCXY between the resonator RX and the resonator RY. Thus, unlike the implementation of the RF filter structure 12 described with respect to FIG. 2, the first amplitude and second amplitude of the first tunable RF filter path 22 and the second tunable RF filter path 24 of the RF filter structure 12 shown in FIG. 7 are set by adjusting electric coupling coefficients provided by interpath cross-coupling capacitive structures CCAB, CCXY, respectively. In this manner, the control circuitry 14 is configured to set the first amplitude difference between the first amplitude and the second amplitude to approximately the first target amplitude difference The cross-coupling capacitive structure CCAX is operable to provide a variable capacitance and connect between the resonator RX and the resonator RA. The cross-coupling capacitive structure CCAX is thus connected between the first tunable RF filter path 22 and the second tunable RF filter path 24 and is an intrapath cross-coupling capacitive structure. The cross-coupling capacitive structure CCAX provides a third variable electric coupling coefficient between the resonator RX and the resonator RA. The control circuitry 14 is configured to set the first phase of the first tunable RF filter path 22 by being configured to adjust the third variable electric coupling coefficient provided by the cross-coupling capacitive structure CCAX between the resonator RX and the resonator RA.

The cross-coupling capacitive structure CCAY is operable to provide a variable capacitance and connect between the resonator RY and the resonator RA. The cross-coupling capacitive structure CCAY is thus connected between the first tunable RF filter path 22 and the second tunable RF filter path 24 and is an intrapath cross-coupling capacitive structure. The cross-coupling capacitive structure CCAY provides a fourth variable electric coupling coefficient between the resonator RY and the resonator RA. The control circuitry 14 is configured to set the second phase of the second tunable RF filter path 24 by being configured to adjust the fourth variable electric coupling coefficient provided by the cross-coupling capacitive structure CCAY between the resonator RY and the resonator RA.

The cross-coupling capacitive structure CCBX is operable to provide a variable capacitance and connect between the resonator RX and the resonator RB. The cross-coupling capacitive structure CCBX is thus connected between the first tunable RF filter path 22 and the second tunable RF filter path 24 and is an intrapath cross-coupling capacitive structure. The cross-coupling capacitive structure CCBX provides a fifth variable electric coupling coefficient between the resonator RX and the resonator RB. The control circuitry 14 is also configured to set the first phase of the first tunable RF filter path 22 by being configured to adjust the fifth variable electric coupling coefficient provided by the cross-coupling capacitive structure CCBX between the resonator RX and the resonator RB.

The cross-coupling capacitive structure CCBY is operable to provide a variable capacitance and connect between the resonator RY and the resonator RB. The cross-coupling capacitive structure CCBY is thus connected between the first tunable RF filter path 22 and the second tunable RF filter path 24 and is an intrapath cross-coupling capacitive structure. The cross-coupling capacitive structure CCBY provides a sixth variable electric coupling coefficient between the resonator RY and the resonator RB. The control circuitry 14 is also configured to set the second phase of the second tunable RF filter path 24 by being configured to adjust the sixth variable electric coupling coefficient provided by the cross-coupling capacitive structure CCBY between the resonator RY and the resonator RB. As such, the first phase and second phase of the first tunable RF filter path 22 and the second tunable RF filter path 24 are set by adjusting electric coupling coefficients provided by intrapath the cross-coupling capacitive structures CCAX, CCAY, CCBX, CCBY, as described above. In this manner, the control circuitry 14 is configured to set the first phase difference between the first phase and the second phase to approximately the first target phase difference.

With regard to the resonators RA, RB, RX, RY shown in FIG. 7, the resonators RA, RB, RX, RY may each be single-ended resonators, differential resonators, or different combinations of single-ended resonators and differential resonators. For example, the resonator RA and the resonator RB in the first tunable RF filter path 22 may each be provided in accordance with any of the embodiments of the resonator RA, RB, RX, RY described in this disclosure or described in U.S. Utility patent application Ser. No. 14/298, 829 (entitled TUNABLE RF FILTER STRUCTURE FORMED BY A MATRIX OF WEAKLY COUPLED RESONATORS). Additionally, one or more of the resonators RA, RB in the first tunable RF filter path 22 and one or more of the resonators RX, RY in the second tunable RF filter path 24 may be weakly coupled. In one specific embodiment, all of the resonators RA, RB, RX, RY of the RF filter structure 12 shown in FIG. 7 are weakly coupled to one another. Thus, the resonators RA, RB, RX, RY may be operably associated with one another such that an energy transfer factor between each of the resonators RA, RB, RX, RY is less than 10%. Alternatively, the energy transfer factor between only a subset of the resonators RA, RB, RX, RY is less than 10%. In addition, in at least some embodiments, not all of the resonators RA, RB, RX, RY are weakly coupled to one another.

FIG. 8 illustrates another arrangement of the RF filter structure 12 shown in FIG. 1. The RF filter structure 12 shown in FIG. 8 is the same as the arrangement shown in FIG. 7, except that in the arrangement shown in FIG. 8, the resonators R in the first tunable RF filter path 22 and the resonators R in the second tunable RF filter path 24, are not mutually exclusive but rather share the resonator R(S), like the embodiment of the RF filter structure 12 shown in FIG. 2. Thus, the first tunable RF filter path 22 shown in FIG. 8 is connected between the terminal TR1 and the terminal TANT1, while the second tunable RF filter path 24 is connected between the terminal TR1 and the terminal TANT2. The resonator R(S) is connected to the terminal TR1. The resonator R(S) is coupled to the resonator RA in the first tunable RF filter path 22 and the resonator RX in the second tunable RF filter path 24 so as to operate as a splitter between the first tunable RF filter path 22 and the second tunable RF filter path 24. More specifically, the RF filter structure includes the cross-coupling capacitive structure CS1 and the cross-coupling capacitive structure CS2 that connect the resonator R(S) to the resonators RA, RX, respectively. The control circuit 14 is configured to adjust the electric coupling coefficients provided by the cross-coupling capacitive structure CS1 and the cross-coupling capacitive structure CS2 to provide splitting between the first tunable RF filter path 22 and the second tunable RF filter path 24. In one application of the RF filter structure 12 shown in FIG. 8, the RF filter structure 12 is used to implement passive antenna diversity. Another application is beam forming and beam steering.

FIG. 9 illustrates another arrangement of the RF filter structure 12 shown in FIG. 1. The RF filter structure 12 shown in FIG. 9 is the same as the arrangement shown in FIG. 8, except that in the arrangement shown in FIG. 9, an amplifier AMP1 is connected in the first tunable RF filter path 22 and an amplifier AMP2 in the second tunable RF filter path 24. The amplifiers AMP1, AMP2 are each configured to provide amplification and may be provided as an entire RF amplification circuit or may simply be an amplifier component. For example, in one embodiment, each of the amplifiers AMP1, AMP2 is a final amplifier stage of an RF amplification circuit, where a driver amplifier stage is provided in the RF transceiver circuitry 16 (shown in FIG. 1). One application of the RF filter structure 12 is provided to implement active antenna diversity. Another application is to realize beam forming or beam steering.

FIG. 10 illustrates an exemplary embodiment of the resonators RA, RB. Note that any two of the resonators R shown in any of the RF filter structures 12 shown in FIGS. 1-9 above may be arranged as shown in FIG. 10, whether the resonators RA, RB are within the same tunable RF filter path or in different tunable RF filter paths. FIG. 10 includes an embodiment of the resonator RA and an embodiment of the resonator RB. The resonator RA and the resonator RB are weakly coupled to one another. It should be noted that arrangements of the resonators RA, RB illustrated in FIGS. 10-14 are illustrative but are not exhaustive of possible arrangements between two of the resonators R. Any suitable arrangement may be used. In particular, possible arrangements between two of the resonators R may be in accordance to any of the arrangements described in U.S. Utility patent application Ser. No. 14/298,829 (entitled TUNABLE RF FILTER STRUCTURE FORMED BY A MATRIX OF WEAKLY COUPLED RESONATORS) filed Jun. 6, 2014, which is hereby incorporated by reference in its entirety.

Each of the resonators R includes an inductor (referred to generically as inductor I and specifically as inductors IA-IB) and one or more capacitive structures (referred to generically as capacitive structures RC and specifically as capacitive structures RCA-RCB). The resonator RA shown in FIG. 10 is a single-ended resonator RA that includes an inductor IA and a capacitive structure RCA. The inductor IA has an end 32 and an end 34, wherein the capacitive structure RCA is connected between the end 32 and the end 34 of the inductor IA. As such, the inductor IA and the capacitive structure RCA are connected in parallel. The end 34 of the inductor IA is grounded. Additionally, the embodiment of the resonator RB shown in FIG. 10 includes an inductor IB and a capacitive structure RCB. The inductor IB has an end 36 and an end 38, wherein the capacitive structure RCB is connected between the end 36 and the end 38 of the inductor IB. Accordingly, the inductor IB and the capacitive structure RCB are also connected in parallel. The end 38 of the inductor IB is grounded. Both the capacitive structure RCA and the capacitive structure RCB are grounded.

The resonator RA and the resonator RB are a pair of weakly coupled resonators. In this embodiment, the resonator RA and the resonator RB are weakly coupled by arranging the inductor IA and the inductor IB such that the inductor IA and the inductor IB are weakly magnetically coupled. For example, the inductor IA and the inductor IB may have a (fixed) positive magnetic coupling coefficient and have a magnitude that is less than or equal to approximately 0.3 but greater than approximately 0. Although the resonator RA and the resonator RB are weakly coupled, a spatial displacement between the inductor IA and the inductor IB may be less than or equal to half the maximum lateral width of the inductor IB. As such, the inductor IA and the inductor IB are relatively close to one another. The spatial displacement between the inductor IA and the inductor IB may be measured from a geometric centroid of the inductor IA to a geometric centroid of the inductor IB. The maximum lateral width may be a maximum dimension of the inductor IB along a plane defined by its largest winding.

The weak coupling between the inductor IA and the inductor IB may be obtained through topological techniques. In one example, the inductor IA and the inductor IB may be fully or partially aligned, where winding(s) of the inductor IA and winding(s) of the inductor IB are configured to provide weak coupling through magnetic field cancellation. Alternatively or additionally, a plane defining an orientation of the windings of the inductor IA and a plane defining an orientation of the windings of the inductor IB may be fully or partially orthogonal to one another. Alternatively, the inductor IA and inductor IB may be weakly magnetically coupled simply by being sufficiently far apart from one another.

The inductor IA is magnetically coupled to the inductor IB such that an RF signal received at the end 32 of the inductor IA with a voltage polarity (i.e., either a positive voltage polarity or a negative voltage polarity) results in a filtered RF signal being transmitted out the end 36 of the inductor IB with the same voltage polarity. Also, the inductor IB is magnetically coupled to the inductor IA such that an RF signal received at the end 36 of the inductor IB with a voltage polarity (i.e., either a positive voltage polarity or a negative voltage polarity) results in a filtered RF signal being transmitted out the end 32 of the inductor IA with the same voltage polarity. This is indicated in FIG. 10 by the dot convention where a dot is placed at the end 32 of the inductor IA and a dot is placed at the end 36 of the inductor IB.

Since the resonator RA and the resonator RB are weakly coupled, the resonator RB is operably associated with the resonator RA such that an energy transfer factor between the resonator RA and the resonator RB is less than 10%. While the positive mutual magnetic coupling factor between the inductor IA and the inductor IB is fixed and is less than or equal to approximately 0.3, a total mutual coupling factor is determined not only by the mutual magnetic coupling factor but also by a mutual electric coupling factor. The mutual electric coupling factor is provided by the mutual electric coupling between the resonators RA, RB. In this case, the mutual electric coupling factor between the resonators RA, RB can be varied, and the total mutual coupling factor can be varied as well. The mutual electric coupling factor, and thus the total mutual coupling factor between the resonators RA, RB, is varied with cross-coupling capacitive structures CC(P1), CC(P2), CC(N1), and CC(N2) as described in further detail below.

To provide a tuning range and provide a fast roll-off from a low-frequency side to a high-frequency side, the resonators RA, RB are tunable so that a sign of the total mutual coupling coefficient between the resonator RA and the resonator RB can be changed from positive to negative and vice versa. As shown in FIG. 10, the cross-coupling capacitive structure CC(P1) is electrically connected between the end 32 of the inductor IA within the resonator RA and the end 36 of the inductor IB in the resonator RB so as to provide the positive coupling coefficient (i.e., the variable positive electric coupling coefficient) between the resonator RA and the resonator RB. In other words, a magnitude of the variable positive electric coupling coefficient provided by the cross-coupling capacitive structure CC(P1) is varied by varying the variable capacitance of the cross-coupling capacitive structure. However, the sign of the variable positive electric coupling coefficient is positive. Thus, the variable positive electric coupling coefficient provided by the cross-coupling capacitive structure CC(P1) can also vary the total mutual coupling coefficient between the resonator RA and the resonator RB positively and in accordance with its magnitude.

Also shown in FIG. 10, the cross-coupling capacitive structure CC(P2) is electrically connected between the end 34 of the inductor IA within the resonator RA and the end 38 of the inductor IB in the resonator RB so as to provide another positive coupling coefficient (i.e., another variable positive electric coupling coefficient) between the resonator RA and the resonator RB. In other words, a magnitude of the variable positive electric coupling coefficient provided by the cross-coupling capacitive structure CC(P2) is varied by varying the variable capacitance of the cross-coupling capacitive structure CC(P2). However, the sign of the variable positive electric coupling coefficient is positive. Thus, the variable positive electric coupling coefficient provided by the cross-coupling capacitive structure CC(P2) can vary the total mutual coupling coefficient between the resonator RA and the resonator RB positively and in accordance with its magnitude.

Also in FIG. 10, the cross-coupling capacitive structure CC(N1) is electrically connected between the end 32 of the inductor IA within the resonator RA and the end 36 of the inductor IB in the resonator RB so as to provide a negative coupling coefficient (i.e., a variable negative electric coupling coefficient) between the resonator RA and the resonator RB. In other words, a magnitude of the variable negative electric coupling coefficient provided by the cross-coupling capacitive structure CC(N1) is varied by varying the variable capacitance of the cross-coupling capacitive structure CC(N1). However, the sign of the variable negative electric coupling coefficient is negative. Thus, the variable negative electric coupling coefficient provided by the cross-coupling capacitive structure CC(N1) can vary the total mutual coupling coefficient between the resonator RA and the resonator RB negatively and in accordance with its magnitude.

Finally as shown in FIG. 10, the cross-coupling capacitive structure CC(N2) is electrically connected between the end 34 of the inductor IA within the resonator RA and the end 36 of the inductor IB in the resonator RB so as to provide another negative coupling coefficient (i.e., another variable negative electric coupling coefficient) between the resonator RA and the resonator RB. In other words, a magnitude of the variable negative electric coupling coefficient provided by the cross-coupling capacitive structure CC(N2) is varied by varying the variable capacitance of the cross-coupling capacitive structure CC(N2). However, the sign of the variable negative electric coupling coefficient is negative. Thus, the variable negative electric coupling coefficient provided by the cross-coupling capacitive structure CC(N2) can vary the total mutual coupling coefficient between the resonator RA and the resonator RB negatively and in accordance with its magnitude. By using independent and adjustable positive and negative coupling coefficients, the transfer function of the tunable RF filter path 28 is provided so as to be fully adjustable, and the sign of the total mutual coupling factor between the resonators RA and RB can be changed from positive to negative and vice versa. The arrangement of the cross-coupling capacitive structure CC(P1), the cross-coupling capacitive structure CC(N1), the cross-coupling capacitive structure CC(P2), and the cross-coupling capacitive structure CC(N2) shown in FIG. 10 is an X-bridge structure. However, any arrangement may be utilized, such as any of the arrangements described in U.S. Utility patent application Ser. No. 14/298,829 (entitled TUNABLE RF FILTER STRUCTURE FORMED BY A MATRIX OF WEAKLY COUPLED RESONATORS).

FIG. 11 illustrates an exemplary embodiment of the resonators RA, RB. The embodiment in FIG. 11 is the same as the embodiment in FIG. 10 except that the inductor IA and the inductor IB are not mutually magnetically coupled to one another. Thus the mutual magnetic coupling factor between the inductor IA and the inductor IB is approximately zero (0), and the resonator RA, RB are not weakly coupled to one another. In this embodiment, the resonator RA and the resonator RB do not have mutual magnetic coupling by arranging the inductor IA and the inductor IB such that the magnetic flux between the inductor IA and the inductor IB is cancelled.

FIG. 12 illustrates another exemplary embodiment arrangement of the resonators RA, RB. The arrangement in FIG. 12 is the same as the arrangement in FIG. 10 except for the polarity of the inductors IA, IB and the manner that the cross-coupling capacitive structures CC(PA1), CC(PA2), CC(N1), and CC(N2) are connected to the inductors IA, IB. In this embodiment, the resonator RA and the resonator RB are weakly coupled by arranging the inductor IA and the inductor IB such that the inductor IA and the inductor IB are weakly magnetically coupled. However, the inductor IA and the inductor IB may have a (fixed) negative magnetic coupling coefficient and a magnitude that is less than or equal to approximately 0.3 but greater than approximately 0. Although the resonator RA and the resonator RB are weakly coupled, a spatial displacement between the inductor IA and the inductor IB may be less than or equal to half the maximum lateral width of the inductor IB. As such, the inductor IA and the inductor IB are relatively close to one another. The spatial displacement between the inductor IA and the inductor IB may be measured from a geometric centroid of the inductor IA to a geometric centroid of the inductor IB. The maximum lateral width may be a maximum dimension of the inductor IB along a plane defined by its largest winding.

The weak coupling between the inductor IA and the inductor IB may be obtained through topological techniques. In one example, the inductor IA and the inductor IB may be fully or partially aligned, where winding(s) of the inductor IA and winding(s) of the inductor IB are configured to provide weak coupling through magnetic field cancellation. Alternatively or additionally, a plane defining an orientation of the windings of the inductor IA and a plane defining an orientation of the windings of the inductor IB may be fully or partially orthogonal to one another. Alternatively, the inductor IA and inductor IB may be weakly magnetically coupled simply by being sufficiently far apart from one another.

The inductor IA is magnetically coupled to the inductor IB such that an RF signal received at the end 32 of the inductor IA with a voltage polarity (i.e., either a positive voltage polarity or a negative voltage polarity) results in a filtered RF signal being transmitted out the end 38 of the inductor IB with the same voltage polarity. Also, the inductor IB is magnetically coupled to the inductor IA such that an RF signal received at the end 38 of the inductor IB with a voltage polarity (i.e., either a positive voltage polarity or a negative voltage polarity) results in a filtered RF signal being transmitted out the end 32 of the inductor IA with the same voltage polarity. This is indicated in FIG. 12 by the dot convention where a dot is placed at the end 32 of the inductor IA and a dot is placed at the end 38 of the inductor IB. Accordingly, in this embodiment, the inductors IA, IB shown in FIG. 12 have a (fixed) negative magnetic coupling coefficient. Accordingly, in this embodiment, the cross-coupling capacitive structure CC(PA1) is connected between the end 32 and the end 38, the cross-coupling capacitive structure CC(PA2) is connected between the end 34 and the end 36, the cross-coupling capacitive structure CC(NA1) is connected between the end 32 and the end 36, and the cross-coupling capacitive structure CC(NA2) is connected between the end 34 and the end 38.

FIG. 13 illustrates still another arrangement of the tunable RF filter path 28. The arrangement of the tunable RF filter path 28 shown in FIG. 13 includes the resonator RA and the resonator RB. The tunable RF filter path 28 shown in FIG. 13 includes an embodiment of the resonator RA and an embodiment of the resonator RB. However, in this arrangement shown in FIG. 13, the tunable RF filter path 28 shown in FIG. 13 includes a cross-coupling capacitive structure CC(PH1), a cross-coupling capacitive structure CC(NH1), a cross-coupling capacitive structure CC(PH2), and a cross-coupling capacitive structure CC(NH2). The cross-coupling capacitive structure CC(PH1) and the cross-coupling capacitive structure CC(NH1) are arranged to form a first capacitive voltage divider. The first capacitive voltage divider is electrically connected to the resonator RA. More specifically, the cross-coupling capacitive structure CC(PH1) is electrically connected between the end 32 of the inductor IA and a common connection node H1. The cross-coupling capacitive structure CC(NH1) is electrically connected between the end 34 of the inductor IA and the common connection node H1. Additionally, the cross-coupling capacitive structure CC(PH2) and the cross-coupling capacitive structure CC(NH2) are arranged to form a second capacitive voltage divider. The second capacitive voltage divider is electrically connected to the resonator RB. More specifically, the cross-coupling capacitive structure CC(PH2) is electrically connected between the end 36 of the inductor IB and a common connection node H2. The cross-coupling capacitive structure CC(NH2) is electrically connected between the end 38 of the inductor IB and the common connection node H2. As shown in FIG. 13, a cross-coupling capacitive structure CC(H12) is electrically connected between the common connection node H1 and the common connection node H2. Thus, in an alternative embodiment, there is a short between the common connection node H1 and the common connection node H2. The common connection nodes H1, H2 may be grounded. Alternatively, a high impedance to ground may be provided at the common connection nodes H1, H2.

The arrangement of the cross-coupling capacitive structure CC(PH1), the cross-coupling capacitive structure CC(NH1), the cross-coupling capacitive structure CC(PH2), and the cross-coupling capacitive structure CC(NH2) shown in FIG. 13 is an H-bridge structure. The cross-coupling capacitive structure CC(H12) connected between the common connection node H1 and the common connection node H2 may be a variable cross-coupling capacitive structure configured to vary a first variable intermediate electric coupling coefficient provided between the common connection node H1 and the common connection node H2.

With regard to the first capacitive voltage divider specifically shown in FIG. 13, the cross-coupling capacitive structure CC(PH1) is a variable cross-coupling capacitive structure configured to vary a first variable positive electric coupling coefficient provided between the resonator RA and the common connection node H1. The cross-coupling capacitive structure CC(NH1) is a variable cross-coupling capacitive structure configured to vary a first variable negative electric coupling coefficient provided between the resonator RA and the common connection node H1. Thus, a mutual electric coupling coefficient of the resonator RA is approximately equal to the first variable positive electric coupling coefficient and the first variable negative electric coupling coefficient.

With regard to the second capacitive voltage divider, the cross-coupling capacitive structure CC(PH2) is a variable cross-coupling capacitive structure configured to vary a second variable positive electric coupling coefficient provided between the resonator RB and the common connection node H2. The cross-coupling capacitive structure CC(NH2) is a variable cross-coupling capacitive structure configured to vary a second variable negative electric coupling coefficient provided between the resonator RB and the common connection node H2. Thus, a mutual electric coupling coefficient of the resonator RB is approximately equal to the second variable positive electric coupling coefficient and the second variable negative electric coupling coefficient. The tunable RF filter path 28 shown in FIG. 13 thus has a total mutual coupling coefficient between the resonator RA and the resonator RB equal to the sum total of the mutual magnetic coupling coefficient between the inductor IA and the inductor IB, the mutual electric coupling coefficient of the resonator RA, the mutual electric coupling coefficient of the resonator RB, and the first variable intermediate electric coupling coefficient provided between the common connection node H1 and the common connection node H2. In alternative embodiments, cross-coupling capacitive structures with fixed capacitances are provided.

In one embodiment, the cross-coupling capacitive structure CC(PH1), the cross-coupling capacitive structure CC(NH1), the cross-coupling capacitive structure CC(PH2), and the cross-coupling capacitive structure CC(NH2) may each be provided as a varactor. However, the cross-coupling capacitive structure CC(PH1), the cross-coupling capacitive structure CC(NH1), the cross-coupling capacitive structure CC(PH2), and the cross-coupling capacitive structure CC(NH2) may each be provided as a programmable array of capacitors in order to reduce insertion losses and improve linearity. The cross-coupling capacitive structure CC(PH1), the cross-coupling capacitive structure CC(NH1), the cross-coupling capacitive structure CC(PH2), the cross-coupling capacitive structure CC(NH2) and the cross-coupling capacitive structure CC(H12) can also be any combination of suitable variable cross-coupling capacitive structures, such as combinations of varactors and programmable arrays of capacitors.

Since the resonator RA and the resonator RB are weakly coupled, the resonator RB is operably associated with the resonator RA such that an energy transfer factor between the resonator RA and the resonator RB is less than 10%. While the positive mutual magnetic coupling factor between the inductor IA and the inductor IB is fixed and has a magnitude less than or equal to approximately 0.3, a total mutual coupling factor is determined not only by the mutual magnetic coupling factor but also by a mutual electric coupling factor. The mutual electric coupling factor is provided by the mutual electric coupling between the resonators RA, RB. In this case, the mutual electric coupling factor between the resonators RA, RB can be varied, and the total mutual coupling factor can be varied as well. Note that in this embodiment the resonator RA further includes a fixed capacitive structure CFA, (which is a capacitor) connected between the end 32 and the end 34 of the inductor IA while the resonator RB further includes a fixed capacitive structure CFB connected between the end 36 and the end 34 of the inductor IB.

FIG. 14 illustrates still another arrangement of the resonators RA, RB. The arrangement of the resonators RA, RB shown in FIG. 14 is the similar to the arrangement of the resonators RA, RB shown in FIG. 8. However, in this embodiment, the resonator RA includes a plurality of switchable inductive elements SIA, and the resonator RB includes a plurality of switchable inductive elements SIB. Each of the plurality of switchable inductive elements SIA is configured to be switched so as to be strongly coupled to the inductor IA and adjust an inductance of the resonator RA. More specifically, the control circuit 14 (shown in FIG. 1) is configured to selectively switch any combination of the switchable conductive elements SIA and thereby vary the inductance presented by the resonator RA. This allows for a resonant frequency of the resonator RA to be adjusted by setting the inductance. This further allows for the mutual magnetic coupling between the resonator RA and the resonator RB to be adjusted.

Additionally, each of the plurality of switchable inductive elements SIB is configured to be switched so as to be strongly coupled to the inductor IB and adjust an inductance of the resonator RB. More specifically, the control circuit 14 (shown in FIG. 1) is configured to selectively switch any combination of the switchable conductive elements SIB and thereby vary the inductance presented by the resonator RB. This allows for a resonant frequency of the resonator RB to be adjusted by setting the inductance. This allows for the mutual magnetic coupling between the inductor IA and the inductor IB to be varied. The resonators RA, RB also included the fixed capacitive structures, CFA, CFB, respectively.

Those skilled in the art will recognize improvements and modifications to the preferred embodiments of the present disclosure. All such improvements and modifications are considered within the scope of the concepts disclosed herein and the claims that follow.

What is claimed is:

1. Radio frequency (RF) front-end circuitry, comprising:
an RF filter structure comprising:
a first terminal, a second terminal, and a third terminal;
a plurality of resonators;
a first tunable RF filter path defined by a first set of the plurality of resonators such that the first tunable RF filter path has a first amplitude and a first phase and the first tunable RF filter path is connected between the first terminal and the second terminal;
a second tunable RF filter path defined by a second set of the plurality of resonators such that the second tunable RF filter path has a second amplitude and a second phase and the second tunable RF filter path is connected between the first terminal and the third terminal, wherein the first set of the plurality of resonators and the second set of the plurality of resonators both include a first resonator of the plurality of resonators, wherein the first resonator is coupled to the first terminal, the first resonator being coupled in the first tunable RF filter path and the second tunable RF filter path so as to operate as a splitter between the first tunable RF filter path and the second tunable RF filter path; and
control circuitry configured to set a first amplitude difference between the first amplitude and the second amplitude to approximately a first target amplitude difference and set a phase difference between the first phase and the second phase to approximately a first target phase difference.

2. Radio frequency (RF) front-end circuitry, comprising:
an RF filter structure comprising:
a plurality of resonators;
a first tunable RF filter path defined by a first set of the plurality of resonators such that the first tunable RF filter path has a first amplitude and a first phase;
a second tunable RF filter path defined by a second set of the plurality of resonators such that the second tunable RF filter path has a second amplitude and a second phase;
a third tunable RF filter path defined by a third set of the plurality of resonators such that the third tunable RF filter path has a third amplitude and a third phase; and
control circuitry configured to set a first amplitude difference between the first amplitude and the second amplitude to approximately a first target amplitude difference and set a first phase difference between the first phase and the second phase to approximately a first target phase difference.

3. The RF front-end circuitry of claim 2 wherein the control circuitry is configured to set a second amplitude difference between the first amplitude and the third amplitude to approximately a second target amplitude difference and set a second phase difference between the first phase and the third phase to approximately a second target phase difference.

4. The RF front-end circuitry of claim 3 wherein the control circuitry is configured to set a third amplitude difference between the second amplitude and the third amplitude to approximately a third target amplitude difference and set a third phase difference between the second phase and the third phase to approximately a third target phase difference.

5. Radio frequency (RF) front-end circuitry, comprising:
an RF filter structure comprising:
a plurality of resonators;
a first tunable RF filter path defined by a first set of the plurality of resonators such that the first tunable RF filter path has a first amplitude and a first phase, wherein a first subset of the first tunable RF filter path comprises a first pair of the first set of the plurality of resonators within a first segment of the first tunable RF filter path and a second subset of the first tunable RF filter path comprises a second pair of the first set of the plurality of resonators within a second segment of the first tunable RF filter path;

a second RF tunable filter path defined by a second set of the plurality of resonators such that the second tunable RF filter path has a second amplitude and a second phase;

a first cross-coupling capacitive structure electrically connected between the first pair of the first set of the plurality of resonators within the first segment of the first tunable RF filter path such that the first cross-coupling capacitive structure provides a first variable electric coupling coefficient between the first pair of the first set of the plurality of resonators; and a second cross-coupling capacitive structure electrically connected between the second pair of the first set of the plurality of resonators within the second segment of the first tunable RF filter path such that the second cross-coupling capacitive structure provides a second variable electric coupling coefficient between the second pair of the first set of the plurality of resonators; and control circuitry configured to set a first amplitude difference between the first amplitude and the second amplitude to approximately a first target amplitude difference and set a first phase difference between the first phase and the second phase to approximately a first target phase difference.

6. The RF front-end circuitry of claim 5 wherein the control circuitry is operably associated with the first cross-coupling capacitive structure so as to be operable to vary the first variable electric coupling coefficient and is operably associated with the second cross-coupling capacitive structure so as to be operable to vary the second variable electric coupling coefficient, wherein the control circuitry is configured to:

provide an amplitude adjustment to the first subset of the first set of the plurality of resonators within the first segment of the first tunable RF filter path by being configured to adjust the first variable electric coupling coefficient; and provide a phase adjustment to the second subset of the first set of the plurality of resonators within the second segment of the first tunable RF filter path by being configured to adjust the second variable electric coupling coefficient.

7. Radio frequency (RF) front-end circuitry, comprising: an RF filter structure comprising:
a plurality of resonators;
a first tunable RF filter path defined by a first set of the plurality of resonators such that the first tunable RF filter path has a first amplitude and a first phase, wherein at least a first pair of the first set of the plurality of resonators are weakly coupled to one another;
a second tunable RF filter path defined by a second set of the plurality of resonators such that the second tunable RF filter path has a second amplitude and a second phase, wherein at least a second pair of the second set of the plurality of resonators are weakly coupled to one another, and the first set of the plurality of resonators and the second set of the plurality of resonators are not mutually exclusive; and control circuitry configured to set a first amplitude difference between the first amplitude and the second amplitude to approximately a first target amplitude difference and set a first phase difference between the first phase and the second phase to approximately a first target phase difference.

8. The RF front-end circuitry of claim 7 wherein the plurality of resonators includes a first resonator and a second resonator that are weakly coupled wherein:

the first resonator has a first inductor and a first plurality of switchable inductive elements, wherein each of the first plurality of switchable inductive elements is configured to be switched so as to be strongly coupled to the first inductor and adjust a first inductance of the first resonator;

the second resonator having a second inductor and a second plurality of switchable inductive elements, wherein each of the second plurality of switchable inductive elements is configured to be switched so as to be strongly coupled to the second inductor and adjust a second inductance of the second resonator.

9. The RF front-end circuitry of claim 7 wherein the control circuitry is configured to set the first amplitude difference of the first amplitude and the second amplitude by being configured to:

hold the first amplitude so that the first amplitude provides an amplitude reference;

adjust the second amplitude of the second tunable RF filter path such that the first amplitude difference between the first amplitude and the second amplitude is set to approximately the first target amplitude difference.

10. The RF front-end circuitry of claim 7 wherein the control circuitry is configured to set the first phase difference of the first phase and the second phase by being configured to:

hold the first phase so that the first phase provides a phase reference;

adjust the second phase of the second tunable RF filter path such that the first phase difference between the first phase and the second phase is set to approximately the first target phase difference.

11. The RF front-end circuitry of claim 7 wherein the control circuitry is configured to:

set the first amplitude of the first tunable RF filter path by being configured to provide an amplitude adjustment to a first subset of the first set of the plurality of resonators within a first segment of the first tunable RF filter path;

set the first phase of the first tunable RF filter path by being configured to provide a phase adjustment to a second subset of the first set of the plurality of resonators within a second segment of the first tunable RF filter path.

12. The RF front-end circuitry of claim 11 wherein the control circuitry is configured to:

set the second amplitude of the second tunable RF filter path by being configured to provide a second amplitude adjustment to a third subset of the second set of the plurality of resonators provided within a third segment of the second tunable RF filter path;

set the second phase of the second tunable RF filter path by being configured to provide a second phase adjustment to a fourth subset of the second set of the plurality of resonators provided within a fourth segment of the second tunable RF filter path.

13. The RF front-end circuitry of claim 11 wherein the first subset of the plurality of resonators within the first segment includes a first resonator of the plurality of resonators configured to isolate the first segment from the second segment.

14. The RF front-end circuitry of claim 13 wherein the second subset of the plurality of resonators within the second segment includes a second resonator of the plurality of resonators configured to isolate the second segment from the first segment.

15. The RF front-end circuitry of claim 11 wherein the first set of the plurality of resonators further comprises a first resonator of the plurality of resonators connected between the first segment and the second segment, wherein the first resonator is configured to provide isolation between the first segment and the second segment.

16. The RF front-end circuitry of claim 11 wherein the RF filter structure further comprises an amplifier connected in the first tunable RF filter path between the first segment and the second segment.

17. The RF front-end circuitry of claim 7 wherein the plurality of resonators include a first resonator and a second resonator that are weakly coupled and the RF filter structure further comprises a first cross-coupling capacitive structure, a second cross-coupling capacitive structure, a third cross-coupling capacitive structure and a fourth cross-coupling capacitive structure, wherein:
  the first cross-coupling capacitive structure and the second cross-coupling capacitive structure are arranged to form a first capacitive voltage divider;
  the third cross-coupling capacitive structure and the fourth cross-coupling capacitive structure are arranged so as to form a second capacitive voltage divider;
  the first capacitive voltage divider is electrically connected to the first resonator; and
  the second capacitive voltage divider is electrically connected to the second resonator.

18. The RF front-end circuitry of claim 17 wherein the RF filter structure further comprises a fifth cross-coupling capacitive structure connected between the first capacitive voltage divider and the second capacitive voltage divider.

19. The RF front-end circuitry of claim 7 wherein the RF filter structure further comprises a first cross-coupling capacitive structure and a second cross-coupling capacitive structure, wherein:
  the first cross-coupling capacitive structure is connected within the first tunable RF filter path between the first pair of the first set of the plurality of resonators such that the first cross-coupling capacitive structure provides a first variable electric coupling coefficient between the first pair of the first set of the plurality of resonators;
  the second cross-coupling capacitive structure is connected between one of the first pair of the first set of the plurality of resonators of the first tunable RF filter path and one of the second set of the plurality of resonators within the second tunable RF filter path such that the second cross-coupling capacitive structure provides a second variable electric coupling coefficient between the one of the first pair of the first set of the plurality of resonators and the one of the second set of the plurality of resonators within the second tunable RF filter path.

20. The RF front-end circuitry of claim 19 wherein the control circuitry is configured to:
  set the first amplitude of the first tunable RF filter path by being configured to adjust the first variable electric coupling coefficient;
  set the first phase of the first tunable RF filter path by being configured to adjust the second variable electric coupling coefficient.

21. The RF front-end circuitry of claim 19 wherein the RF filter structure further comprises a third cross-coupling capacitive structure and a fourth cross-coupling capacitive structure, wherein:
  the third cross-coupling capacitive structure is connected within the second tunable RF filter path between the second pair of the second set of the plurality of resonators of the second tunable RF filter path such that the third cross-coupling capacitive structure provides a third variable electric coupling coefficient between the second pair of the second set of the plurality of resonators, wherein the second pair of the second set of the plurality of resonators include the one of the second set of the plurality of resonators within the second tunable RF filter path;
  the fourth cross-coupling capacitive structure is connected between an other of the second pair of the second set of the plurality of resonators of the second tunable RF filter path and an other of the first pair of the first set of the plurality of resonators within the first tunable RF filter path such that the fourth cross-coupling capacitive structure provides a fourth variable electric coupling coefficient between the other of the first pair of the first set of the plurality of resonators and the other of the second set of the plurality of resonators within the second tunable RF filter path; and
  the control circuitry is configured to:
    set the first amplitude of the first tunable RF filter path by being configured to adjust the first variable electric coupling coefficient;
    set the first phase of the first tunable RF filter path by being configured to adjust the second variable electric coupling coefficient;
    set the second amplitude of the second tunable RF filter path by being configured to adjust the third variable electric coupling coefficient; and
    set the second phase of the second tunable RF filter path by being configured to adjust the fourth variable electric coupling coefficient.

22. The RF front-end circuitry of claim 7 wherein the RF filter structure further comprises a first terminal, a second terminal, a third terminal, and a fourth terminal wherein:
  the first tunable RF filter path is connected between the first terminal and the second terminal;
  the second tunable RF filter path is connected between the first terminal and the fourth terminal.

23. The RF front-end circuitry of claim 7 wherein the RF filter structure further comprises a first cross-coupling capacitive structure, a second cross-coupling capacitive structure, a first terminal, a second terminal, and a third terminal wherein:
  the first cross-coupling capacitive structure is connected within the first tunable RF filter path between the first pair of the first set of the plurality of resonators such that the first cross-coupling capacitive structure provides a first variable electric coupling coefficient between the first pair of the first set of the plurality of resonators;
  the second cross-coupling capacitive structure is connected between one of the first pair of the first set of the plurality of resonators of the first tunable RF filter path and one of the second set of the plurality of resonators within the second tunable RF filter path such that the second cross-coupling capacitive structure provides a second variable electric coupling coefficient between the one of the first pair of the first set of the plurality of resonators and the one of the second set of the plurality of resonators within the second tunable RF filter path;
  the first tunable RF filter path is connected between the first terminal and the second terminal;

the second tunable RF filter path is connected between the first terminal and the third terminal;

the first set of the plurality of resonators and the second set of the plurality of resonators both include a first resonator of the plurality of resonators, wherein the first resonator is coupled to the first terminal, the first resonator being coupled in the first tunable RF filter path and the second tunable RF filter path so as to operate as a splitter between the first tunable RF filter path and the second tunable RF filter path;

the control circuitry is configured to:
set the first amplitude of the first tunable RF filter path by being configured to adjust the first variable electric coupling coefficient;
set the first phase of the first tunable RF filter path by being configured to adjust the second variable electric coupling coefficient.

24. The RF front-end circuitry of claim 7 wherein the RF filter structure further comprises a first amplifier connected in the first tunable RF filter path and a second amplifier connected within the second tunable RF filter path.

25. The RF front-end circuitry of claim 7 wherein the plurality of resonators include a first resonator and a second resonator that are weakly coupled, the first resonator having a first inductor and the second resonator having a second inductor, wherein the first inductor and the second inductor are magnetically coupled to provide a positive magnetic coupling coefficient between the first resonator and the second resonator.

26. The RF front-end circuitry of claim 7 wherein the plurality of resonators include a first resonator and a second resonator that are weakly coupled, the first resonator having a first inductor and the second resonator having a second inductor, wherein the first inductor and the second inductor are magnetically coupled to provide a negative magnetic coupling coefficient between the first resonator and the second resonator.

27. The RF front-end circuitry of claim 7 wherein the plurality of resonators include a first resonator and a second resonator that are weakly coupled, the first resonator having a first inductor and the second resonator having a second inductor, wherein the first inductor and the second inductor are not magnetically coupled to one another.

* * * * *

UNITED STATES PATENT AND TRADEMARK OFFICE
CERTIFICATE OF CORRECTION

PATENT NO. : 9,859,863 B2
APPLICATION NO. : 14/554975
DATED : January 2, 2018
INVENTOR(S) : George Maxim, Dirk Robert Walter Leipold and Baker Scott Page 1 of 1

It is certified that error appears in the above-identified patent and that said Letters Patent is hereby corrected as shown below:

On the Title Page

On page 4, in the second column, third and fourth lines, replace:
"application No. 61/909,028, filed on Nov. 26, 2013, provisional application No. 61/949,581, filed on Mar."
With:
--application No. 61/909,028, filed on Nov. 26, 2013, provisional application No. 61/938,884, filed on Feb. 12, 2014, provisional application No. 61/949,581, filed on Mar.--.

Signed and Sealed this
Nineteenth Day of June, 2018

Andrei Iancu
*Director of the United States Patent and Trademark Office*